(12) United States Patent
Knierim et al.

(10) Patent No.: US 10,899,575 B2
(45) Date of Patent: Jan. 26, 2021

(54) LINEAR MEDIA HANDLING SYSTEM AND DEVICES PRODUCED USING THE SAME

(71) Applicants: Glenn Auld Knierim, Littleton, CO (US); Mark Spieker, Littleton, CO (US)

(72) Inventors: Glenn Auld Knierim, Littleton, CO (US); Mark Spieker, Littleton, CO (US)

(73) Assignee: INFINITY PHYSICS, LLC, Littleton, CO (US)

( * ) Notice: Subject to any disclaimer, the term of this patent is extended or adjusted under 35 U.S.C. 154(b) by 385 days.

(21) Appl. No.: 15/927,877

(22) Filed: Mar. 21, 2018

(65) Prior Publication Data

US 2018/0251333 A1 Sep. 6, 2018

Related U.S. Application Data

(63) Continuation-in-part of application No. PCT/US2016/053174, filed on Sep. 22, 2016.
(Continued)

(51) Int. Cl.
*B65H 59/38* (2006.01)
*B65H 59/40* (2006.01)
(Continued)

(52) U.S. Cl.
CPC ........... *B65H 59/385* (2013.01); *B65H 54/22* (2013.01); *B65H 59/387* (2013.01); *B65H 59/40* (2013.01);
(Continued)

(58) Field of Classification Search
CPC .. B65H 2701/36; B65H 54/22; B65H 59/385; B65H 59/387; B65H 59/40;
(Continued)

(56) References Cited

U.S. PATENT DOCUMENTS 2,671,495 A * 3/1954 Robert ................... B29D 30/30
156/361
3,381,459 A * 5/1968 Vawter ............... H01B 13/0816
242/441.4
(Continued)

FOREIGN PATENT DOCUMENTS

| CN | 103531303 | 1/2014 |
| EP | 0519629 | 12/1992 |

(Continued)

OTHER PUBLICATIONS

International Search Report and Written Opinion for PCT/US2016/053174.
(Continued)

*Primary Examiner* — Emmanuel M Marcelo
(74) *Attorney, Agent, or Firm* — FisherBroyles LLP; Craig W. Mueller

(57) ABSTRACT

An improved system for handling delicate linear media and in particular to a method and apparatus for winding delicate linear media such as superconducting wire or tape or optical fibers onto a spool. A combination of direct closed loop control and media routing design facilitates the handling of the delicate media without causing damage. The axial tension in the linear media may be closely controlled during winding by means of feedback control loop using tension measurements to control the rotation speeds of the wind-from and wind-to spools. Further, during winding, the delicate linear media is only exposed to large radius bends with no reverse bending. Finally, output devices and features, commercial or otherwise, made possible by delicate linear media handling are revealed. This includes advanced SC devices and features.

26 Claims, 28 Drawing Sheets

Related U.S. Application Data

(60) Provisional application No. 62/221,910, filed on Sep. 22, 2015, provisional application No. 62/242,393, filed on Oct. 16, 2015, provisional application No. 62/243,966, filed on Oct. 20, 2015.

(51) Int. Cl.
  *H01F 41/04*  (2006.01)
  *D07B 7/14*  (2006.01)
  *D07B 7/02*  (2006.01)
  *H01B 13/02*  (2006.01)
  *B65H 54/22*  (2006.01)
  *G01R 33/38*  (2006.01)
  *G01R 33/3815*  (2006.01)

(52) U.S. Cl.
  CPC .............. *D07B 7/02* (2013.01); *D07B 7/14* (2013.01); *G01R 33/3802* (2013.01); *G01R 33/3815* (2013.01); *H01B 13/0278* (2013.01); *H01F 41/048* (2013.01); *B65H 2701/36* (2013.01); *D07B 2205/40* (2013.01); *D07B 2207/4095* (2013.01); *D07B 2301/15* (2013.01); *D07B 2301/258* (2013.01); *D07B 2301/3583* (2013.01); *D07B 2301/4066* (2013.01); *D07B 2301/5559* (2013.01); *D07B 2301/5581* (2013.01); *D07B 2301/5586* (2013.01); *D07B 2501/406* (2013.01)

(58) Field of Classification Search
  CPC ...... D07B 2207/4095; D07B 2301/258; D07B 2301/3583; D07B 2301/4066; G01R 33/3815; H01B 13/0278; H01F 41/048
  See application file for complete search history.

(56) References Cited

U.S. PATENT DOCUMENTS

| | | | |
|---|---|---|---|
| 3,507,137 A * | 4/1970 | Robinson | H01F 41/063 72/148 |
| 3,701,491 A | 10/1972 | Brown | |
| 3,833,184 A | 9/1974 | Hara | |
| 4,022,391 A | 5/1977 | Stein | |
| 4,347,993 A | 9/1982 | Leonard | |
| 4,407,062 A | 10/1983 | Sutcliffe | |
| 4,434,945 A * | 3/1984 | Hamane | B65H 54/2896 140/92.1 |
| 4,459,742 A * | 7/1984 | Banner | H02K 15/09 242/433.3 |
| 4,463,547 A | 8/1984 | Young | |
| 4,484,586 A * | 11/1984 | McMickle | A61L 29/085 607/122 |
| 4,546,656 A | 10/1985 | Grundy | |
| 4,548,085 A | 10/1985 | Grundy | |
| 4,665,952 A | 5/1987 | Macemon | |
| 4,671,465 A * | 6/1987 | Lemley | H02K 15/09 242/433.1 |
| 4,683,919 A | 8/1987 | Macemon | |
| 4,699,184 A * | 10/1987 | Macemon | H01F 41/08 140/92.2 |
| 4,750,960 A | 6/1988 | Bubeck | |
| 4,765,552 A | 8/1988 | Sugioka | |
| 4,771,961 A | 9/1988 | Sugioka | |
| 4,773,607 A | 9/1988 | Missout | |
| 4,928,894 A | 5/1990 | Ohno | |
| 5,145,052 A | 9/1992 | Santandrea | |
| 5,315,189 A | 5/1994 | Neff | |
| 5,421,534 A * | 6/1995 | Arnold | B65H 59/16 226/42 |
| 5,505,398 A | 4/1996 | Emmerich | |
| 5,551,144 A | 9/1996 | Mantone | |
| 5,623,189 A | 4/1997 | Hemmer | |
| 5,681,006 A | 10/1997 | Herd | |
| 6,387,852 B1 | 5/2002 | Celik | |
| 6,395,080 B1 * | 5/2002 | Cass | C04B 35/62227 106/166.01 |
| 6,510,604 B1 | 1/2003 | Pourrahimi | |
| 6,595,454 B2 | 7/2003 | Roba | |
| 6,603,379 B1 | 8/2003 | Manlief | |
| 6,820,833 B1 | 11/2004 | Carlsson | |
| 6,991,144 B2 | 1/2006 | Franz | |
| 8,936,209 B1 * | 1/2015 | Knierim | B65H 59/385 242/412.1 |
| 9,624,068 B1 | 4/2017 | Knierim | |
| 2002/0172891 A1 * | 11/2002 | Mori | B41C 1/1008 430/302 |
| 2002/0183208 A1 | 12/2002 | Pereira | |
| 2003/0115836 A1 * | 6/2003 | Suzuki | G03B 17/26 53/435 |
| 2004/0094656 A1 | 5/2004 | Perry | |
| 2004/0193303 A1 | 9/2004 | Fore, Sr. | |
| 2004/0206849 A1 | 10/2004 | Harrington | |
| 2004/0211851 A1 * | 10/2004 | Barton | B65H 55/04 242/171 |
| 2004/0245365 A1 | 12/2004 | Ramesh | |
| 2005/0227873 A1 | 10/2005 | Leghissa | |
| 2006/0266794 A1 * | 11/2006 | Melfi | B23K 35/0272 228/56.3 |
| 2009/0140451 A1 * | 6/2009 | Wampler | B29C 70/545 264/173.1 |
| 2009/0183486 A1 * | 7/2009 | Beck | H01B 13/0278 57/66 |
| 2010/0319802 A1 | 12/2010 | Hattori | |

FOREIGN PATENT DOCUMENTS

| | | |
|---|---|---|
| GB | 2043715 A | 10/1980 |
| JP | H065416 A | 1/1994 |
| WO | WO2015123415 | 8/2015 |

OTHER PUBLICATIONS

Extended European Search Report dated Apr. 26, 2019 associated with corresponding EP16849625.5. 13 pages.

* cited by examiner

LINEAR MEDIA HANDLING SYSTEM AND DEVICES PRODUCED USING THE SAME

This application is a continuation-in-part of PCT/US2016/053174, filed Sep. 22, 2016, and published as WO2017/053611 on Mar. 30, 2017, the entire disclosure of which is incorporated by reference herein.

PCT/US2016/053174 claims the benefit of U.S. Provisional Patent Application Ser. No. 62/221,910, filed Sep. 22, 2015, entitled "Linear Media Handling System," the entire disclosure of which is incorporated by reference herein.

PCT/US2016/053174 also claims the benefit of U.S. Provisional Patent Application Ser. No. 62/242,393, filed Oct. 16, 2015, entitled "Linear Media Handling System," the entire disclosure of which is incorporated by reference herein.

PCT/US2016/053174 also claims the benefit of U.S. Provisional Patent Application Ser. No. 62/243,966, filed Oct. 20, 2015, entitled "Compact Advanced Superconducting (SC) Devices," the entire disclosure of which is incorporated by reference herein.

This application is related to U.S. patent application Ser. No. 14/569,314, filed Dec. 12, 2014, now U.S. Pat. No. 9,624,068, issued Apr. 18, 2017, which is a continuation-in-part of U.S. patent application Ser. No. 13/269,549, filed Oct. 7, 2011, now U.S. Pat. No. 8,936,209, issued Jan. 20, 2015, which is a continuation-in-part of abandoned U.S. patent application Ser. No. 13/114,012, filed May 23, 2011, which claims the benefit of U.S. Provisional Patent Application Ser. No. 61/347,374, filed May 21, 2010, the entire disclosures of which are incorporated by reference herein.

FIELD OF THE INVENTION

Embodiments of the present invention are generally related to devices and apparatus that handle and manipulate delicate linear media, and in particular to an apparatus and method for winding linear media such as superconducting linear media. Other embodiments of the present invention are the results from the output of this apparatus, and in particular products and devices made from winding superconductors into magnets, cables, and cable magnets.

BACKGROUND OF THE INVENTION

Winding machines are used in various applications to wind linear media, such as conventional conductors such as copper, superconductor (SC), insulating material, and fiber optics in the form of wire, tape, and cable of multiple geometries onto items such as a spool or cable core to form items such as a coil or a linear core to form a cable. Conductive coils are formed by winding a single or multiple electrical conductor around a coil form such as a spool or a core. An example of a conductive coil can be found in an electric motor armature or field coil magnets, where the magnet includes an insulated resistive conductor (e.g., a copper wire surrounded by electrical insulation) wound around a core such as iron, air, a hybrid of both, or other materials. Conductive cables are formed by winding a single or multiple electrical conductors around an axis often accompanied by a physical core. Cable conductors can be wound in a spiral or helical pattern or interwoven in more complex geometries such as partial to full transposition or braiding offering desirable mechanical and electromagnetic properties. An example of a conductive cable can be found in overhead power and communications transmission lines that are typically comprised of many layers of interwoven conductors and insulation. Winding machines are also commonly used to wind coils of wire, coil, or other material onto large spools for storage or transport.

Full transposition commercial winding is required for long length alternating current (AC), pulsed power cables, and any transient magnet and cable magnet operation where reactance is an issue. Transposition is a technique of periodic swapping of conductor positions allowing, in the utility use, utility required operation via reduced magnetic crosstalk reactance and greater transmission efficiency. Full transposition of an SC allows AC and transient operation due to no resistance and negligible reactance due to an even current distribution amongst transposed winds, often terminated together. This is compared to a conventional conductor or helical only SC cable, magnet, or cable magnet with higher inductance for the outer turns. Full transposition for a wound strand means precise position of the conductors which leads to no inductive mismatch or net self-field flux enclosed between the strands and hence low residual magnetization producing transient, such as AC, losses or power choke. Full transposition for a subcable or cable goes further to also provide homogenous current distribution across a subcable or cable. Recent Roebel HTS cable tests promise AC operation but the high Roebel manufacturing cost, a non-winding method, has always limited this technology to short lengths. Braiding adds an entirely new layer of complexity beyond full transposition, as described later. No such system exists today to wind any advanced SC in either full transposition or in particular braiding.

While prior art winding machines work reasonably well for most conventional metal wire, there are a number of delicate linear media types too fragile for prior art winding machines and techniques. Examples of such delicate media include advanced superconductors including medium and high temperature superconducting (HTS) wire and tape, very fine conventional wire, filamentary linear materials, fiber optic wire, thin strands of carbon based fiber, smart fabrics, and extremely dense fine fiber matrices. Superconductors such as reacted magnesium diboride ($MgB_2$) and Niobium-3 tin ($Nb_3Sn$) are very brittle and, thus, are difficult to wind without damaging the same. All forms of HTS for engineering use are both brittle ceramic tape comprising an extremely thin and wide cross section, which greatly increases the winding complexity and a primary reason all prior attempts at non-helical winds have failed. Most experts in the HTS field believe a non-helical winding is not possible for winding a magnet, cable, or cable magnet which is why all HTS prototypes built are manual only, no full automation, based attempts with a final product experiencing known unacceptable magnet reactance values for any final commercial product transient operation use. Transient embodiments of such use include long length power transmission cables, pulsed power transmission cables, and transient magnets and cable magnets of any type including pulsed power operation and even common motor and generator AC armature use. Advanced SCs are defined as the more modern and operationally capable low and medium temperature SCs (LTS & MTS) such as reacted $Nb_3Sn$ and $MgB_2$ as well as high temperature SCs (HTS) such as ReBCO, including YBCO, and BSCCO. Advanced SCs contrast to classical LTS that operate around liquid helium temperatures which restricts their widespread use.

A superconductor is a material that exhibits immeasurably low to 0 electrical resistance inside an operating range primarily dominated by required low temperatures. Superconducting linear media are used in a variety of applications, including the production of powerful electromagnets used in, nuclear magnetic resonance (NMR), magnetic resonance imaging (MRI) which is a type of NMR for human medical use, mass spectrometers, motors and generators, and beam steering magnets for particle accelerators. Superconducting magnetic coils, like most magnetic coils, are formed by wrapping a conducting material around a form defining the shape of the coil. When coil temperature is reduced below a predetermined threshold, the conductor will exist in a superconducting state, and the current-carrying performance of the conductor is greatly increased wherein large magnetic fields can be generated and power can be delivered with less to negligible loss and lower voltage requirements.

As alluded to above, it is very easy to damage advanced superconducting materials while attempting to wind them onto a coil spool or cable core. More specifically cables, wires, and tapes are bent during the winding process. The smaller the coil or cable form, the more the cable or wire or tape must be bent. When a superconductor or superconducting cable is bent, strain is induced on the superconducting filaments. Because many superconductors are brittle and very thin and wide in the case of HTS, bending can cause breakage. When superconductor wires and tapes are wound onto a spool by a prior art winding machine, for example, the stress on the superconducting filaments can be great enough to destroy the desired superconducting properties. These methods do not account for fragile media needs and hence exacerbate flaws in the wound material which create stress/strain points that lower operational values and lead to premature failure either immediately or often during in a worst case during peak operation. Resulting from experimentation and manufacturing practice, for a given superconductor or superconducting cable, there is a lower limit on the radius of curvature to which the superconductor or superconducting cable can be wound.

A "wind-then-react" method is often used to address the difficulties in handling certain particularly brittle, low and medium temperature superconducting cables/wires. This process begins by winding unreacted superconductor precursor around a form or spool. The spool is then processed with high temperatures in an oxidizing environment to convert the precursor material into the desired superconductor material already formed into the desired coil shape.

However, the "wind-then-react" approach has several disadvantages. For example, because the precursor material must be heated after the wire is coiled onto a magnet system, all of the components of the magnet system to which the coil is associated must be able to withstand the high temperatures needed to react and form the superconductor. Thus, the magnet system cannot include aluminum or its alloys as such materials melt at the temperatures used during superconductor formation. It is also difficult and expensive to apply insulation to a wound coil to prevent electrical current flow between the turns. Finally, the "wind-then-react" method also leads to storage difficulties and added expense because the superconducting linear media cannot be easily prepared and stored ahead of time, because it must be formed onto the spool or system in which it will be used. One particular problem area is seen in production of MRI and NMR machines. MRIs employ, just like large motors or generators or large accelerator magnets, coil of superconducting wire or tape several kilometers in length that weighs hundreds to thousands of pounds. The sheer size of the required coil presents a number of difficulties when using a "wind-then-react" method as the entire coil must be placed in an oven for processing.

In contrast, a "react-then-wind" production provides a number of advantages, including decreased manufacturing and storage costs, and allowing the magnet system to use a broader range of materials. But despite these known advantages, the difficulties in handling the more delicate reacted superconductor linear media without damage, especially for lower cost superconducting materials like $MgB_2Nb_3Sn$, has prevented the "react-then-wind" method from gaining widespread commercial acceptance.

A similar problem exists with HTS linear media. The design and control complexity associated with building a complete complex geometry, such as full transposition and braiding, winding of any sort machine that can safely handle the delicate media including rectangular geometry of HTS has proven too difficult for industry to date. Operational mechanical, thermal, and magnetic stress and associated fatigue affect the final design acceptance and final magnet, cable, and cable magnet operational considerations and therefore must be accounted for when physically producing a fragile magnet, cable, or cable magnet. Such factors contribute to any advanced SC mechanical winding decisions such as SC wire and tape force and position control of the SC and output winding product. Winding the difficult tape handling geometry of fragile yet thin rectangular cross section YBCO exposes the added difficulty of the geometric cases of tape placement including overlays, turning, puckering, kink angles, twist pitch and angle needs, stress across the neutral axis, tension to wind layup and compressive spring response, variable material and void control, controlled layer variance, high packing factor (pf), mechanically supporting HTS strands for operation, etc. required to build an acceptable HTS cable, magnet, and cable magnet. Achieving this required developing a new and advanced controllable system of constant tension control, no reverse bends, minimized lateral bends, and a twist angle larger than the plastic strain bend radius in three dimensions approaching the limit of the most careful manual operations. This type of winding machine allows a negligible stress of the wire and tape, of any produced width, in any dimension while also maintaining an automated process line level of reliability, throughput, and cost for developing a commercial industry standard robust product.

The problem with prior art winding systems is that the means of passive or active tension control needed during the winding process is too harsh for the most delicate linear media requirements. A number of prior art systems use a dancer pulley for tension control. However, the mechanical action of tension control using a dancer pulley under high acceleration or deceleration profiles places an unacceptable impulsive force on the linear media which often damages the media. Further, the methods used for tension measurement by some prior art systems are either inaccurate or too damaging to the media. Unfortunately, a prior art winding system (outside those of the Applicant) does not exist that is capable of successfully winding service level robust devices from extremely delicate, medium-temperature superconducting reacted $MgB_2$ and $Nb_3Sn$ wires and HTS. This problem is immediately conveyed to all wound output products. Manufacturing high temperature superconducting wires such as the ReBCO yttrium barium copper oxide (YBCO), bismuth strontium calcium copper oxide (BSCCO), or larger diameter fiber optical wire, without continual human intervention suffers from the same issues. Accordingly, long process times, poor quality control, and difficulties in meeting manufacturing repeatability standards are the norm. Often the media and hence final product is so damaged by the winding process it can no longer be used for its intended purpose, or it has an extremely short operational life due to media handling induced fatigue.

As the targeted result of winding methods discussed up to this point, commercialization of SC devices has been a desire across industries for many decades. Traditionally, LTS SC commercial applications have been limited to Nuclear Magnetic Resonance spectroscopy (NMR). Magnetic Resonance Imaging (MRI), and science experiments, such as fusion and high energy physics have been limited to laboratory versus field environments and are not rated for field operations. These products use LHe based LTS which is cryogenically impractical for long length utility cable and non-laboratory needs. All current and potential SC products desire to use HTS. After decades of promises of newer SCs replacing current HTS materials for potential applications, no viable replacement is foreseen. Discovered in the 1980's, current HTS is still the only non-laboratory commercial SC application solution. This requires creating HTS devices which operate at LN2 temperatures or higher or lower than LN2 temperatures for extreme use such as HTS magnets with higher than LTS capable magnetic fields. LN2 is a commercially appealing cryogen because N2 is abundant on Earth and for a cryogen, LN2 is relatively easy to make. LN2 is also very stable versus liquid hydrogen or mixed air, colder cryogen options. Unlike LHe, the common cryogen for every commercial SC application today, LN2 is inexpensive and can be remotely generated from the surrounding air using a briefcase-sized device. LN2 is also appealing to cryogenic systems design because it is a larger molecule than LHe making it easier to contain and transport with far less insulation because it has a much higher thermal capacity, and at 77 Kelvin LN2 is much warmer than the commonly used yet much harder to operate lower temperature cryogens and in particular LHe. LN2 advantages allows HTS based, compact devices from a cryogen perspective.

There are many good HTS demonstrator projects yet after decades none of these have moved beyond demonstration levels due to customer concerns with non-reliable output from traditional winding machine based advanced SC limitations and for power cables long length direct current (DC) limited. Existing fabrication methods do not produce engineering standard precise or repeatable R&D or commercially reliable or cost allowable SC magnets, cables, or cable magnets.

For power cables, legacy helical wound HTS such as Conductor on Round Cable (CORC) are promising SC cable technologies that scale to long lengths and very high currents through the addition of more ReBCO layers, but all current wound HTS fabrication methods use historic handcrafted winding to partial yet relatively rough automation methods which stress the HTS while only allowing partial transposition and an arbitrary twist pitch as the layer diameters increase. The complex cable and magnet configurations desired, especially tape full transposition and braiding winding, are not possible with legacy winding. Legacy helical winds are therefore limited to partial transposition which limits AC power transmission to well less than 10 km due to reactive requirements such as utility needs. This precludes them from use in all regular non-DC cable and cable magnet applications, specifically utility AC power delivery and pulsed power applications such as fusion and high energy physics. This has stopped all commercial use of existing SC cables beyond early demonstrators.

The SC power cable competitive landscape includes over a dozen past SC demonstrations, most less than 1 km, and not a single commercial sale. R&D includes Florida State CAPS, American Magnet Lab, and Advanced Conductor Technologies. Commercial companies with demonstrators include Nexans with a recent European installation, AMSC, and Sumitomo through SuperPower, but also general OEMs such as HtsTriax by Ultera as a subsidiary of Southwire, STI, New England Wire, Luvata, and Fujikura, Ltd. Projects include the US Department of Energy sponsored Nexans generation 1 SC, three-phase, 138 kV, 574 MVA power link 600 m cable in Long Island, N.Y. installed in 2008 as the world's first SC cable in a live grid operating at transmission voltage and more recently the 1 km long AmpaCity project connecting two transformer stations in the city of Essen, Germany which is the longest SC cable installation in the world. In 2014 AMSC and ComEd, Commonwealth Edison Company, embarked upon the US Department of Homeland Security funded Resilient Electric Grid system for the city of Chicago which will provide an urban environment SC transmission system to demonstrate how SCs can protect a grid during times of failure. Existing product technical limitations allow every SC cable OEM to be a potential user with the greater capability. A large benefit of these limited demonstrator projects is the apparent willingness of utilities to invest in SC cables and proof that all ancillary equipment, such as SC cable cryo cooling, works in the field for decades without issue.

For magnets, there are no SC propulsive motors or generators for aircraft operation known, a large intended market for the future of aviation—hybrid and all electric aircraft. General SC motor and generator machine demonstrators include power system developers focus on maximizing the current transmission whereas energy system based SC machine efforts focus on the primary benefit of SCs to increase the air gap magnetic flux density (B) thereby increasing the machine power density and specific power up to four times while substantially increasing efficiency and voltage over comparable wire wound or permanent magnet based conventional machines. A US Navy energy systems machine example is the Zumwalt class DDG-1000 next generation destroyer propulsion rated at 36.5 MW, 6.6 kV, and 120 rpm competition. Three companies built final full-scale machines where the primary difference was mass and volume across their three separate motor topologies. The winning propulsion power plant was the Converteam advanced induction motor. Compared to this, the DRS PM motor built and tested was ~80% of the induction machine's mass and volume whereas the AMSC built and tested SC motor was 47% volume and ~30% mass of the induction machine while providing a much higher efficiency. This technological leap allowed by SCs is revolutionary yet the AMSC team lost with SC application product technical reliability being a chief concern. An SC machine for aircraft would achieve an even greater machine reduction in size and can be direct drive, does not require a gearbox or a converter, compared to many conventional machine applications.

These common scenarios have positioned advanced SC cables, magnets, and cable magnets as a poor application choice which does not support commercialization and contributes to why only high cost advanced SC demonstrators or science experiments are developed with no industry accepted commercial applications. Realizing industry standards compared to the fragility of advanced SCs, our set of winding systems were created to safely complete HTS cables, magnets, and cable magnets to the point of protected epoxy for a magnet and cladding for a cable.

There is a long-felt need for an improved method and apparatus for handling delicate linear media and for winding such delicate, and for HTS also geometrically difficult, media into a cable or coil for use in SC devices and products, particularly for allowing first ever robust and reliable commercially viable advanced SC devices and products. These SC devices and products are then more efficient and hence more powerful and/or more compact than conventional electrical conductor devices and products. Resulting from significant improvements affecting the winding of SC described herein, SC devices previously unable or prohibitively costly to manufacture with reliability and robustness can now be contemplated.

SUMMARY OF THE INVENTION

It is an aspect of some embodiments of the invention to provide an improved method and apparatus for handling delicate linear media, such as reacted superconductor wire and HTS, and in particular for winding delicate media in a coil shape onto a former sometimes called a spool or bobbin. Other embodiments wind such delicate media in a cable shape onto a former that is sometimes called a cable core. Some embodiments of the present invention carefully control the axial and lateral forces applied to the media during the winding process, and eliminate all small radius bends, reverse bends, and lateral bends as the media is handled. A combination of direct closed loop control and media routing design facilitates the handling of the delicate media without causing damage. Axial tension applied to the linear media during the winding process may be closely controlled with a feedback control loop using tension measurements to control rotation speeds of each the wind-from, such as source spool, and wind-to, such as coil or cable former. Further, during winding, the delicate linear media is only exposed to large radius bends with no reverse bending. Thus, a Linear Media Handling System ("LMHS") is contemplated. When electrical conductors are used for input, LMHS generally refers to a family of apparatus configured to manufacture a magnet, a cable, or a magnet from a cable where the cable is built then wound into a magnet. The material comprising the magnet or cable could be superconducting ("SC") of any type from low to the more advanced and delicate medium and high temperature superconducting (HTS). The purpose of LMHS is to address using automation the complexity and expense of producing a robust and reliable commercially viable magnet, cable, and cable magnet. LMHS usefulness extends to other products winding other materials but is originally targeted in particular for low cost manufacturing with respect to competing options for producing applications using advanced superconductors. LMHS provides the cable, magnet, and cable magnet to final product designer a manual to algorithm automated strand tension, twist pitch, angle control, packing factor degree for each individual tape and/or wire for the entire stack, etc. for partial to full transposition to braiding of cables, magnets, and cable magnets. The output of LMHS produces a multitude of specialized products including Compact Advanced Superconducting Devices described herein as LMHS product embodiments.

No Reverse Bends Linear Media Routing Design

Some embodiments of the present invention use a routing design that follows strict design rules in transferring linear media from a storage/reacting, wind-from spool to the desired wind-to spool (or bobbin or former). It is highly desirable that the media routing path have no reverse bends whatsoever.

Bend Radius Control

As media is routed through the winding machine, it is also highly preferable that each bend, including wind-from and wind-to spools and any pulleys over which media passes should maintain a minimum bend radius. This minimum radius, which can also be expressed as a minimum radius of curvature, is determined by the nature of the media material being processed.

Dynamic Surfaces

To minimize media stress and strain through friction and rubbing (which not only increases axial tension on the media, but also tends to damage any wire insulation) all of the surfaces that are touched by the wire during the winding process will preferably provide a dynamic routing surface moving in the direction of the media motion (i.e., pulleys or wheels).

Direct Closed Loop Axial Control

According to some embodiments of the present invention, axial tension is measured and used as input data for the primary control loop affecting operation of the system. Preferably, closed loop control is used whereby the winding process is initiated by the operation of motors that turn either the wind-from spool or the wind-to spool (or both).

Direct Closed Loop Lateral Control

Lateral bending and stress should also be controlled in some embodiments of the present invention. Superconductor wire should unwind from the wind-from spool, pass around the tension sensor wheel (preferably wrapped around approximately 180 degrees circumferentially to ensure accurate measurement of the tension), and wind onto the wind-to spool while staying in substantially the same plane.

Media Orchestrating Routing Technology (MORT)

Another embodiment of the invention includes a versatile system for quick media alignment and movement called Media Orchestrating Routing Technology (MORT).

Degrees of Freedom (DoF) Controls

As used herein, the term DoF will be used to describe control of the routing elements and structures to adjust the orientation of the elements and structures to provide linear and/or rotational degrees of freedom to facilitate the handling of the delicate media without causing damage.

Angle On/Off Wind

Active control loops based on the axial tension value as one embodiment of being the global control master and a hierarchy of master/slave relationships provides the means of varying the pitch angle while accurately maintaining the desired performance value such as constant axial tension.

End of Layer Sense

A critical transition in windings occurs when the edge of a wind-to spool is encountered. In multilayer windings a change in direction must be negotiated at this transition.

Dropout Identification

High Temperature Superconducting ("HTS") Material often is flawed with "drop outs," i.e., lowered maximum operational points. It is another aspect of embodiments of the present invention to check each SC strand being handled or being formed into a cable or magnet for drop outs, then to incorporate a splice to remove the drop out before incorporating the SC strand into the cable or magnet.

Material Handling

It is yet another aspect of embodiments of the present invention to provide enhanced material handling capabilities. More specifically, current SC winding methods produce various levels stress/strain points that lead to material failure and lower critical SC values, which lowers operational performance. The stress/strain points will often survive winding and subsequent quality assurance processes but will lead to failure during the worst case scenario of highest system power or energy operation.

Proof of Performance

Some embodiments of the present invention provide proof of post winding performance integrity. More specifically, values such as tension and drop out occurrences are recorded throughout the entire length of each SC strand and therefore in the final cable and magnet.

Turn-by-Turn Tension Control

It is another aspect of some embodiments of the present invention to provide turn-by-turn tension control. For example, some LMHS allow the operator to set winding tension values for each layer and even each individual turn per layer in the wind.

Non-Contact Sensor

It is yet another aspect of the present invention to provide a non-contact sensor. For example, some LMHS embodiments employ a non-contact media position or wind pattern sensor system such as a vision or laser or a non-contact tension sense electromagnetic, resistance, or inductance measurement sensor.

Reverse Direction Wind

Winding operation onto a bobbin commonly involves a single bobbin rotation direction. It is another aspect of some embodiments of the present invention to provide an LMHS that performs a reverse direction wind onto a bobbin.

Splice Mitigation

LMHS of one embodiment provides the ability to lower the number of and, in some cases, remove splices required for any linear media such as SC wire or tape due to the large number of controllable degrees of freedom (DoF).

Cable Diagnostics

Final system cable diagnostics are useful such as faults, smart grid, and distributed grid diagnostics. In this case the cable, magnet, and/or cable magnet is designed to reflect electrical bounces to provide a location of splices and certainly of a sudden resistance fault and resistance spread.

Diagnostic Station

Embodiments provide a process for long & reliable advanced SC lengths for cables and magnets. As one of ordinary skill will appreciate, HTS have great potential, but they have problems that prohibit commercial viability. One way to increase HTS reliability, especially for ReBCO, is to identify drop outs and to improve associated splicing techniques so that long, complex, and reliable magnets and cables can be manufactured.

Tensioner and Guide

It is another aspect of some embodiments of the present invention to provide a compression tensioner and guide. More specifically, the LMHS may manual or automatically guide and hold tension for both wind-off and wind-on portions of the cable or magnet wind while allowing individual SC operations, such as SC critical value testing and splicing operations, to occur.

Automated Splicing

It is another aspect of some embodiments to provide automated splicing. The LMHS may be able to perform manual or automated splicing. Automated splicing of a single SC wire or tape strand for a repair section or for exchanging an emptied for a subsequent spool of SC wire or tape is important in creating required long HTS lengths with high operational values.

Automated Spool Exchange

In some embodiments for winding cables, LMHS can automatically swap out emptied raw SC spools and replace with new full spools without manual intervention.

Cryostat Cladding

The LMHS of one embodiment of the present invention provides an inline cryostat cladding station that facilitates the development of large commercial cable magnets and commercial power cables.

Magnet Station

One embodiment of the present invention provides an inline magnet and cable magnet station that facilitates the development of large commercial magnets and cable magnets via an inline magnet or cable magnet station. This magnet station improves capability, reliability, cost, and production rate of complex magnet and cable magnet configurations while incorporating partial to full transposition and braiding of modern SC magnets and cable magnets. Industry use includes high energy physic (HEP), fusion, NMR/MRI, and motor/generator magnets and cable magnets.

Dynamic Feed Winding

LMHS of some embodiments of the present invention provide dynamic feed winding. This aspect results from using strand tension measurement feedback to precisely control the feed rates of multiple strands to be wound as well as the feed rate of a dynamically fed subcomponent such as a cable core or magnet core.

Wind Form Filler

Another aspect of some embodiments of the present invention provides an LMHS that incorporates a wound former filler or bridge that prevents sharp bend points to occur in the wind-on material, particularly during flexure, operation, or other induced movement in a wound magnet, cable, cable magnet.

Managed Winding Gaps

Some embodiments of the present invention provide for specified and carefully managed creation of gaps among wound materials.

Advanced Control

The LMHS of one embodiment employs advanced control processes and techniques beyond what winding systems use to date.

Variable Media

Reviewers of this application and the applications described above will appreciate that in some respects the media type being wound or transferred is not relevant. More specifically, the wound media can be any type of delicate material (e.g., superconducting wire, tape, cable, etc.) wound or transferred from one location to another. Those of ordinary skill in the art will also recognize that the apparatus and methods described in these applications can be used to create cables, magnets, cable magnets, or any other device known in the art that incorporates wires or cables this linear media.

Transposition

Some LMHS contemplated herein provide for the transposition of the wound media being tapes and/or wires and/or cables. The wound media are set into a transposition configuration when placed onto a former or are transposed without placing onto a former.

Variable Twist Pitch and Angle

Another embodiment of LMHS provides means of an optional, specialized winding allowance that is accomplished by an additional active DoF providing a continuous or changing twist pitch and another DoF for a continuous or changing twist angle from the wind-from spool, across the sensor systems such as axial tension, and into the wind-to spool.

Subcables with Transposition

Another embodiment of LMHS incorporates transposition winding and produces subcables from input SC tapes. Multiple embodiments variations can accomplish these subcables such as the horizontal (SC spools in a flat plane) versus vertical (angled plane of SC spools in a sort of angled Ferris wheel) stack with respect to the former core for wind on. There are benefits of each where vertical SC spool stack allows a constant wind onto former pitch angle across the SCs with relatively simpler and automated control of the pitch angle and readily allows more SCs to form into a subcable.

Subcables. Transposition, and Twist Pitch

Current HTS cable fabrications methods do not allow a full transposition or a set twist pitch and angle since with each layer the diameter varies which leads to an arbitrary twist pitch and angle. Transient including AC losses due to not allowing full transpositions or even controlled variable twist pitch leads to unacceptable high power transient based losses due to the inductive mismatch and associated high losses. These transient current losses are unacceptable in many high power applications including fusion, electric power transmission lines, pulsed power, etc.

Spool Rotation Around Cable

In order to achieve complete routing location and DoF control of cable winding the spool systems must rotate relative to the dynamic former or cable core. Every embodiment shown in drawings here has a non-revolving cable core. This method of achieving the relative motion provides the advantage of not having to rotate the heavy spools of cable core at both end of the winding process. It also facilitates more complex processes such as winding cable magnets Braiding The LMHS of one embodiment is capable of braiding up to an estimated 12 HTS tapes and more wires per subcable. One of ordinary skill in the art will appreciate that full transposition is where each linear media evenly assumes to each position in the subcable away from the former but they are always in the same order. And braiding is a full transposition technique with the added complexity of swapping the order of the linear media as the linear media evenly assumes to each position in the subcable away from, or while being placed upon, the former.

Braiding adds an entirely new layer of complexity beyond full transposition. In the four HTS tape example the (1,2,3,4) winding sequence will not only alternate in order as in full transposition but also alternate pairs. In one embodiment, one or both pairs (1,2) & (3,4) alternate upon command. This addition is an order of magnitude more complex to accomplish in both mechanical design and process controls than full transposition yet builds upon the full transposition technology.

Rotary Lift Stage with Tensioner

In order to assist with tasks such as braiding and/or transposition a means of overlapping linear media of any sort such as a wire or tape. One embodiment is an active lift table incorporated at each SC spool location as a lift only embodiment or a lift performed with other actions embodiment as also described.

Automated Multiple Phased Winding

LMHS automatically creates single to multi-phase output when the phase groups remain separated.

Compact Advanced Superconducting Devices

Another aspect of embodiments of the present invention provides advanced, compact devices made of superconductors. The superconductors may be made or processed using the techniques described herein. Contemplated compact SC devices include but are not limited to: motor and generator machines, magnetic resonance imagining (MRI), nuclear magnetic resonance (NMR), surface NMR (SNMR), fault current limiters (FCL), and any device that includes or uses a high EM field and/or current partly to fully created by an advanced SC. Advanced SCs contain materials that allow superconducting operation at higher temperatures and are generally more to significantly more mechanically fragile. The disclosed devices can be used for motors and generators, medical, geosciences, renewable energy such as wind and hydro generators, hybrid or all electric vehicles, oil & gas, magnetic containment, high energy science and fusion including high B magnets such as the desired greater than 16 Tesla (T) magnets, power systems, aeronautical and aerospace such as space launch and propulsion to onboard exo-terrestrial device use, EM propulsion (magprop) and EM levitation (maglev), space EM shielding, ship systems, ground transportation, military, utility, agricultural, construction, mining, environmental, resource management, disaster relief, archeology, and any industry using an EM system. Although some of the following disclosure is focused on compact systems, those of skill in the art will appreciate SC devices of any size can be manufactured.

Compact SC Device

The compact advanced SC of one embodiment is a high output and/or resolution device that is compact in size and weight. Some compact SC devices may be personnel portable employing power, energy storage, controls, data acquisition (DAQ), operator interface, and cryogenic systems.

Component Based Superconducting Device

Another embodiment of the invention includes the SC magnet set and other elements being designed as swappable components or line replaceable units (LRUs).

Field Operable Superconducting Device

For HTS use a common embodiment is a fully contained system including the allowance of LN2 recuperation or replenishment for long term use in the field. Replenishing LN2 is readily possible versus other cryogen choices since LN2 is relatively very low cost or simple to remotely extract from air and transport with a compact unit.

The compact advanced SC device that is field operations rated is an advanced SC device, and/or system level beyond the SC device itself, robust unit far beyond any present art commercial classical SC application or any advanced SC application.

Superconducting Device Data Control

An embodiment of particular interest is data control for a field operable and/or component based SC device. In particular MRI and general NMR embodiments of any size benefit from retaining raw data and processing data.

Bore that Orients to Subject Position

One embodiment of the present invention SC device is compact enough in size and weight to allow orienting to a desired position such as a desired operating position.

NMR and MRI Field of View

In some NMR and MRI device embodiments of the present invention, due to the size of the HTS magnet tape compared to the magnet and the magnet proximity and size to the field of view (FoV), a more compact design allows the higher magnetic density required to achieve high resolutions, increased field uniformity, and increased temporal stability in a smaller volume.

High Penetration Depth Surface NMR & More Elements

Using aspects of the invention described herein, an embodiment SNMR will extend current limits for hydrogen and carbon detection.

Focused Magnetic Array

A set of conventional and/or SC electromagnetic (EM), SC TFM, and/or permanent magnets also with the possible inclusion of permeable material such as iron (Fe) material all arranged to focus the magnet field while limiting stray field effects.

Geometric and Operationally Tunable Coils

In an SNMR such as in FIG. 21 the most difficult technical needs involve achieving a highly controllable DC and RF B at each resolution gap down to the down to the penetration depth for the purposes of atomic tipping and then detecting the response echoes. In one embodiment the greater penetration depths a larger main coil is used for a uniform B and to compensate for loss of gradient field sensitivity the number of scans is increased proportional to depth. This SNMR magnetic field gradient depends upon three factors: 1) Tool design & configuration, 2) B gradients, and 3) Environmental conditions.

Electromagnetic (EM) Material Containment

Containing majority to all of electromagnetic (EM) radiation is a concern across industries yet mostly for the Medical MRI profession. Current NMR & MRI at best shield part of the EM noise.

Acoustic Containment

Containing majority to all of acoustic noise is a concern across industries yet mostly for the Medical MRI profession. Current NMR & MRI at best shield part of the acoustic noise.

Electromagnetic (EM) Material Containment Cooling

Thermally conductive materials to allow cooling for all electromagnetic (EM) containment shields will be provided. Unlike LHe, LN2 readily allows the embodiment for all EM shields a transient heating conductive cooling path without adding significant cryogen heat loads.

Cool Down Method and Plenum Design

At the start of the cryogen cool down process, the liquid nitrogen (LN2) plenum is used to push gaseous nitrogen to evacuate air in the warm cryostat prior to LN2.

Compact NMR Coils

Gradient coils will include capacitive reactive compensation circuits to assist with time response. Active gradient shielding will minimize eddy current and k-space trajectories will correct for gradient hardware.

Magprop & Maalev

This embodiment applies to any and all SC linear machines, motor and generator, embodiments from very small to very large. To date linear machines for electromagnetic propulsion (magprop), and mostly levitation in magnetic levitation cases (maglev), are conventional EM to permanent magnet based. This embodiment allows the option of small to large SC linear machines.

Hybrid Superconducting Magnetics

The magnetics include embodiments that are hybrid with conventional electromagnet (EM) conductors and/or permanent magnets to complete wound SC and/or bulk TFM type SC. Embodiments include using magnetics of one type of source, such controlled and wound SC, to control and shape the magnetics of another type of source, such as a TFM or permanent magnet, whether part of the same pole or not.

Combined Superconducting Magnetics and Speed

Another embodiment of the invention is the combination of increasing the speed of a partial to complete SC device to further increase energy density and specific energy while not losing efficiency due to speed induced transient losses.

Superconducting Magnetic Prime Mover Power System Approach

The magnetic prime mover power system focus is atypical for an SC machine. Large scale efficiency and performance increase for any electrical machine is commonly achieved through the energy system means of increased relative motion of the magnetic reference frame, for example the armature and exciter field coil in a synchronous motor and/or generator machine, and/or by maximizing the magnetic air gap magnetic flux density (B) for a particular operational temperature (T). This energy system approach is the future of SC machines once SC materials allow further increases. This common approach is not the direct focus of this embodiment. Instead, this embodiment incorporates a power system approach from the benefits of increased current density (J) from a system mindset.

Removal of Gearbox for Superconducting Power Train

SC machines can provide much higher torques via both a higher current (I) and B which enables the practical removal of gearboxes.

Removal of Converter for Superconducting Power Train

A higher voltage can remove power converter steps and associated losses in part or at times in whole by replacing the converter with a well-tuned and stably filtered voltage transformer system. Maximizing the EMF or generated voltage (V) is achieved by maximizing the N per Faraday's Law and accordingly a greater primary to secondary magnetic coupling since inductance increases by the square of the N. Current (I) developed has no R dissipative energy component, the largest loss of a conventional machine, and negligible stray losses and hence is still very high which increases the total power generated and is only limited by the magnetic flux density (B) and SC critical values which are traded between series and parallel winding sets per phase.

On the system scale this V instead of B and hence I output dominant generator and/or motor lessens to entirely remove the need for a power electronic converter in the power train and replaces the converter with a larger reactive power filter. The final intent is to allow maximum energy capture at a high V output across intermittent shaft rotations without a converter or other efficiency lowering device. This is then provided to a large V isolation capacitor bank with a single direction power flow configuration which then directly feeds the next level of V step up into the transmission lines.

It is yet another aspect of embodiments of the present invention to provide a winding machine for use with delicate linear media, comprising: a delicate linear media wind-from spool, which is used to store the delicate linear media and from which the delicate linear media is removed; a cable core associated with the wind-from spool; at least one motor that turns the cable core through a revolving tube and onto a wind-to spool; and a transposition wheel associated with revolving tube, the transposition wheel configured to wrap a media strand onto the cable core.

It is yet another aspect of some embodiments to provide a method for winding a delicate linear media from a delicate linear media source onto a spool comprising the steps of: (a) configuring a winding machine with: a delicate linear media source, said linear media source comprising a wind-from spool, wherein said wind-from spool is used to store the delicate linear media and from which the delicate linear media is removed; a first motor for rotating the wind-from spool; a wind-to spool, said wind-to spool being the spool onto which at least a portion of the delicate linear media removed from the delicate linear media source is to be wound; a second motor for rotating the wind-to spool; a wire tensioning system, said tensioning system comprising a tensiometer and a single tension sensor wheel; a cable core associated with the wind-from spool; a third motor that turns the cable core through a revolving tube and onto a wind-to spool.

The Summary of the Invention is neither intended nor should it be construed as being representative of the full extent and scope of the present invention. That is, these and other aspects and advantages will be apparent from the disclosure of the invention(s) described herein. Further, the above-described embodiments, aspects, objectives, and configurations are neither complete nor exhaustive. As will be appreciated, other embodiments of the invention are possible using, alone or in combination, one or more of the features set forth above or described below. Moreover, references made herein to "the present invention" or aspects thereof should be understood to mean certain embodiments of the present invention and should not necessarily be construed as limiting all embodiments to a particular description. The present invention is set forth in various levels of detail in the Summary of the Invention as well as in the attached drawings and the Detailed Description of the Invention and no limitation as to the scope of the present invention is intended by either the inclusion or non-inclusion of elements, components, etc. in this Summary of the Invention. Additional aspects of the present invention will become more readily apparent from the Detail Description, particularly when taken together with the drawings.

BRIEF DESCRIPTION OF THE DRAWINGS

The accompanying drawings, which are incorporated in and constitute a part of the specification, illustrate embodiments of the invention and together with the general description of the invention given above and the detailed description of the drawings given below, serve to explain the principles of these inventions.

It should be understood that the drawings are not necessarily to scale. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

FIG. 1 through FIG. 5 illustrate an embodiment of the present invention that satisfies the requirements described above with respect to winding delicate linear media, such as superconducting wire, into a coil shape. Typically, superconducting wire will be wound onto a spool and then reacted as described above to create a magnet or shape capable of making very strong electromagnetic fields. A spool of reacted superconductor wire from which the wire is to be removed (the wind-from spool) is loaded onto the lower spool position. The system according to some embodiments of the invention shown in FIG. 1 through FIG. 4 is a dual system, with the capacity for two different wind-from spools and two wind-to spools. Other system configurations are possible within the scope of the invention, including systems with N wind-from and N wind-to spools, where N may be one or N may be greater than two. The wire is not shown in these figures for purposes of clarity in illustrating the apparatus components. Although in one embodiment for magnets is shown in FIG. 1 through FIG. 5, the wind-from spool is the lower spool and the wind-to spool is an upper spool, any orientation could be used, including for example a reverse arrangement or two spools side-by-side at the same height.

Another category of embodiments of this invention employs arrangements that produce windings around a linear former instead of a spool. Thus, cables are produced from even delicate media including advanced superconducting wire. FIG. 11 through FIG. 17/17A show demonstrators and portions of machines as examples of this category of embodiments. Each of these examples demonstrate the one arrangement of revolving the media source spools around the cable core to accomplish the winding. Other embodiments not shown are arranged such that the cable core revolves and the media source spools have one fewer DoF required to accomplish the cable wind.

Figure 10:
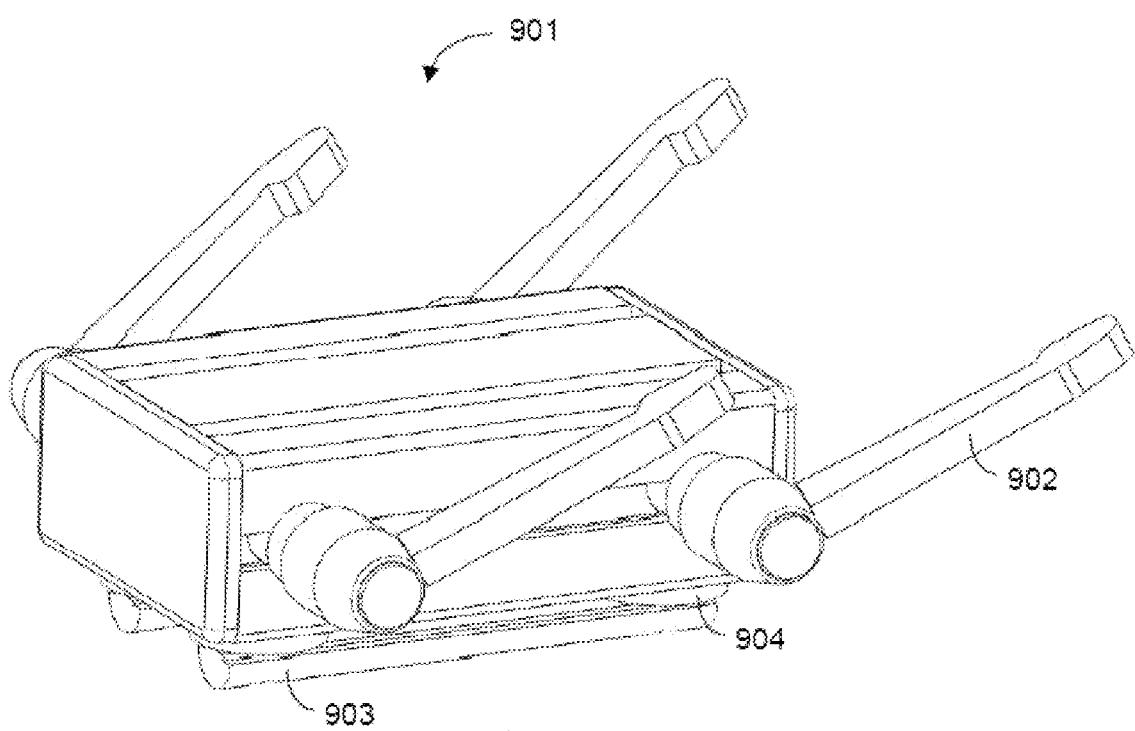
FIG. 10 is an illustration of a carriage that can be used to move and/or lock components of the media handling system in place.

Wire winding machine 100 comprises a frame 101 that supports the various components of the apparatus. Some embodiments of a wire winding machine according to the present invention can make use of commercially available framing systems using metal frame elements that can be mounted together in any desired configuration. In the embodiment of claim 5, the frame elements form a rectangular box shape, with various cross members for additional structural support. Referring also to FIG. 10, some embodiments of the present invention can make use of the novel MMP Carriages that allow frame elements within the overall outer frame to be readily moved and locked into place, whether in a no-load or high load setup. Such allowance provides for readily manipulating frame elements into new process configurations not possible with regular extrusion setups. Using MMP Carriages, it is possible to accommodate the manual positioning of both the wind-from and wind-to spools into any 3D location within the frame. Some embodiments of a wire winding machine according to the present invention can also include a gantry or crane system for the purpose of readily moving a load within the overall frame either within a single process station or to transfer a load between multiple stations.

Lower spool 110 (the wind-from spool) will typically be loaded with reacted superconductor wire, which is being transferred to upper spool 108 (the wind-to spool). Rotational motors 134 and 135 can cause the lower spool 110 and upper spool 108, respectively, to rotate in order to unwind the reacted wire from the lower spool 110 and wind it onto the upper spool 108. Rotational motors 134 and 135 can preferably be operated independently of one another.

Figure 5:
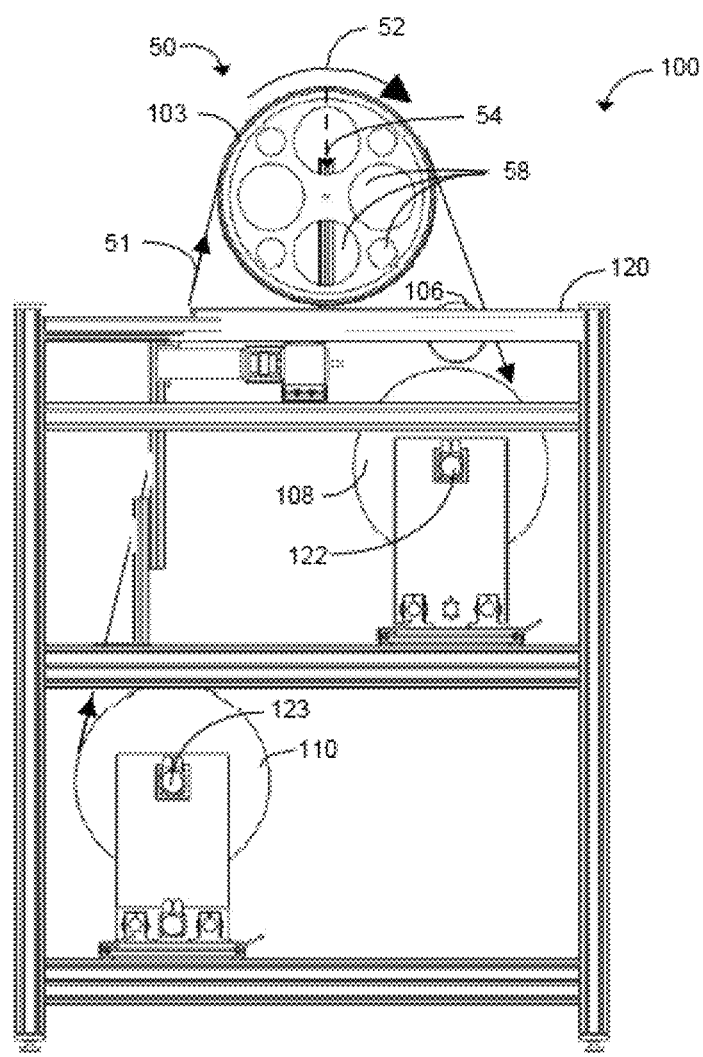
FIG. 5 shows a side view thereof and provides clear view of media routing path.
Figure 6:
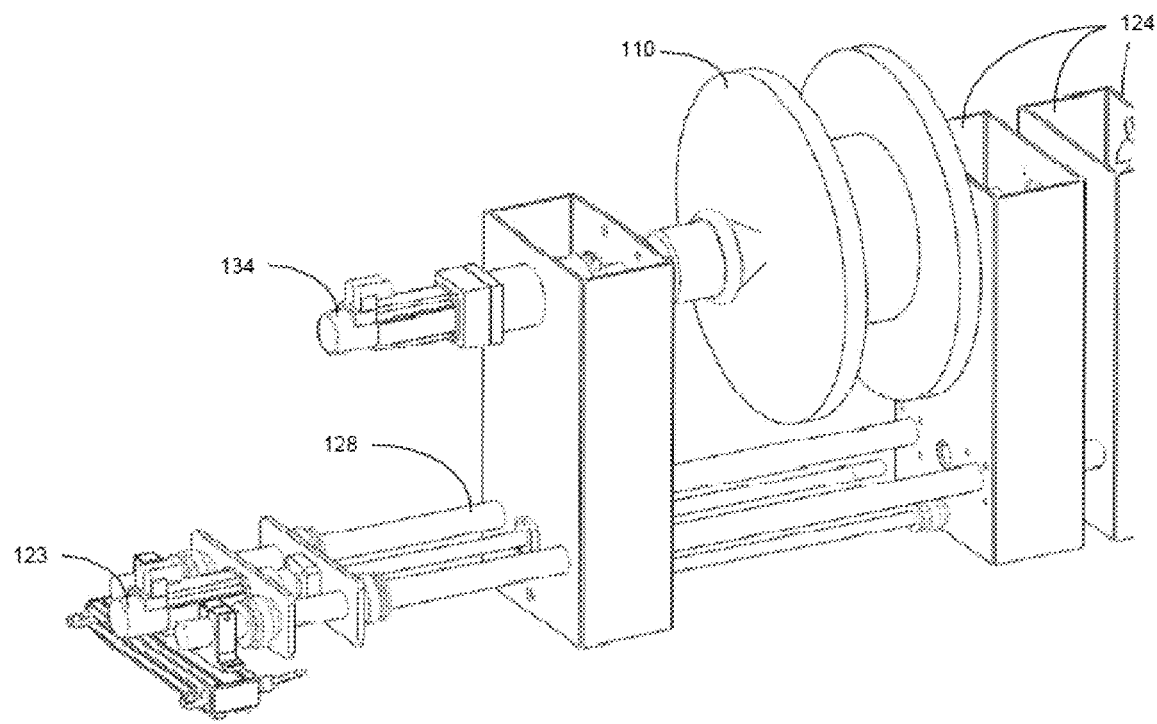
FIG. 6 shows an isometric view of the shaft supports and the shaft support rods according to one embodiment the present invention.
Figure 7:
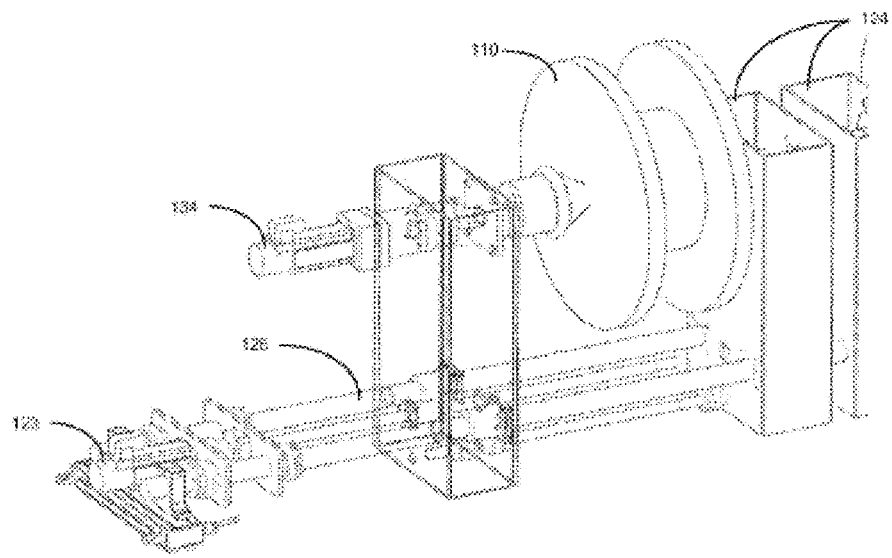
FIG. 7 shows a view of FIG. 6 with one of the supports shown as transparent.

Referring also to FIG. 5, wire from the lower spool 110 would be fed up and over the tension wheel 103 of the wire tension sensing system 50 in the direction shown by arrows 51 and 52. According to some embodiments of the present invention, the wire tension sensing system 50 is used as the primary control loop for the operation of the entire apparatus. This can be referred to as direct closed loop axial control, which is developed by directly sensing the axial tension on the linear media. The determination of axial tension can be problematic for delicate linear media. Many types of prior art tension measuring systems inherently induce some additional tension onto the media through the use of multiple pulleys or levers contacting the moving media. Further, many prior art tension measuring systems introduce small diameter bends and even reverse bends to the linear media. Either of these situations can destroy delicate media such as superconductor wire.

The accurate determination of axial tension without damaging the delicate linear media can be accomplished, for example, by the novel wire tension sensing system 50 according to the present invention. The wire tension sensing system 50 of the present invention makes use of a tension sensor wheel 103 and a tensiometer 104 (see also FIG. 1 through FIG. 3).

Because the tension sensing system should have no reverse bends, it is preferred that only one tension sensor wheel 103 is used, instead of the more common three-pulley tensiometers of the prior art. A single wheel system is also advantageous because the complexity of wire/media routing is minimized and there is less chance of fouling the wire surface or fibers. The arrangement between the wind-from spool 110, the tension sensor wheel 103, and the wind-to spool 108 incorporates a bend around tension sensor wheel 103 (as shown by line 52 in FIG. 5) that is close to 180 degrees for a better tension measurement. Because of the sizes of the spools (loaded and unloaded) and the other components of a winding machine according to the present invention, it will often be impractical to use a 180-degree bend around the tension sensor wheel. In the embodiment shown in FIG. 5, the bend is approximately 160 degrees. Any measurement error resulting from the angle will be small enough that it can be ignored. Alternatively, the error can be corrected for during the axial tension calculations. In some embodiments, angles as low as 60 degrees could be used.

The media is passed over wheel 103 which is supported by a center bolt 305 (see also FIG. 3) that is part of the tensiometer system 104. A known Wheatstone bridge arrangement allows the stress applied to the bolt to be measured to a high degree of accuracy. Persons of skill in the art will recognize that the center bolt 305 will also be stressed by the weight of wheel 103. The weight of the wheel 103 will need to be zeroed out in order to measure only the strain on the shaft caused by the delicate media. According to some embodiments of the present invention, the tension on the media can be calculated (preferably by software operating on a computer memory) from the angle of the wire, the diameter of the wheel 103, the temperature, and the stress applied to bolt 305 using a known calculation. For most applications, the angle of the wire will not change enough to be significant, but where there is a large change (which might result from a relatively large amount of wire wound onto or from a narrow spool) the angle will have to be calculated. In some embodiments, the wire angle can also be sensed by an appropriate sensor using known techniques.

While such a wheel and tensiometer arrangement is known in the art, Applicant has discovered that the bend radius requirements for the storage spools must also be applied to this type of tension sensing wheel in order for the apparatus to determine the media's axial tension in order to handle the media without damage. Accordingly, when winding, for example, magnesium diboride superconductor wire, wheel 103 will preferably have a diameter of at least 22 inches.

The relatively large size of the wheel causes a number of problems for the tension sensing system 50. Because the tensiometer arrangement for measuring the stress applied to the center bolt 305 needs to be able to accurately sense very small forces (typically less than 3 pounds) a large, heavy wheel will typically weigh so much that it will damage or degrade the performance of a sensor with a measurement range that covers such small forces. For example, if a very heavy wheel is used, the very small forces that are allowable for axial tension of a delicate media will make up only a small portion of the total force applied to the center bolt (with the large majority being the mass of the wheel).

The forces to be measured will thus be largely lost within the system noise and measurement accuracy will be very low. Sensor resolution tends to be expressed as a percentage of the total measurement range of the sensor. For example, if a family of sensors has a resolution of 0.5%, a sensor capable of measuring up to 50 pounds for example, would have a resolution of 0.25 pounds. Such a sensor would not be able to allow the system to control axial tension to within +/−0.1 pounds as discussed above. A sensor with a higher resolution, however, would have a correspondingly lower measurement range. For example, a sensor with a range of 11 pounds would have a resolution of approximately 0.05 pounds. Such a sensor would provide the required resolution to control axial tension to within +/−0.1 pounds, but the total weight of the wheel and the tension (the desired tension could be on the order of about three-five pounds, for example) must be within the sensor's measurement range. Skilled persons will realize that it is preferable that the sensor resolution actually be as low as possible in relation to the allowable axial tension tolerances.

Therefore, the axial tension sensor wheel, the primary control feedback mechanism, should be as low as possible in overall mass to stay within the precision sensor limits to maintain a precise measurement as well as to allow the feedback motors to properly and safely control the media motion. The overall mass directly relates to the sensor range and accuracy limits possible for a reading and preferred values are case dependent for desired sensor feedback.

As a result, in one embodiment the wheel 103 be formed from a very lightweight material and that the wheel itself have a number of cutouts 58 to reduce the overall weight of the wheel. In some embodiments of the present invention, the wheel will weigh no more than 10 pounds, despite having a radius of 11 inches; more preferably, the wheel will weigh 5 pounds or less. The maximum allowable weight of the measurement wheel itself is dependent upon the axial forces being measured and the required sensor resolution. For example, where the maximum allowable axial force on the delicate linear media is three pounds, and the required tension tolerance (variability) is +/−0.1 pounds, the maximum preferred wheel mass would be approximately 7 pounds (for a resolution that is approximately half of the allowable tension tolerance).

Wheel 103 may have a very evenly distributed and uniform mass around the circumference. Any variation in mass can introduce inaccuracies in the axial force determination, which can be very detrimental to safe media handling. In some embodiments of the present invention, the wheel's angular variation in mass will be no more than 1/10 of the desired winding (axial) tension tolerance resolution. In some embodiments, minor variations in mass can be compensated for by calibrating the wheel and adjusting the sensor signal accordingly. Preferably, the wheel can be formed of a lightweight plastic or carbon fiber material, although any suitable lightweight material could be used that is rigid enough to support the wire and maintain a uniform mass around the circumference of the wheel. A suitable wheel can be manufactured by any suitable means, including for example, injection molding, 3-D printing, or stereolithography.

By using direct closed loop axial control as described herein, the delicate media can be unwound from the wind-from coil 110 and wound onto the wind-to coil 108 without producing an axial load that will damage the media. As the media is being transferred from one spool to the other, if the axial tension rises to a preset threshold, the system controller 137 will operate to compare the sensed axial tension to the preset threshold and then to reduce the tension, for example by speeding up the rotation of the lower wind-from spool 110 by a small amount. If the tension falls too low, the rotation of the wind-from spool 110 could be slowed by a small amount. In one embodiment, the rotational speeds of both spools can be controlled so that the system can maintain a proper media tension at the desired winding speed. Operation of the system controller 137 can be programmed via computer and monitor 140.

Figure 1:
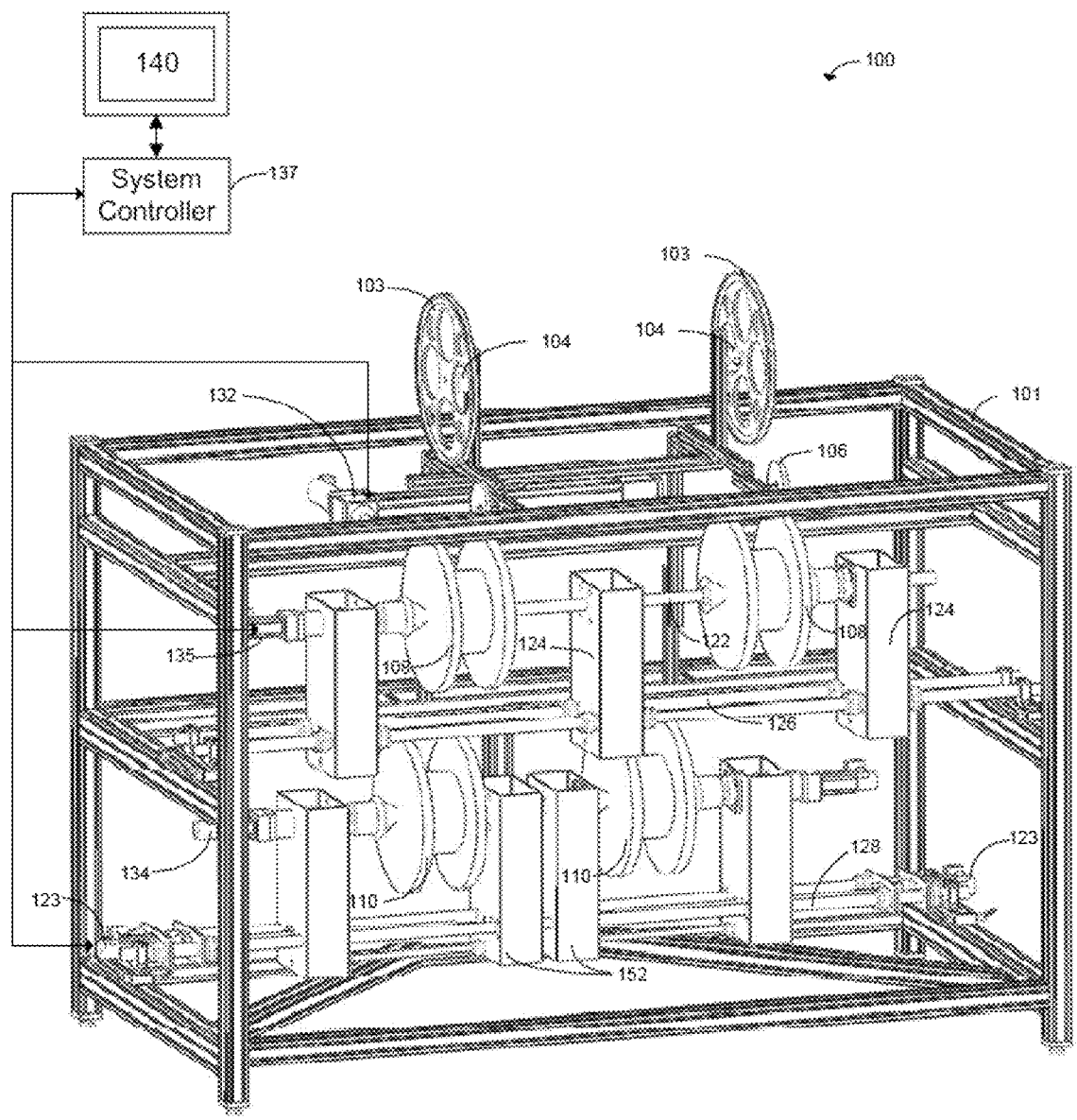
FIG. 1 shows an isometric front view of a linear media handling system according to one embodiment the present invention.
Figure 2:
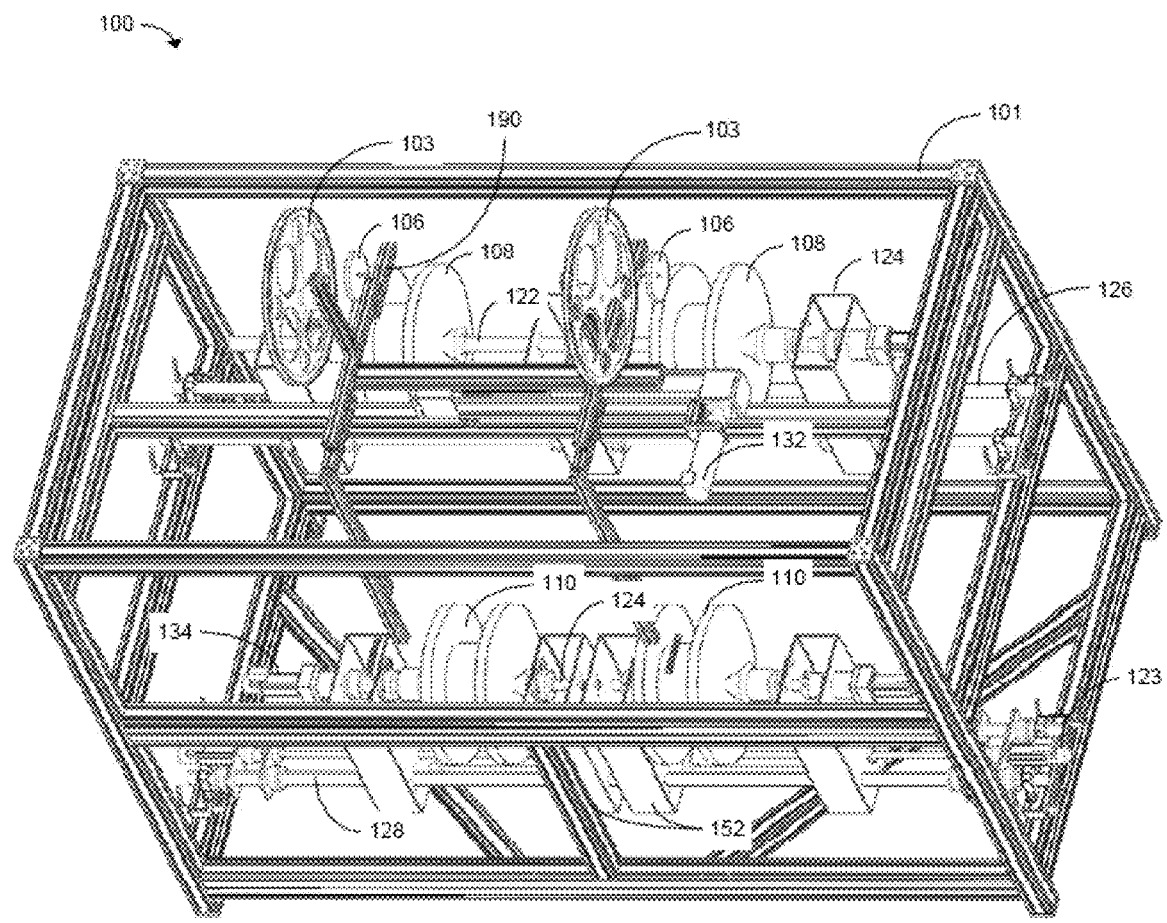
FIG. 2 shows an isometric top-down rear view of the embodiment of FIG. 1.
Figure 3:
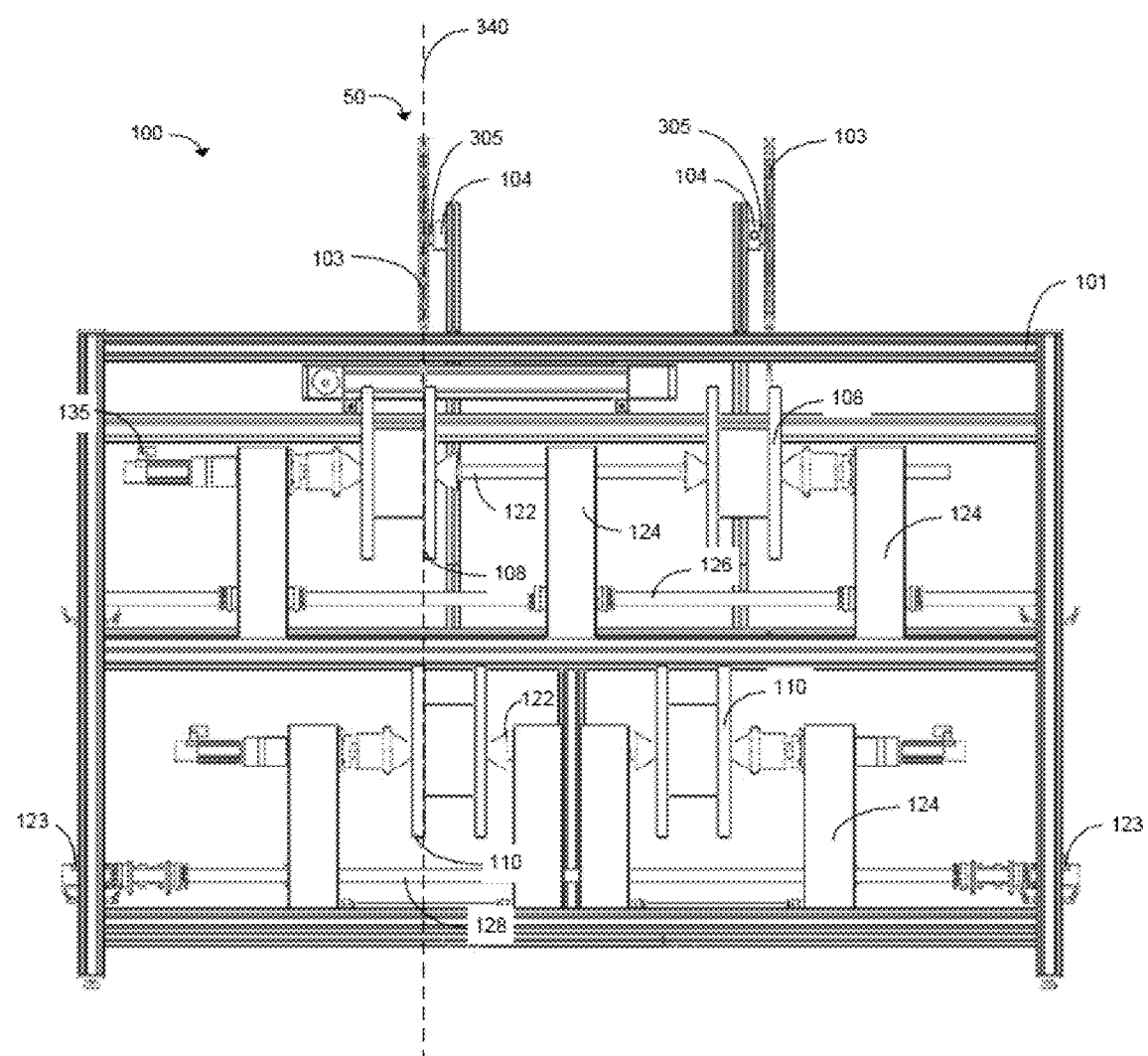
FIG. 3 shows a front view thereof.
Figure 4:
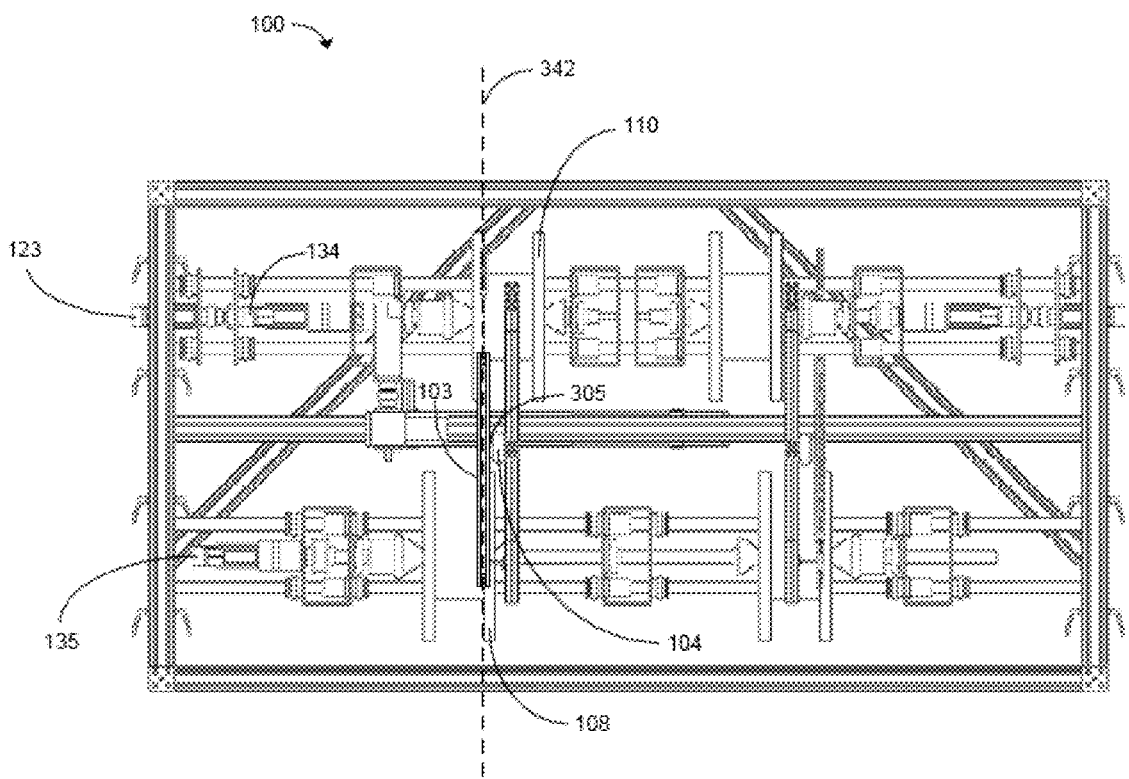
FIG. 4 shows a plan view thereof.

As described above with respect to Direct Closed Loop Lateral control, it is also preferable that any lateral stress on the wire as it is wound from the lower spool 110 to the upper spool 108 be eliminated, or at least minimized to no more than 1/10 of the maximum allowed axial tension. In some embodiments of the present invention, this is accomplished by maintaining the wind-off and wind-on points of spools 110 and 108, respectively, as well as the tension sensor wheel 103, in substantially the same plane. This is illustrated in FIG. 3 and FIG. 4 by dashed lines 340 and 342, respectively. As shown in FIG. 3, while the left-hand (as viewed from the front of the system 100) winding system is being used, wire would be winding off the far left of lower wind-from spool 110. The wire would then pass over tension wheel 103 and back down to wind onto the far right of upper wind-to spool 108. The positioning of the wire with respect to the upper spool 108 is aided by a follower wheel 106 (see FIG. 2 and FIG. 5) located between the tension sensor wheel 103 and the wind-to spool 108. The wheel 103 and follower 106 are preferably moveable so that they can maintain a position that is largely in line with the desired position on the wind-to spool 108 that will allow the media to be tightly wound onto the spool. Preferably, lateral movement of the wheel 103 and follower 106 is accomplished by motor 132 and controller 137, which can be programmed to move the wheel 103 and follower 106 into the proper position by taking into account factors such as the winding speed and the size of both the media and the upper spool 108.

The lateral position of the wind-from spool 110 can be adjusted by linear motor 134 and a controller 137. Adjustment will frequently be necessary when, for example, the wind-from and wind-to spools are of different sizes. In FIG. 3, the position of lower spool 110 has been adjusted along lower spool center support rod 128 by linear motor 123 so that the far left portion of spool (the wind-off position in this example) 110 is also located in plane 340.

FIG. 4 shows a different view of the same point in the winding process. The wind-off location is at the far left of lower spool 110, while the wind-on position is at the far right of the upper wind-to spool 108. Skilled persons will recognize that the arrangement (i.e., planes 340 or 342) need not be at either extreme of spools 110 or 108, and rather any appropriate portion of lower spool 110 (depending on the wind-off location) can be positioned so that it is in the same plane as the wheel 103 and follower 106 and as the wind-on location of the upper wind-to spool 108.

This type of lateral control requires a sensor capable of determining the location of the wire unwinding (the wind-off point) from the wind-from spool 110. In some embodiments, the sensor used to sense the media lateral position for the direct closed loop lateral control system is simply a rotational position-sensing encoder turned into an angle position system by placing a pair of low mass, parallel, adjustable separation bars on the sensor shaft. The media is routed through these parallel bars 190 (see FIG. 2), which have a center that is in substantially the same plane as the follower. The sensor angular position indicates if the media is too far to one lateral side or another with respect to the follower plane and therefore moves the wind-from spool to realign the spool wire wind-off with the follower plane. The lateral positioning sensor thus forms another closed control loop controlling the lateral position of the lower wind-from spool. Typically, the lateral position of the lateral positioning sensor and follower relative to the upper wind-to spool can be programmed based upon the spool and media sizes to produce a tightly wound coil.

The end of the travel media-follower guides allows a tight tolerance condition. Two primary mechanisms provide this ability. This first mechanism is a manually or automatically adjustable axis of the wire guide towards the media in the wind-to spool to precisely control the media lay-up. The second mechanism is to manually or automatically have the wire-guide side approaching the end of the follower travel move beyond the interference position posed by the follower travel and/or spool side next to the media itself and thereby allow the end of travel limits to extend to the true end of the wind-to spool and/or spool media lay-up. This end of limit follower guide prior to reversing the follower direction will be activated either passively via a mechanical mechanism or through the linear motion end of limit switch. Both mechanisms are used to provide a tighter and more even media-packing factor through the full media positioning control length of the wind-to spool.

In the winding system 100 of FIG. 1 through FIG. 7, the spools and center rods are supported by a number of modular supports 124 that provide a simple and cost-effective method of construction. Supports 124 are preferably formed from a rectangular extrusion of, for example, aluminum or an aluminum alloy. A hole bored with a high degree of accuracy on the centerline in each extrusion is fitted with a bushing that supports the center shafts 122 of the spools and ensures they are aligned with these centerline openings. Supports 124 are held in position relative to the frame 101 by support shafts 126 and 128. Preferably at least two support shafts 126 or 128 are used for each support 124 to provide both vertical support and rotational alignment. In this way, the positions of the components can be maintained within tolerances. Supports 124 also provide an extremely robust mounting structure through the uniquely large separation of the large diameter parallel support shafts 126 and 128 for a relatively affordable cost. Supports 124 are a central feature of the MORT technology, described above, that allows a reduction in both part count and tolerance stack up between the linear motion and the rotary motion. Tailstocks 152 provide additional support for wind from spool 110 and in some embodiments are exactly identical to supports 124. Those skilled in the art will recognize that MORT technology can function via a cantilevered system to hold a large spool without the use of a tailstock.

Figure 9:
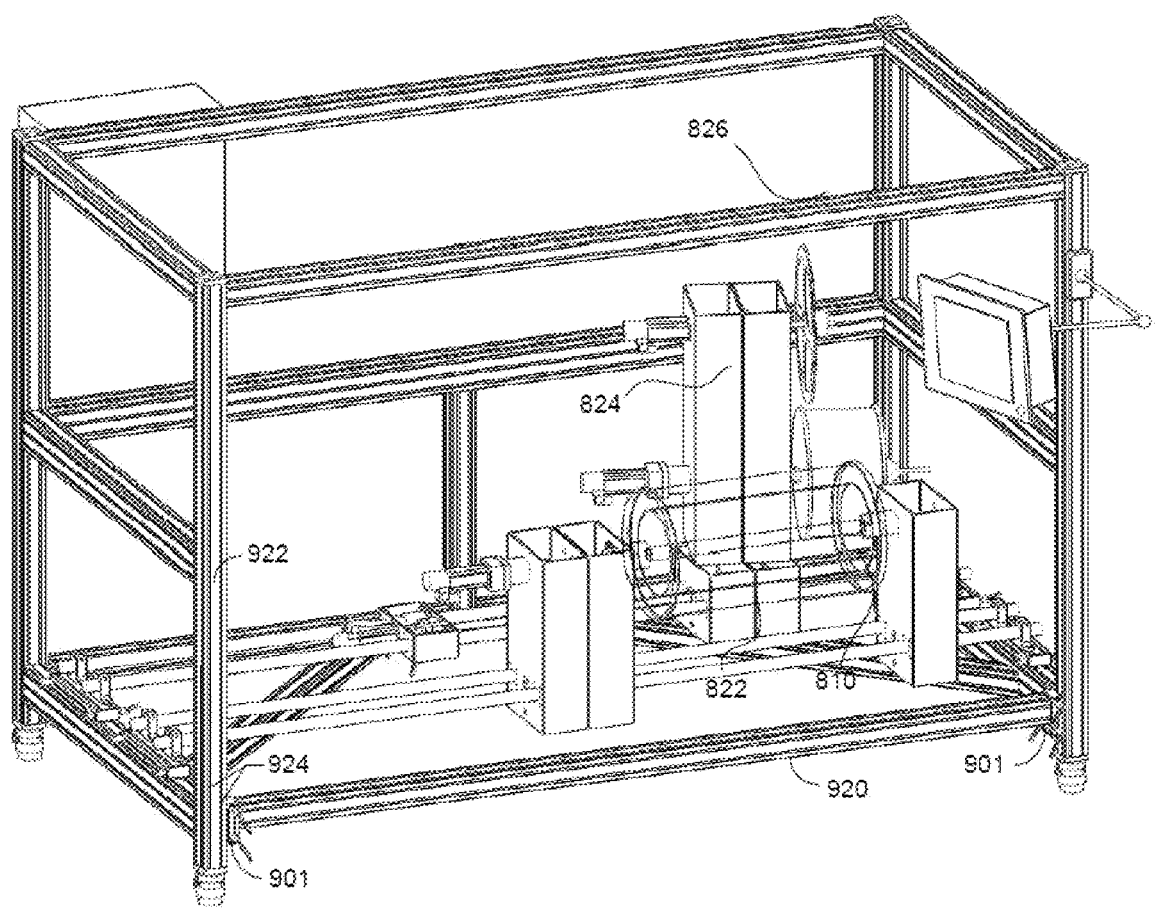
FIG. 9 is an illustration of the embodiment shown in FIG. 8 as part of the linear media handling system.

FIG. 9 shows another embodiment of the present invention which incorporates an angle on/off wind and allows a continuous or changing angle from the spool wind off. Media 702 is unwound from wind-from spool 704 and wound onto a wind-to spool 706 at an angle 742. A follower 710 is a sensor system that measures axial tension. Follower 710 can rotate with rotational degree of freedom 722 and can also move linearly with linear degree of freedom 724. Wind-to spool 706 and wind-from spool 704 also have rotational degrees of freedom, shown as 726 and 728, respectively. Wind-from spool 704 is held in place by spool supports 732 and 734. Support 732 has linear degree of freedom 754, while support 734 has rotational degree of freedom 752. The combination of both linear and rotational degrees of freedom provides a means of varying the set or changing angle relationship while maintaining constant axial tension. Active control loops based on the axial tension value as the global control master and a hierarchy of master slave relationships from that top-level master provides the means of varying the set or changing angle relationship while accurately maintaining the desired performance value such as constant axial tension. This embodiment allows additional active degrees of freedom, which suits needs such as a tape media winding or helical winding, where the wind-to spool must assume a special angle for the winding yet the angle from the wind-to spool back to the wind-from spool must be constant or a set varying value. Those skilled in the art will readily recognize that the angle of the winding can be changed to fit the desired application and the capabilities of this embodiment can be controlled automatically as well. Not so easily recognized is that this rotational system, coupled with the tension feedback controlled rotation of the wind-from spool and the wind-to spool comprise a capable system that permits the graceful transition from winding in one axial direction to the opposite direction while maintaining a tight tolerance on continuous tension.

Figure 8:
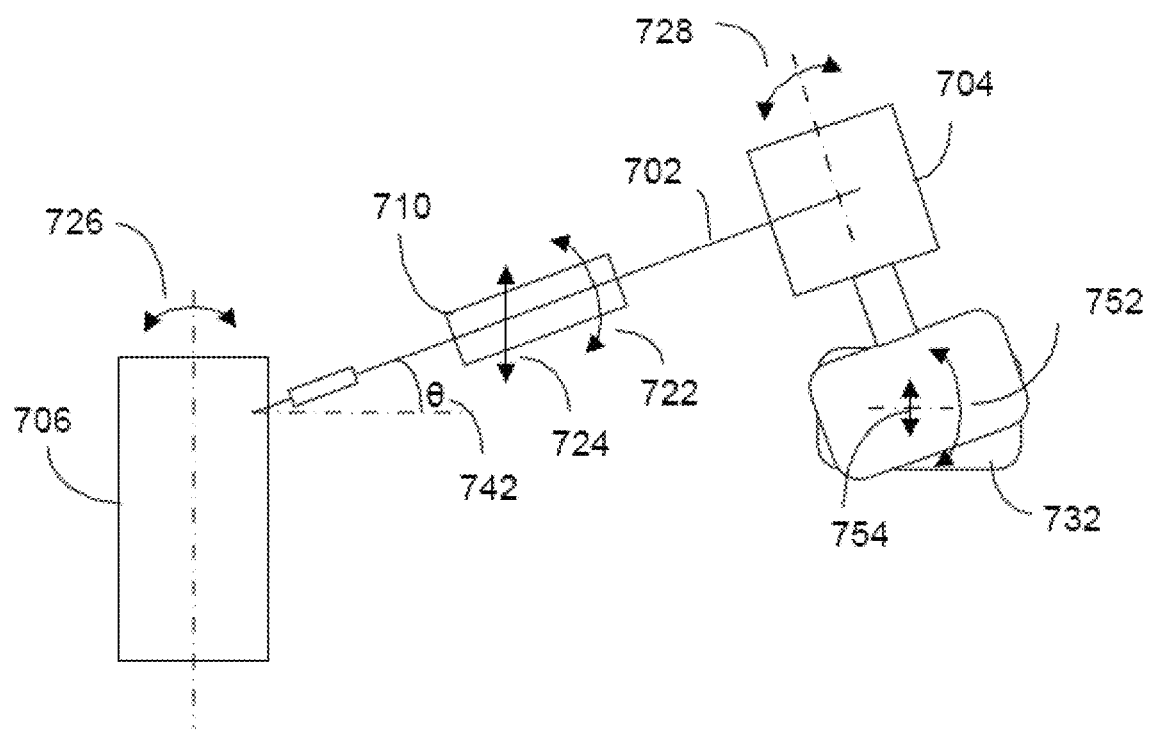
FIG. 8 shows one embodiment of the invention which allows a continuous or changing angle from the spool wind off.

FIG. 8 is an illustration of the embodiment shown in FIG. 9 as part of the linear media handling system. For clarity purposes, spool 810 is shown transparent. Wind-from spool 812 is supported by supports 822 and 824. Bottom supports 822 and top supports 824 are physically connected, but bottom supports 822 are functionally split from top supports 824 such that bottom supports provide linear movement while the top supports provide rotational movement. A tension sensor wheel 826 is used to measure axial tension. Preferably, winding can be performed either at a constant or varying angle in a manner that prevents folding or puckering for certain tape media or other non-cylindrical media applications. Changing the pitch angle 742, the angle the media is to be wound on to the wind-to spool, without any other movement creates a kink in the linear media that can exceed allowable stresses in the media. Rotation of the wind-from spool and the wind-to spool as pitch angle changes is preferably controlled to avoid any kinks or puckers. In this embodiment, an active control loop uses tension information to control the rotational and linear movement in order to maintain a desired tension. The axial tension in the media during winding is measured and the output fed back to the system controller(s), which can adjust the speed of either or both of the spool rotations (both wind-from and wind-to spools) in order to keep the axial tension within a desired range. Persons skilled in the art will readily appreciate that the active control loop can be automated to maintain a desired tension.

FIG. 10 is an illustration of a carriage 901 that can be used to move and/or lock frame elements. Four handles 902 are rotated and pull up on machined T-slot bars 903. Referring also to FIG. 9, carriages can be permanently attached, for example, at the end of a support beam such as lower horizontal support beam 920. The T-slot bars 824 slide into slots 924 of another beam such as vertical support 922. Rotating the handles pulls on the support into which the T-slit bars are slotted and compresses the upper (toward the carriage) surface of that beam against polymer washers 904. The washers 904 allow for the carriage to slide easily when not locked and provide for even spacing when clamped to lock the carriage in place against the attached beam. By mounting equipment or parts of our assembly to these carriages, the carriages can be loosened to allow linear motion is along support beams and then clamped into place at any desired location. Other known methods for removable clamping of support beams could also be used.

No Reverse Bends Linear Media Routing Design

Some embodiments of the present invention use a routing design that follows strict design rules in transferring linear media from a storage/reacting, wind-from spool to the desired wind-to spool (or bobbin or former). It is highly desirable that the media routing path have no reverse bends whatsoever. As used herein, the term "reverse bend" is used to mean a subsequent bending of the media in a direction (for example by passing the media over a second pulley in a counter-clockwise direction) after first bending the media in the opposite direction (for example by passing the media over a pulley in a clockwise direction). Such a desired no reverse bends path according to embodiments of the present invention is shown in FIG. 1 through FIG. 7 and FIG. 11 through FIG. 14 where the media is always bent in the same direction (clockwise from the perspective shown in FIG. 5 and counter-clockwise from the perspective of FIGS. 13 and 13A. Applicant has discovered that reverse bends, even minor reverse bends such as those used in many prior art tensiometers, can be very damaging to delicate media, including for example magnesium diboride or niobium-tin superconductor wire.

Bend Radius Control

For handling reacted $MgB_2$ or $Nb_3Sn$ type delicate superconductor wire according to some embodiments of the present invention, the minimum bend radius should be at least 11 inches (27.9 cm), which is equal to a bend diameter of at least 22 inches (55.9 cm), for media which was reacted in a flat (i.e., approximately uncurved) state. The radius of curvature is used to determine the maximum stress point to which the media in question can be exposed without suffering mechanical damage.

Figures 13, 13A:
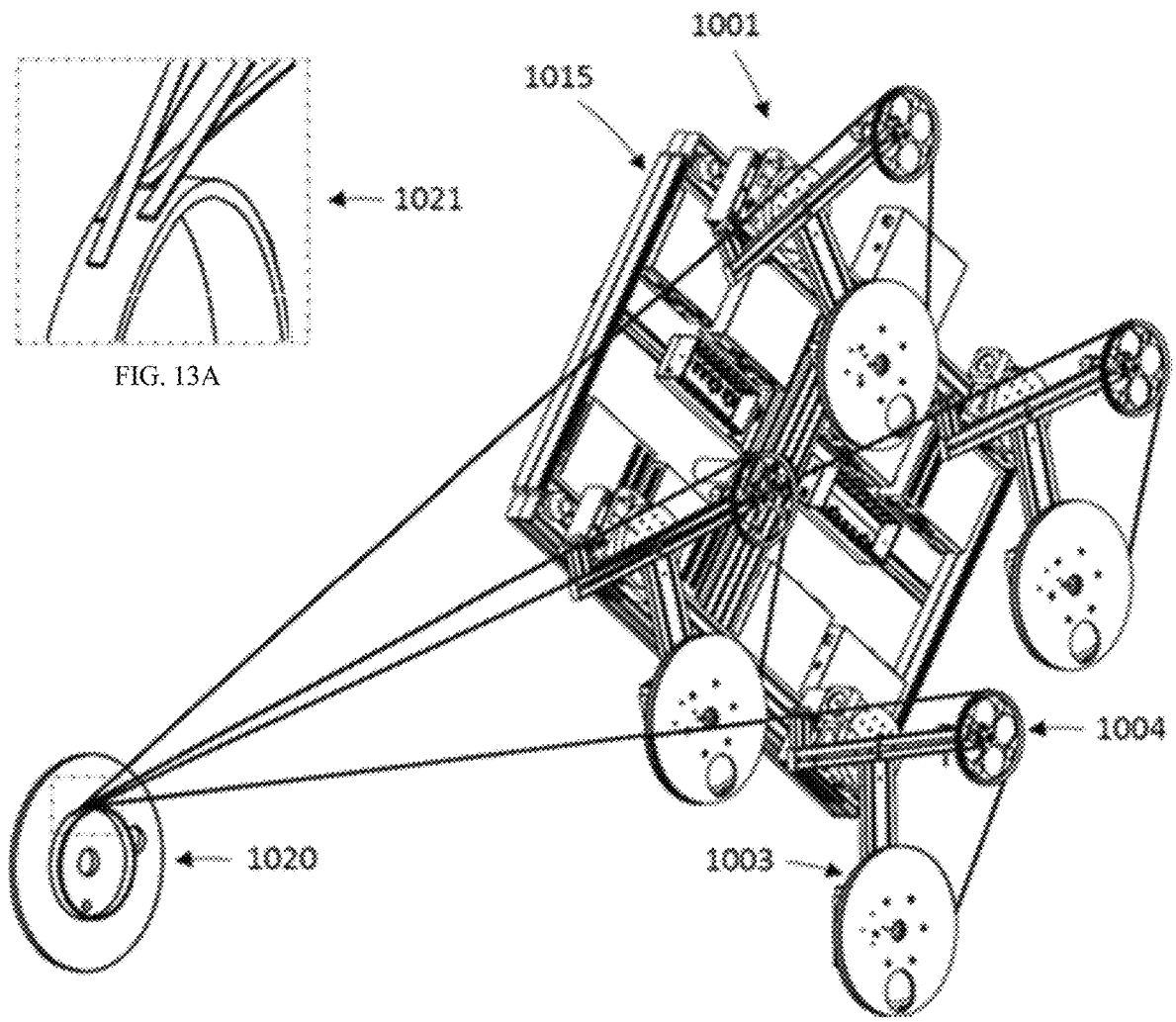
FIG. 13 shows an isometric view of a portion of an embodiment of the invention that can produce a full transposition wind of a subcable consisting of four media strands.
FIG. 13A is a partial detailed view of FIG. 13.

On a media cross-section, the radius of curvature is used to define the motion of the neutral axis with respect to the centroid of the material. Inside the material at a given radius of curvature, separation from the neutral axis provides compressive and tensile forces which determine the media stress and strain relations that contribute to material fatigue and failure points. Applied to wire routing, the radius of curvature can thus be used to determine the minimum bend radius allowable under various conditions. If magnesium diboride wire, for example, is reacted flat, then the reaction geometry including radius becomes the stress free point. The radius of curvature bend limit is then either a complete bend in one direction with no reverse bends, half of this bend radius value in either direction from the linear reaction point, or some other arrangement totaling the bend limit about the stress free radius. Similar philosophy dictates any starting stress free reaction process point and the associated bend radius limits. As an example, a typical winding according the embodiments of the present invention will use wire that has been reacted flat then bent in one direction with no reverse bends. This example reflects a typical use, but other radius of curvature options could also be employed. For example, a wire can be reacted while coiled, and the acceptable curvature would then be determined based upon the coiled position as a stress free point. The figures show various embodiments of winding machines and not all configured to safely handle the bend radius requirements of most fragile media. Inspection of FIG. 5 shows large radii from wind-off spool 100 to tension measurement spool 103 and onto wind-on spool 108. Inspection of FIGS. 13 and 13A, representative of cable winding embodiments, shows routing from wind-off spool 1003 to tension measurement spool 1004 and onto wind-on spool 1020. In particular, tension measurement spool 1004 is less than the 22 inches bend diameter. Embodiments of cable winding machines can accommodate bend radius control for the most fragile SC, but it creates engineering challenges as these large diameter components crowd one another in crossing planes of motion.

Dynamic Surfaces

The intent is to provide added protection for the linear media by allowing fewer or no static frictional surfaces, thus lowering the axial strain while protecting the surface of the media by ensuring that the coefficient of friction in the direction of media motion is a dynamic coefficient of friction rather than a static coefficient of friction, which would be the case if the media were sliding over a stationary surface. See guide wheel 106 in FIGS. 5 and 1005 in FIG. 11.

Direct Closed Loop Axial Control

The axial tension in the media during winding is measured and the output fed back to the system controller(s), which can adjust the speed of the spool rotations (both wind-from and wind-to spools) in order to keep the axial tension within a desired range. As discussed earlier, the wire tension sensing system 50 of the present invention makes use of a tension sensor wheel 103 and a tensiometer 104 (see also FIG. 1 through FIG. 3). The axial tension must be low enough that the media is not damaged. The upper limit for axial tension will depend upon the media. For most superconductor wire applications, the steady state tension will be less than 5 pounds, more preferably less than three pounds. The greater the margin between allowable tension and sensor resolution (discussed below), the higher the throughput speeds that can be safely achieved. For most applications, the tension will need to be controlled to plus/minus a much smaller value (variance), preferably to within +/−0.1 pounds and even less for small winds. The axial tension will need to be high enough that the media unwinds from the wind-from spool and onto the wind-to spool in the lay down manner and orientation desired. Axial tension of at least 1 pound is appropriate for most cases winding delicate media. In extremely delicate cases the axial tension is readily controlled to around 0.5 pounds for even a medium sized wind and 0.1 pounds for a small wind. The greater the margin between sensor resolution (discussed below) and tension, the higher the throughput speeds that can be achieved.

Direct Closed Loop Lateral Control

Figure 11:
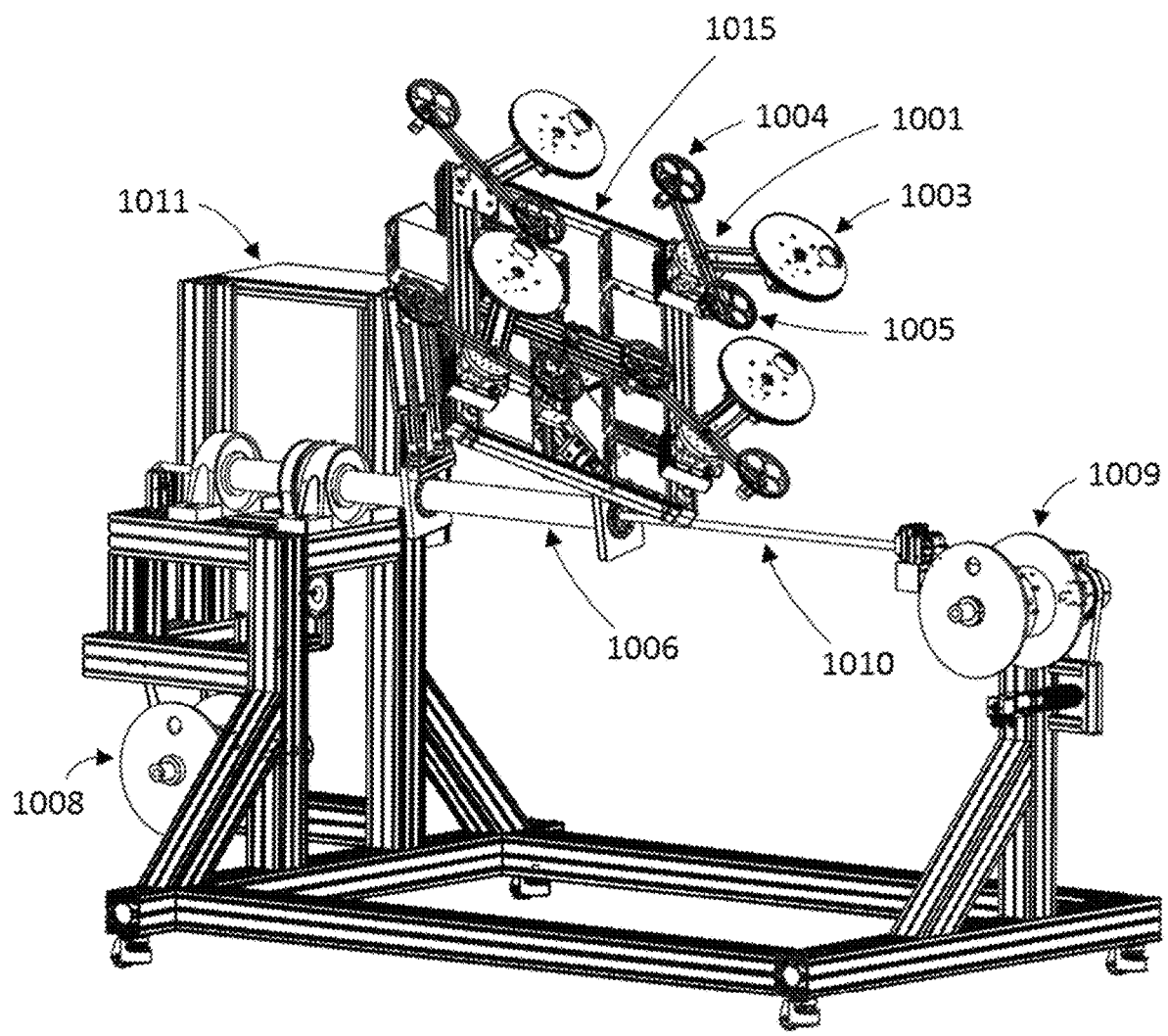
FIG. 11 shows an isometric view of a portion of an embodiment of the invention that can produce a full transposition wind of four media strands.

In some embodiments, this is aided by a follower wheel located between the tension sensor wheel and the wind-to spool (See 106 in FIGS. 5 and 1005 in FIG. 11). The wheel and follower are preferably moveable so that they can maintain a position that is substantially in line with the desired position on the wind-to spool that will allow the media to be tightly wound onto the spool. If necessary, the lateral position of the wind-from spool can be changed to keep the portion of the media which is currently unwinding from the wind-from spool 110 in the same plane as the portion of the media which is winding onto the wind-to spool (or bobbin) 108. A material location sensor can be used to determine when the position of the wind-from spool 110 needs to be adjusted by linear motor 134 to maintain the proper lateral orientation to prevent damage to the media. As used herein, maintaining the wind-off and wind-on points of the two spools, as well as the tension sensor wheel, in substantially the same plane means maintaining the positions of those points close enough to the same plane that the lateral tension on the delicate linear media does not exceed 10% of the maximum axial tension limit for the particular winding task.

Media Orchestrating Routing Technology (MORT)

In magnet or spool winding embodiments, MORT is the foundation for both wind-from and wind-to spool attachment to the linear motion structure and provides a highly precise, low tolerance stack during alignment and motion of the linear media even with multiple degrees of freedom through the use of a single piece of primary structure material (i.e., supports 124 described below). MORT allows for media insertion and removal via front, side, or top loading and unloading options whether sliding the load across the holding shaft or incorporating a shaft removal section at the load location. Although a tailstock is readily possible with MORT, MORT can also be used to hold a large spool without the use of a tailstock via a cantilevered system. According to some embodiments of the present invention, the MORT system, including supports, can be configured to allow an adequate degree of freedom, both linear and rotational, to provide and control media routing.

Degrees of Freedom (DoF) Controls

For any motorized single or combination of DoF, independent or electronically geared control of linear media motion is possible through automated, partially automated, and fully manual means. This multiple degree of freedom (DoF) system will have an operator interface equivalent to providing computer aided drafting (CAD) input to computer aided manufacturing (CAM) toolpaths for computer numeric control (CNC) production. Options include a hardware joystick, a software joystick, or partially automated motion controls that allow turning on/off a single to multiple DoF for a particular move. Such ability allows the user to tune the motion for a particular need. Preferably, automated, partially automated, and/or fully manual control of any motorized single or combination of multiple DoFs is accomplished to achieve motion while accurately maintaining desired performance values such as constant axial tension. In examples described below, for example, a motorized DoF provides a continuous or changing winding pitch angle. Active control loops based on the axial tension value as the global control master and a hierarchy of master slave relationships provide the means of varying the pitch angle while accurately maintaining desired performance values such as constant axial tension.

The routing design and controlled DoF of the LMHS of one embodiment provide not only a no bend situation with minimized forces but for a tape also a line over point initial contact at the wind on location in order to further minimize stresses and bends in the linear media. This is achieved through controlled design routing & DoF control. Single winding plane with limited bends of material as well as limited stress in any direction allows a limited strain final product. The more bends and stress introduced during the magnet & cable manufacturing process, then the lower operational values allowed.

Angle On/Off Wind

One means of an optional, specialized winding allowance is accomplished by an additional active DoF providing a continuous or changing pitch angle from the wind-from spool, across the sensor systems such as axial tension, and into the wind-to spool (FIG. 8 provides a schematic and FIG. 9 provides an illustrated view of this additional DoF). Prime examples of need for wire and tape media winding include helical winding, partial to full transposition winding, and braiding where the wind-to spool must assume a special angle for the winding yet the angle from the wind-to spool back to the wind-from spool must be constant or a set varying value. A practical solution is achieved through the addition of rotational DoF on the spool and all wire routing mechanisms working in conjunction with current linear and rotary motion mechanisms. Such capabilities expand into automatically to semi automatically controlling the complete wind on/off angles for any system for any desired need.

End of Layer Sense

One embodiment of LMHS for magnet or coil winding provides a sense mechanism to determine end of layer conditions. Refer to FIG. 4, as the wind-on spool is commanded to left and right to accomplish a desired wind configuration, sense mechanism would signal approach of wind plane 342 to one or both flanges 110. This helps provide additional active precision control feedback to assist with conventionally human interaction and increases winding throughput without errors. Sensing can be accomplished with any number of mechanisms including inductive proximity sensors, mechanical contact, optical sensors, vision sensors, and laser sensors.

Dropout Identification

One contemplated LMHS embodiment benefits from the open frame architecture and employs a system for diagnosing drop outs for each individual SC material strand during the winding process but before wind on. A further embodiment challenges the open architecture for inline space to then allow replacing the drop out location with a splice. Dropout identification can be accomplished inline in the machine winding operations or as a separate process with media that would be respooled.

A final cable or magnet can then operate at higher overall power or energy including commercially acceptable operational values, such as voltage and current, and factor of safety because a higher drop out limit has been established for entire lengths of SC material.

Material Handling

Some of the LMHS contemplated herein removes high and non-uniform axial tension, makes all non-axial tension negligibly small, removes all reverse bends, keeps all bends to a single and large radius, and makes all side bends negligibly small, etc., during the winding process. Side bends are especially problematic for wires that are not round such as rectangular cross sections of wire that resembles a tape.

Further when making a cable, the final cable wind on is a smaller than desirable bend. To alleviate additional stress and strain this small radius bend operation happens only once at the end of the wind process when the strand contacts the former and is never unwound from that position. Once delicate SC strands are wound into the final cable or magnet subcomponent arrangement they are typically then protected from any further damaging mechanical manipulation via insulation or jacket layers.

The wind onto the former occurs only where the linear media, such as the SC and in particular HTS embodiment as described here, connects directly to the former and in a line instead of point contact for the SC. The SC does not touch anything besides guides, including one another, prior to the final cable, subcable, magnet, and cable magnet wind on former and then only touch within parts of a millimeter tolerance at the wind on location. This is critical for achieving a proper wind without unduly stressing the linear media as well as positioning for the exact wind geometry desired. For partial to full transposition and braiding this is all due to the transposition wheel rotating where the center axis of the transposition wheel is in-line with the former axis. If the transposition wheel axis was offset then the SC would wind together to establish a subcable prior to touching the former which induces both extra stress into the SC as well as makes full transposition or braiding impossible with a tape if maintaining a flat HTS set of tapes and not using stress inducing guides. The wind stations are purposely offset on the transposition wheel to support linear media crossovers as the back wind station lifts over the front ones with respect to the former. This lift action aligned with the former position will push the lifted SC down the former but the already wound SC onto the former and guide wheel maintains the lifted SC in the correct position.

A final cable, magnet, or cable magnet can then operate at higher overall power or energy including commercially acceptable operational values, such as voltage and current, and factor of safety because no additional performance issues were introduced through an individual SC strand to SC system media handling induced stress and strain.

Proof of Performance

Since tension, etc. are recorded for each mm if desired, the cable and magnet manufacturing values for each SC wire (note: "Strand" or "wire" are sometimes used interchangeably herein) can be provided for any location in the final product.

The SC strand test setup of some embodiments confirms on a small scale how sensitive each individual SC strand is to material handling. The problem in each strand is magnified in the final cable and magnet SC product because multiple SC strands must all interact with one another and still work properly as an entire system.

Turn-by-Turn Tension Control

A winding is composed of (1 to x) number of turns per layer and then (1 to y) number of layers. This functionality allows a final magnet to be produced in a pre-tensioned or pre-compressed state. On a layer to layer scale this allows a variance of the neutral axis from the original wind when comparing the radially inward hoop stress and associated force to the hysteresis stress of the wire that generates a radially outward force. In addition, the operational neutral axis can be further located by having the original magnet build wind account for the operational mechanical, electromagnetic, thermal, and motional dynamic forces. Given a winding angle and tension value allows determination of the amount of side to side compression between turns in a layer that can be varied to produce a desired overall final magnet winding stress.

In one example of use, this feature allows the often desired case of a multi-layer or delicate central bobbin wind. The magnet can be wound in tension which then provides a radially outward winding stress, thus reducing the entire wind radial inward stress from final mechanical wound hoop and radial stress values as well as operational stress.

This case of winding each turn in tension or compression requires an understanding of the wound material, geometry, and position both radially and axially. The operational code utilized by some LMHS auto calculates the variable turn to turn tension value to provide the desired final overall magnet winding stress. One of ordinary skill in the art will appreciate that the LMHS controls stress values in all Degrees of Freedom (DoF).

The ability of the LMHS products to accurately control the final device inherent mechanical stress at each point in the magnet allows the ability to provide far superior magnet performance and structural reliability.

Non-Contact Sensor

At least one sensor provides a feedback mechanism to support winding control and optimization through linear and non-linear control techniques. Vision sensors provide precise multi-dimensional wind on location, general wire location, and overall wind patterns and, thus, are very desirable.

Some LMHSs contemplated herein move beyond the limits of common motion sensory inputs for control value weights and gains logic by adding a new and specialized machine sensory input. In one example of use, a vision sensor assists in both control and performing optimization studies through vision resolution and identification technologies used for common sensory systems.

Reverse Direction Wind

In one embodiment of the invention, the linear material is constantly wound onto a bobbin and the bobbin wind on rotation reverses when the bobbin shape affects a curve in the wound linear material or in some way is set to reverse how it is wound onto the bobbin. LMHS feedback loops and multi-DoF motion control are employed to satisfy this winding configuration. A common use for this winding result is to establish an opposite magnetic field such as a null magnetic flux zone in the middle of two opposite winds of the same linear media in an equal and opposite configuration.

Splice Mitigation

As mentioned above, HTS tapes have a particularly large problem with lowered piece length before present production art yields what is known as a "drop out" where the SC properties fall below acceptable limits. This leads to a large number of repair splices where each splice is difficult to manufacture, creates localized areas of lower mechanical strength, and forms micro ohm resistance areas which are no longer superconducting. The mechanical strength and exceptionally low resistance value of a potted coil may seem inconsequential until considering that SC coils often operate in an extreme mechanical stress and fatigue environment from the combined high magnetic field forces and extreme thermal cycles. The detrimental effects of splicing are often very apparent when the tape/wire is running in and out of persistent mode, but particularly a concern for any SC quench propagation across splice locations when a fully energized SC coil goes from SC to regular mode. Further still, splices are commonly the quench onset location. All of this leads to an SC cable, magnet, or cable magnet with more splices that has a higher likelihood of SC quench that takes the cable or magnet out of SC mode which can be catastrophic during high energy and power operations. An example of splice mitigation is provided as an embodiment in the Magnet Station discussion.

For a motor/generator wind (see FIG. 22) embodiment example, LMHS is capable of multi phases w/phase chording via the same mechanism of splice limiting. LMHS is also capable of winding multiple coils in parallel per phase per slot, or equivalent location with mounting system, to provide parallel sets of coils across a machine with no splice per the example of wound poles shown connected by line 1191 which is used to place as an armature set without a splice and with possible chording included in the set as shown in 1185.

For the purposes of producing multiple coils such as pancake magnets in parallel whether using wire or more importantly a wide and/or thick tape media, LMHS can wind multiple pancakes as separate parallel winds and then electrically connect the winds at the inner and/or outer wound radius such as by using low resistance solder joints. The wind angle ability of LMHS can also be used to wind multiple coils such as pancake magnets as a single connected wind without a solder joint for wire or even the very difficult tape media situation. In all cases these multiple coils can be wound in the same or opposite winding directions and can be wound in parallel or in series with one another. In all cases multiple mediums can be wound into each coil at once in a parallel wind situation such as insulation wound in between each superconducting layer or multiple SCs and insulations wound in parallel directly into the magnet turns.

Cable Diagnostics

Final system cable diagnostics are useful such as faults, smart grid, and distributed grid diagnostics. In this case the cable, magnet, and/or cable magnet is designed to reflect electrical bounces to provide a location of splices and certainly of a sudden resistance fault and resistance spread. An SC cable is particularly useful for detecting a sudden R fault due to the 0 to high resistance nature of an SC in and out of the SC mode. Using an SC line to detect the resistance allows connecting both the power and diagnostic systems from cryogen station locations and incorporate associated logic for prognostic needs including fault tolerance response, Health Map, predictive operational use, and preventative maintenance. In cables, a similar technique is distributed temperature sensing.

SC cables require cryogen stations around three km lengths apart in urban areas and 15 km to 300 km apart in open areas with distances depending on multiple factors such as cryogen flow stemming from LN2 flow diameters, cable angles to gravity, etc. The need for cryogen stations also provides a smart grid power and cryogen status detect and protect capability at each cryogen station as well as the use of cryogen for distributed energy storage such as power utility needs due to high cryo liquid to gas expansion ratios.

Although the SC power cable can be used directly for such diagnostics, power noise can be an issue with reading transmitted data. Therefore, in an embodiment of using the SC power cable, the power and diagnostic data are separated by frequency bandwidths. When using a separate SC line for purely diagnostics, then this line can be used for other data applications such as smart grid data transmission needs.

Diagnostic Station

By design, the Multipurpose Modular Platform (MMP) open architecture of LMHS allows abundant access to the wind. MMP is the extrusion formed base for all LMHS machines noticed in all LMHS figures. This aspect allows a diagnosing station to be placed where the SC material leaves the spool and just prior to inclusion into the magnet, cable, or cable magnet wind. Thus, all SC material can be tested, or just preselected sections can be tested. Therefore, localized continuous or discrete, manual or automatic test stations such as cryo cooled testers can be used to determine SC values which help identify poor performance locations. In one embodiment, the SC values of critical magnetism and current densities at a set temperature below a critical temperature provide a measurement for the SC state. In a non-contact diagnostics embodiment, the SC state is measured and processing methods, such as Gauss and Weibull statistical methods are used to determine the heterogeneous critical current distributions which leads to the quality, current carrying characteristics, and AC losses of HTS tapes. A minimum drop out threshold is set and compared to the measured value. This difference provides a possible SC operational range with a factor of safety.

When the material shows poor performance such as a drop out below desired performance levels, it will be desirable to incorporate a station to manually or automatically cut that section out and create a splice. Furthermore, all splice locations are identified as key locations to maintain additional robustness for cryogen cooling. The final magnet or cable achieves a higher overall operational performance by removing all material poor performance sections. This allows a higher performance SC for long lengths.

All actual SC data for the entire length of the SC is then recorded down to mm length increments and provided to the customer along with the final manufactured magnet or cable.

Tensioner and Guide

The former or wind-on side of a compression tensioner and guide allows accurate stabilized wind-on tension control providing a tensioned means of swapping out bobbins.

The spool or raw material side of the compression tensioner and guide allows incorporation of individual SC process stations before winding onto a final former and a tensioned means of swapping out spools.

For advanced SCs the principals of LMHS for automated handing of fragile media are maintained at all times such as no large longitudinal axial or side loads yet holding the SC in place with tension for the wind on process. Because all SCs including HTS can handle a large compressive stress normal to the flat surface of the tape or equivalent wire, an SC flat surface or equivalent placed passive or actively controlled press mechanism is incorporated. Embodiments include a press mechanism that allows the SC to slip through or a set of rollers where there is a turning control mechanism on one or both rollers. During an operation where the spool tension would be completely lost such as a splicing operation, this compression tensioner compresses further to hold the SC in place by incorporating on both sides of the splice. This feature can be incorporated into the splicing process as a single station, and can be used to help guide and tension the final SC onto the former. Further, this feature can be located at each raw SC tape spool wind-out location for any desired use.

Automated Splicing

For advanced SCs the principals of LMHS handing of fragile media are maintained for automated splicing. Therefore, the splicing mechanism is only engaged when the SC diagnostic system indicates an unacceptable value, or at the end of wire or tape length. As all SCs including HTS can receive a large compressive stress in a direction normal to the flat tape surface without SC degradation, a press is used to apply a force to the SC, wherein large longitudinal axial or side loads are not applied. With the SC held in place for the splicing operation, rollers move the uncut wire or tape into position for the splice operation. The spice mechanism incorporates a holding press used as necessary on both the former or wind-on and spool or raw material side of the splice.

For continued operation whether the splice is manual or automated, the splicing mechanism may have a second raw SC material spool and tension system positioned next to the active spool, and may be configured such that both feed SC into a diagnostic and splice operational area in order to efficiently alternate SC tapes and wires. A splicing mechanism could be located at each raw SC spool-out location. In an alternative embodiment the splicing mechanism is a separate process station which then moves, perhaps automatically, to the desired splice location and performs the splice action. It is envisioned the splice station will work in conjunction with the compression tensioner and guide, or an equivalent device for holding the SC, when used in an automated machine.

In a further embodiment automated splicing allows the LMHS machine to be used for continuous length use. A primary example of this would be using LMHS for cable production beginning with individual SC and inclusive of all final elements required at the cable installation. Here, one or multiple LMHSs could be developing SC cables while processing the SC cable systems which include producing any possible twisted or woven subcables. Inline insertion or cladding into a cable cryogen container or cryostat which is then fed into the installation could also be performed. A primary desire of fabricating SC cables at the installation site is to remove splices required by connecting complete SC cables together. Thus, an infinitely long SC cable of equal size, with lengthwise continuous operational value, and inclusive of all components down to the individual SC level can be created, wherein each element that makes up the final SC cable system is spliced together before entering the SC cable system manufacturing process.

Automated Spool Exchange

The embodiment of LMHS automatically swapping out emptied raw SC spools and replace with new full spools without manual intervention is also combined with Automated Splicing mentioned previously thereby allowing a true automated machine that produces cables of any length.

Cryostat Cladding

Figure 18:
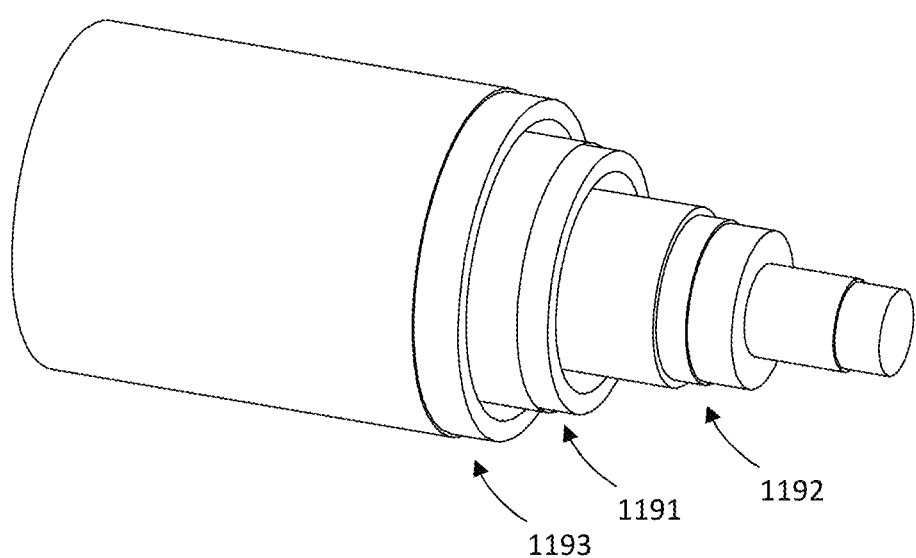
FIG. 18 shows isometric view of a cable exposed to view internal components.

In a further embodiment, a partial to fully automated inline cryostat station allows the entire LMHS to be deployed into the field for continuous length use similar as the splicing concept described above. A primary example is using LMHS for cable production at the cable installation site. In this example one or more LMHS developed SC cables can be wound to include any desired cable twisting or weaving by using a further embodiment of LMHS placed downline in the SC cable winding system, and then inserting or cladding into a cable cryogen container or cryostat inline, which is then fed into the installation. FIG. 18 represents the output where the cryostat cladding and insulation of 1191 and 1193 are placed around the superconductor core 1192.

Magnet Station

This embodiment of the invention immediately post cable fabrication winds the completed cable into a final simple to complex magnet and cable magnet for the purposes of instituting minimum bends and hence stress and strain as well as increased production time and space efficiency. As the cable former covered with freshly wound media exits the LMHS in the cable magnet embodiment, the contemplated additional embodiment commands the dynamic magnet former to move back & forth to accomplish winding the desired magnet and cable magnet configuration thus protecting the SC strand and cable from unneeded re-spooling, transit, and storage. Magnet type groupings include solenoid (mounted on a common central turning platform), planar (such as a racetrack coil or a curved plane cos-theta magnet and mounted on cylindrical tooling), and spherical (such as a baseball or yin-yang magnets) categorized per the primary mounting and rotation needs. In some embodiments, multiple magnets and cable magnets can be wound from a single wind on with no splice. Consider this by adding FIG. 1 to accept output of FIGS. 16/16A or FIGS. 17/17A.

Figure 12:
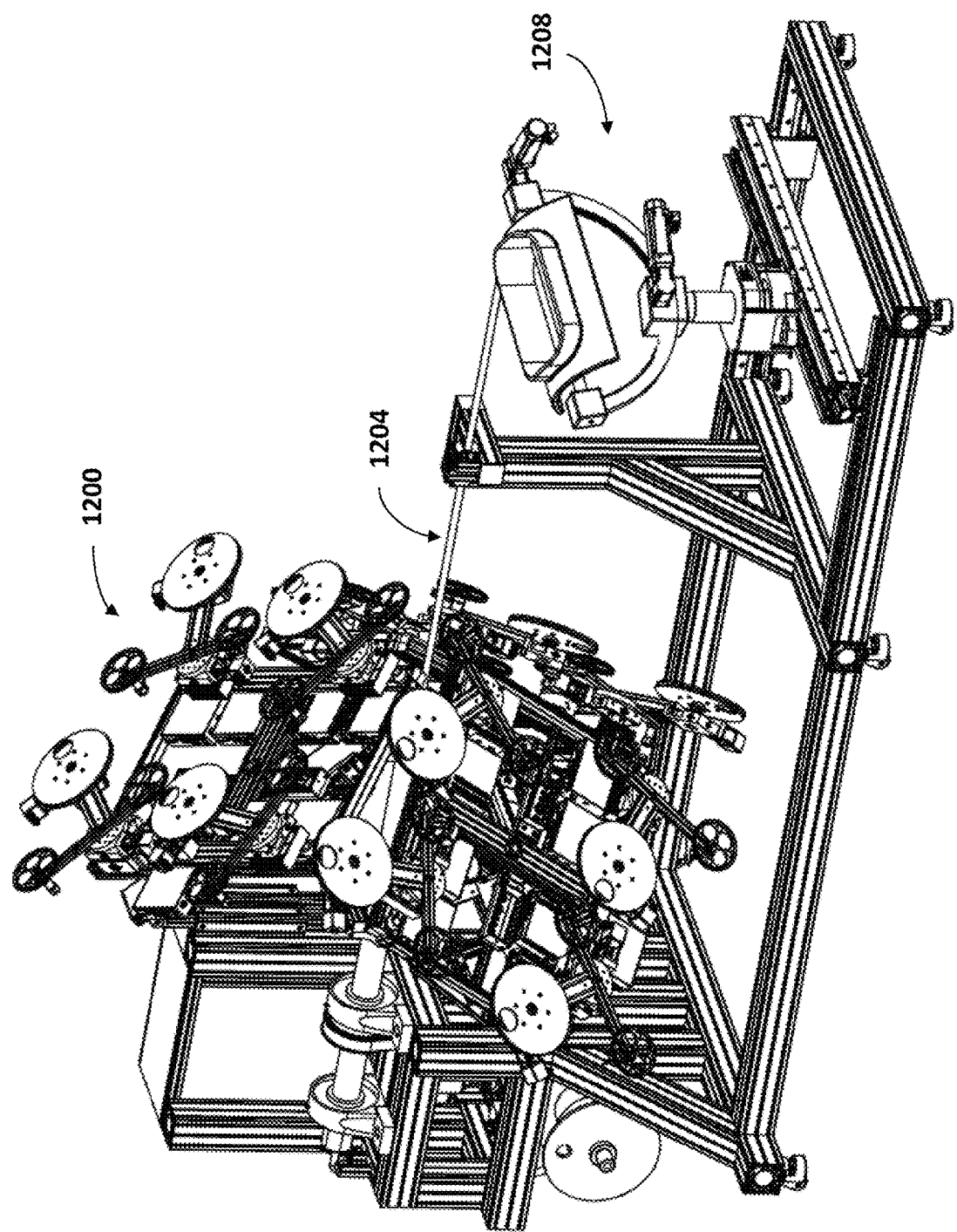
FIG. 12 shows an isometric view of a portion of an embodiment of the invention that can produce a cable magnet wind of 12 media strands.
Figure 12A:
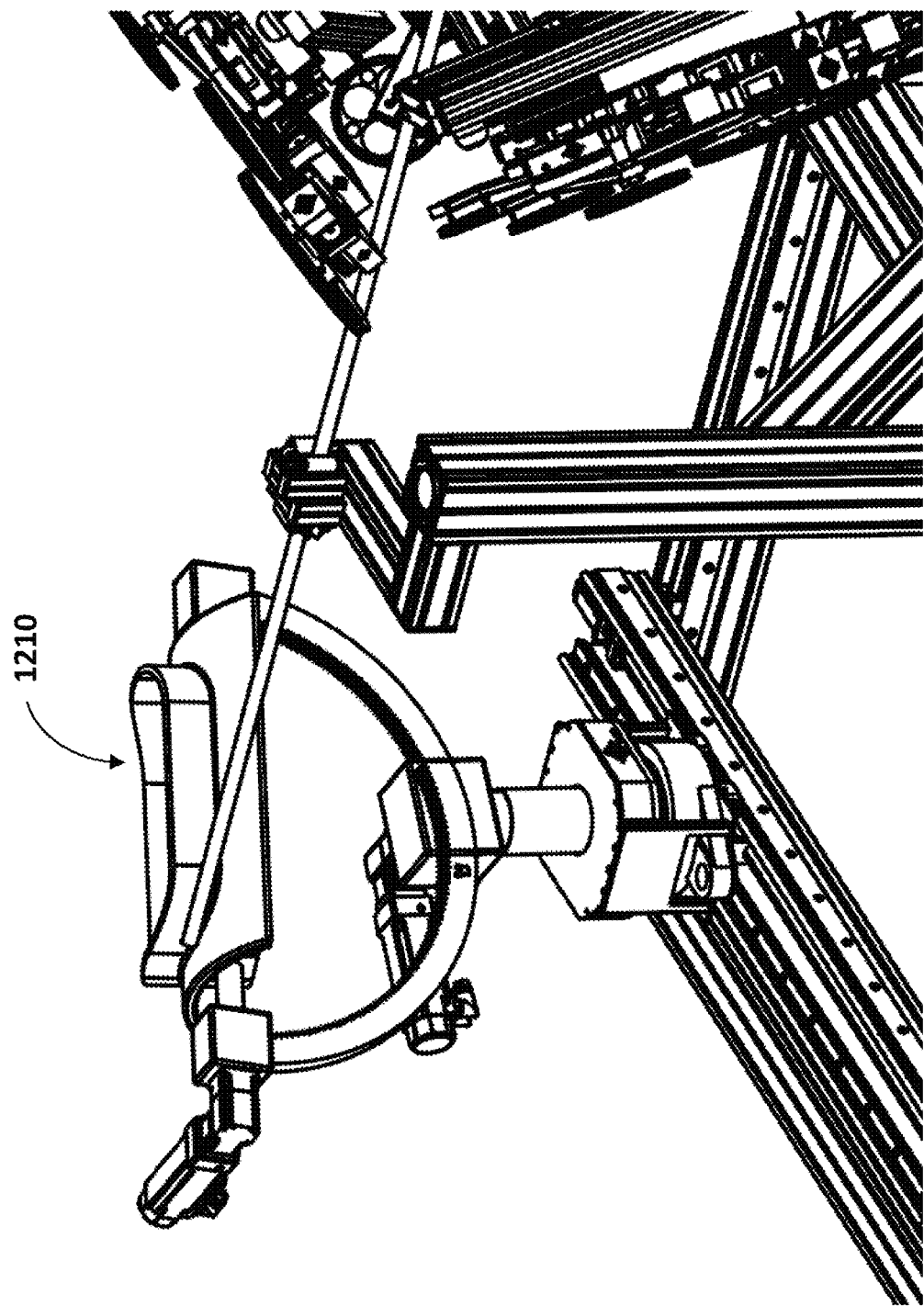
FIG. 12A is a partial detailed view of FIG. 13.

When winding up to 6 spatial DoF, and more DoF in former stacked DoF embodiments, for more complex configurations then the winding machine of FIG. 12/12A provide extreme control of magnet and cable magnet winding geometries. In this embodiment, the cable magnet winder is added to the output of FIG. 11 where FIG. 11 is configured with three transposition wheels, four HTS wind stations each, to comprise the 1200 transposition station which revolves around the 1204 cable. In this embodiment the 1204 cable then moves on to the 1208 magnet wind station which winds a 1210 cos-theta type cable magnet former mounted on cylindrical magnet wind tooling providing the output of FIG. 23.

A different embodiment places cable wind stations to face one another and hence point into winding the same magnet in order to wind magnets and cable magnets as the former is pulled back and forth between the wind stations while winding a simple helix to transposition options.

Dynamic Feed Winding

This aspect defines the ability to wind delicate linear media such as SC wire or tape onto a long element such as a long cable or torus. Braiding machines and equivalent have been in service for decades but none incorporate the level of sensing and control as the LMHS to accommodate the needs of reliably winding SC wire and tape. Resulting from the independently controlled feed rates of linear media wind output, the LMHS of one embodiment can be used for creating complex arrangements such as full transposition and braiding of linear media during cable manufacturing.

Non-SC embodiments include winding with very fine conventional wire for extremely fine magnet winding, filamentary linear materials, fiber optic wire, thin strands of carbon based fiber, smart fabrics, and extremely dense fine fiber matrices. Application embodiments include precise magnets such as high precision seismometers, weaves for fine medical devices such as heart hole plugs, and matrices for impact or extreme environment protection.

Wind Form Filler

The transposition of the HTS creates regular periodic positive and negative perturbations in the pitch in the delivery of the tape to the former. Unlike round wire, when transposing tape these perturbations may result in raised surfaces above the former due to twisting which is further exacerbated for braiding. These raised surfaces are therefore unsupported against magnetic forces during operation, resulting in possible performance degradation. Specifically, in the transposition and braiding diamond position in a four-tape winding, two of the four tapes are single thickness with respect to the core position, while the other two are stacked in double thickness. When external support is applied to the magnet, the single thickness tapes may remain unsupported, again resulting in performance degradation. This inherent winding geometry limitation can adversely affect unsupported cables and magnets, such as unpotted magnets, with voids removed prior to applying epoxy.

To mitigate issues from gaps between wound media that are inherently present in most winds and a necessary byproduct of transposition winds, individual HTS strand mechanical support in the wind pack techniques including the addition of winding electrical and/or thermal conductive or non-conductive fillers which harden, localized epoxy techniques, and winding in materials that act as braces. This filler material is incorporated below the media at the gap location or consistently below the media winding. The filler material could be in the form of a bridge such as an insulating tape or some form of conforming material that fills the gap. Alternatively, the bridge could be a varying width tape insulation that matches the transposition, braid, etc. cross over location. Still further, the filler material could be a conforming material formed naturally during the regular winding process or by way of a special process such as: 1) heating the filler; 2) fill in the gap; and 3) forming a gap filling solid after the treatment is completed.

A frequent result in many wound configurations is the presence of gaps between wound strands from turn to turn in a magnet per layer or gaps in the cable wind/braiding process down the axial length. Sometimes these gaps vary in width and height along the progression of the wind. In both magnets and cables, it can be desirable to have voids for uses from coolant flow to epoxy fill. However, gaps inside a wound product could form an unacceptable SC bend or unsupported wire or tape strand location which can cause stress issues, especially from magnetic forces during operation. Filling these gaps in a cable, magnet, or cable magnet can allow cable bending with lowered stress on the materials inside. An example is any a pair or more tapes wound in a transposition. The tape-to-tape cross over location can create a sharp axial or across tape width bend in an SC and hence lower SC performance. Gap filling can also be used for a tape that is stiff across its width and wound across a curved former. Thus, some LMHS embodiments either manually or in automated fashion fill the gap between one SC and another SC, insulation, former, etc.

Managed Winding Gaps

Conversely to achieve other goals, the use of tension feedback and independently controlled strand and core feed rates during the winding process are used in combination to establish specific patterns of gaps between wound strands and insulation, former, etc. These gaps can provide advantageous lowered stress in the cable or cable elements such as the wound media from bending or other induced movement in the wind. Additionally, gaps may be fashioned to provide for coolant or structural stability from added gap filling material.

Advanced Control

Fuzzy logic, neural logic, and simulated annealing provide highly advanced control solutions that allow winding delicate wire and tape beyond current abilities. In one example of use, Field Programmable Gate Array (FPGA) is used for fast control response and pattern recognition software processing needs. Custom active closed loop sense and heterogeneous (FPGA & CPU) control architectures working in conjunction with appropriate mechanical design techniques may be necessary to attain the delicate linear media handling requirements. LMHS advances present art by combining control processing techniques such as FPGA processing power, LMHS linear control and optimization techniques such as magnitude and derivative operator, and non-linear control and optimization techniques such as genetic algorithms.

Variable Media

Further, the eventual cable fabrication machine path intends to handle all classic to advanced SC materials and geometries as well as non-SC materials. The LMHS winding invention intends to comprise a single machine that handles fragile linear media from round to rectangular wire as well as tape and on a larger scale cable. This may be native to the machine or via tooling changes. Still further embodiments of the machine are intended to handle winding subcables of varying sizes.

Wide REBCO such as YBCO is a great candidate for the invention of LMHS as it is a fragile SC that exposes the difficult winding problems of tape turning, tape puckering, tape pitch, kink angles, etc. from attempted geometric winding cases of transpositions and braiding. Various purposes such as lowered transient electromagnetic (EM) losses in cables continue to request winds with fully transposed flat braids or further modification to full lattice braids with fully transposed elements.

Transposition

Full transposition for a wound strand means precise position of the conductors which leads to no inductive mismatch or net self-field flux enclosed between the strands and hence low residual magnetization producing transient, such as AC or pulsed power, losses. Full transposition for a subcable or cable goes further to also provide homogenous current distribution across a subcable or cable.

In this full transposition wind case the HTS layers of each subcable alternate in sequence. For example, contacting the core a four HTS tape subcable order (1,2,3,4) will alternate as (2,3,4,1) then (3,4,1,2), then (4,1,2,3) and then start over at (1,2,3,4). Transposition is achieved through other embodiment mechanisms including Spool Rotation Around Cable and Rotary Lift Stage with Tensioner.

A system of guides, such as low friction surfaces or rollers, can be used to keep the wires and/or tapes across their widths all in the same flat or curved plane with respect to one another to assist with needs such as placing flat on a former surface of any geometry such as rounded or flat. This system can be used for multiple individual wires and/or tapes being transposed to make a cable and/or multiple individual subcables being transposed. A common example of use is when making SC cables, magnets, or cable magnets to partially to fully transpose multiple HTS tapes of a common or varying widths to place onto a central cable core former.

Figure 11A:
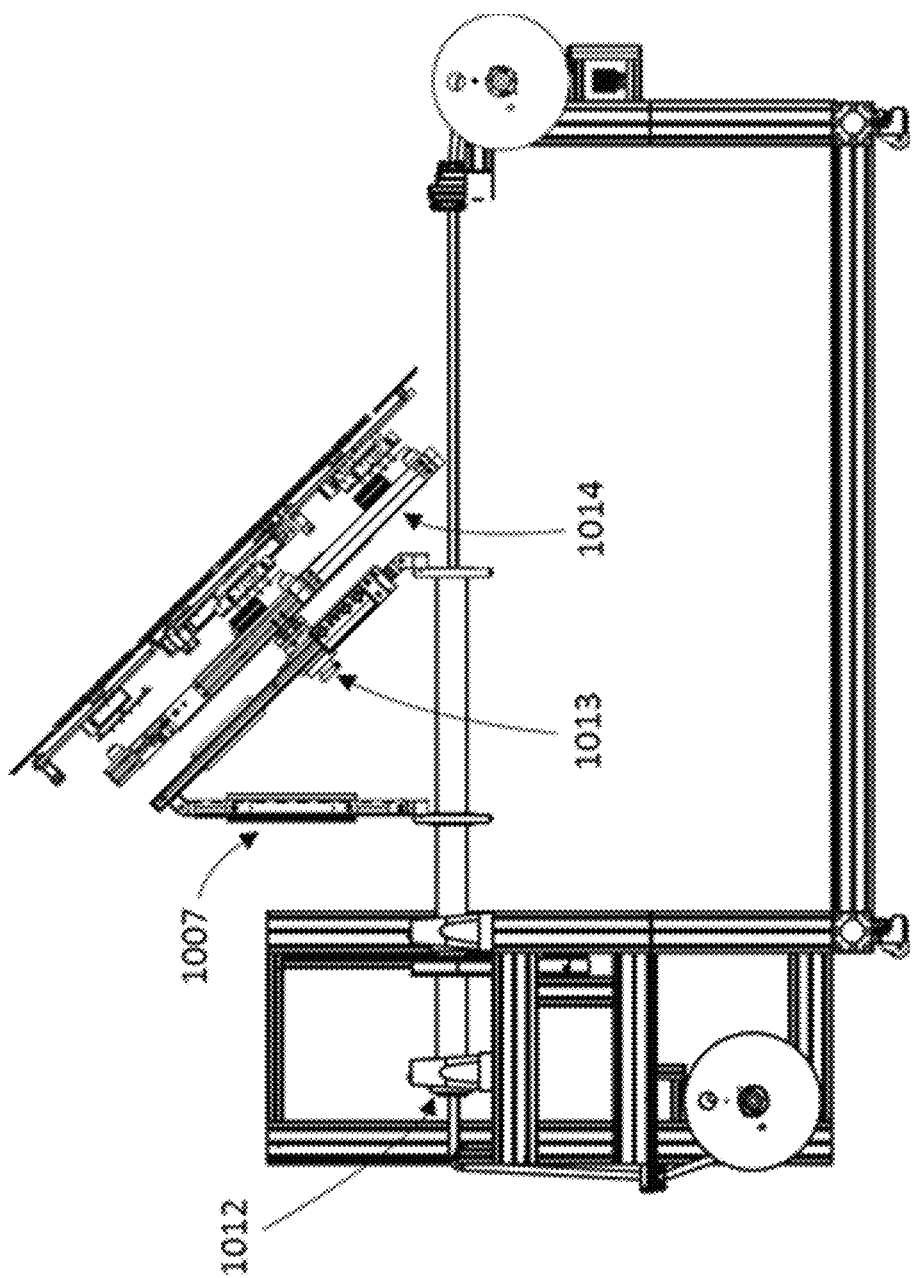
FIG. 11A shows side view thereof.
Figure 19:
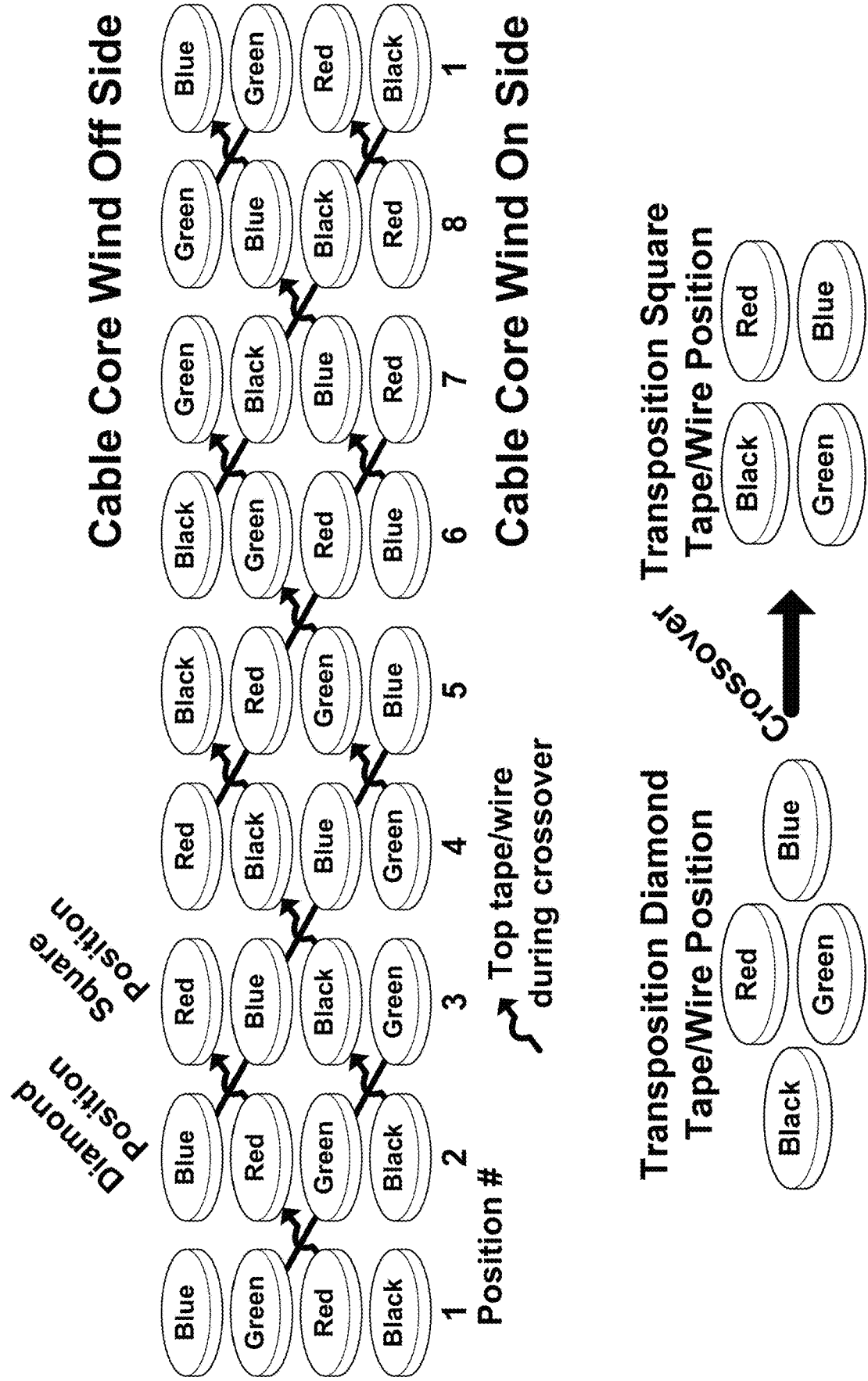
FIG. 19 shows a schematic of transposition wire positions at axial graduations.
Figure 19A:
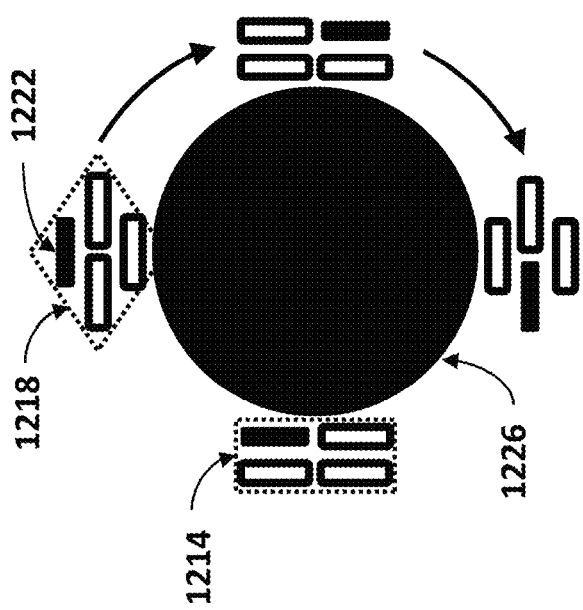
FIG. 19A is a representation of a four-tape winding example.

FIG. 11 shows an embodiment of the invention created to demonstrate a transposition cable wind. Precision motors are synchronized to turn the cable core 1010 off wind-from spool 1008 through revolving tube 1006 and onto wind-to spool 1009. Transposition wheel 1015 is attached to revolving tube 1006 causing four media strand to be wrapped onto cable core 1010. Four wind stations 1001 supply media and routing guidance to cable core 1010. Each strand departs wind-from spool 1003, around tension sensor wheel 1004, across guide wheel 1005, then onto 1010. As transposition wheel 1015 revolves around 1010, it also rotates about its center axis causing the media to alternate relative positions on cable core 1010 as described above and shown in FIGS. 19 and 19A where the HTS 1222 changes position when winding down the length of the cable core 1226 ending up with the square 1214 and diamond 1218 winding patterns. The role of wind stations 1001 is to pay out media while maintain precise tension as measured by it tension sensor wheel 1004, rotate independently of the transposition wheel 1015 upon which it is mounted such that media aligned by wheels 1004 and 1005 will always be directed toward and meet precisely tangential to cable core 1010, and lift and lower its winding plane as defined by its spool and wheels such that media emanating from wind stations further from cable core 1010 are lifted to clear media from wind stations closer to 1010. This lifting and lowering causes the transposition pattern on the cable core as the transposition wheel revolves and rotates all wind stations as the cable core translates linearly during winding operations. Note that if transposition wheel rotation is ceased, wind station lifting and lowering can be ceased and a helical wind pattern is produced by revolution only (of transposition wheel around cable core). Providing power and data to the many motion control stages and sensors also required innovation. Control panel 1011 is shown in FIG. 11. FIG. 11A shows locations 1012, 1013, and 1014 each of which contain a slip ring to accommodate electrical connectivity.

FIG. 12 and FIGS. 15 to 17 provide large embodiments and options for full transposition and braiding.

Variable Twist Pitch and Angle

Active control loops based on the axial tension value as the global control master and a hierarchy of master slave relationships provide the means of varying the twist pitch and angle while accurately maintaining the desired performance value such as constant axial tension. Prime examples of need are a tape media winding or helical winding where the wind-to spool must assume a special angle for the winding yet the angle from the wind-to spool back to the wind-from spool must be constant or a set varying value. A practical solution is achieved through the addition of rotational DoF on the spool and all wire routing mechanisms working in conjunction with current linear and rotary motion mechanisms. Such capabilities expand into automatically to semi automatically controlling the complete wind on/off angles for any system for any desired need.

This aspect of the invention is relevant regardless of the application—winding raw material from one spool to another, winding raw material from a spool to create a magnet, winding a cable, winding a cable to create a cable magnet, etc.

Figure 23:
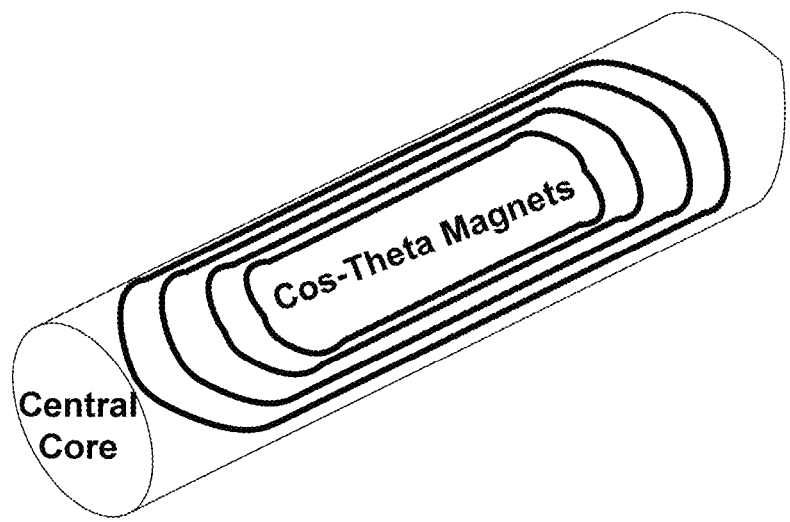
FIG. 23 shows the embodiment of a cos-theta magnet for high energy physics purposes.

For a magnet example, the schematic in FIG. 8 shows pitch angle 742 establishing a twist pitch on former 706. To create this angle, tension measurement wheel angle 722 and also MORT under wind-from spool 704 must carefully maintain the same angle such that wind 702 remains in a plane even as it translates 724. FIG. 9 is the embodiment designed to accomplish winding prescribed by FIG. 8 schematic. In another embodiment of variable twist pitch and angle output a cos-theta magnet configuration providing a high B focus for high energy physics as shown in FIG. 23 is possible as fully automated LMHS output.

To consider a cable example for variable twist pitch control, return to the transposition demonstrator embodiment in FIG. 11 and now inspect its side view in FIG. 11A. Note that the adjustable telescopic strut 1007 control the angle of the transposition wheel. This sets the major component in the wind angle and thus determines the twist pitch. Powering and automating this strut accommodates a varying twist pitch between successive wound layers or even along the length of a wound cable. Full transposition with a variable twist pitch and angle is one HTS cable type preference showing promise for long lengths and scaling to high direct, alternating, and pulsed currents through the addition of more REBCO layers. Yet as each layer diameter varies this leads to an arbitrary twist pitch and angle. Variable twist pitch and angle in the final cable leads to poor AC characteristics due to the inductive mismatch and associated high losses which is unacceptable in many high-power AC applications including fusion. The described LMHS embodiment will provide the cable designer a manual to algorithm automated twist pitch and angle control to allow a controlled to constant cable final twist pitch and angle for transient cable use.

Subcables with Transposition

FIGS. 13 and 13A show an arrangement of LMHS whereby wind stations 1001 rotate and lift as they did in the transposition cable embodiment in FIG. 11. However now the transposition wheel does not revolve about the cable core but rather only rotates in a plane and can produce a fully transposed subcable that can be wound onto spool such as 1020 or directly into a magnet as described in the Magnet Station section. View 1021 presents a close inspection of the media strands that will rotate positions as the wind progresses arranging in pancake magnet winding fashion where the linear media does not touch until it contacts the spool.

Subcables allow scaling of wind complexity. Just as a single wire or tape is wound onto a cable former, so can LMHS wind a subcable. A subcable wound spool is then placed onto LMHS and used in the same fashion as a regular linear media winding spool. Transposition can be accomplished in a subcable wind then a collection of such subcables can be wound with a transposition or braiding geometry into a cable. Thus, complex cables originate from a separate subcable winding embodiment of the LMHS invention.

These subcables can be wound onto the former core clockwise and/or counter clockwise and grouped accordingly across each LMHS winding station as per the direction of the core as the cable runs through the machine one time. This is equivalent to how each individual SC linear media in non-cable form winds directly onto the former core clockwise and/or counter clockwise and grouped accordingly across each LMHS winding station as per the direction of the core as the cable runs through the machine one time.

Subcable sets that have extended ends such as the embodiment of four tapes per set with a flat side together 1-2-1 top to bottom orientation have ends that can overlap from subcable to subcable when wound together such as when winding onto a cable.

Winding these subcable sets helps increase the packing factor of subcables when subcables are separated or possibly when transposed.

An LMHS direct cable wind of any type including full transposition & braiding winds directly onto the cable former where the linear media has no contact with other linear media until contacting the cable former at the point of wind on. This allows not only additional wind position control with no linear media side bends but removes any no opportunity for tape twist.

Subcables, Transposition, and Twist Pitch

LMHS will provide the cable designer a manual to algorithm automated twist pitch control for AC cable use as well as partial to full transposition for the entire stack which makes a subcable as well as transposition of each individual tapes per subcable as well as transposition of each subcable to subcable.

Figure 15:
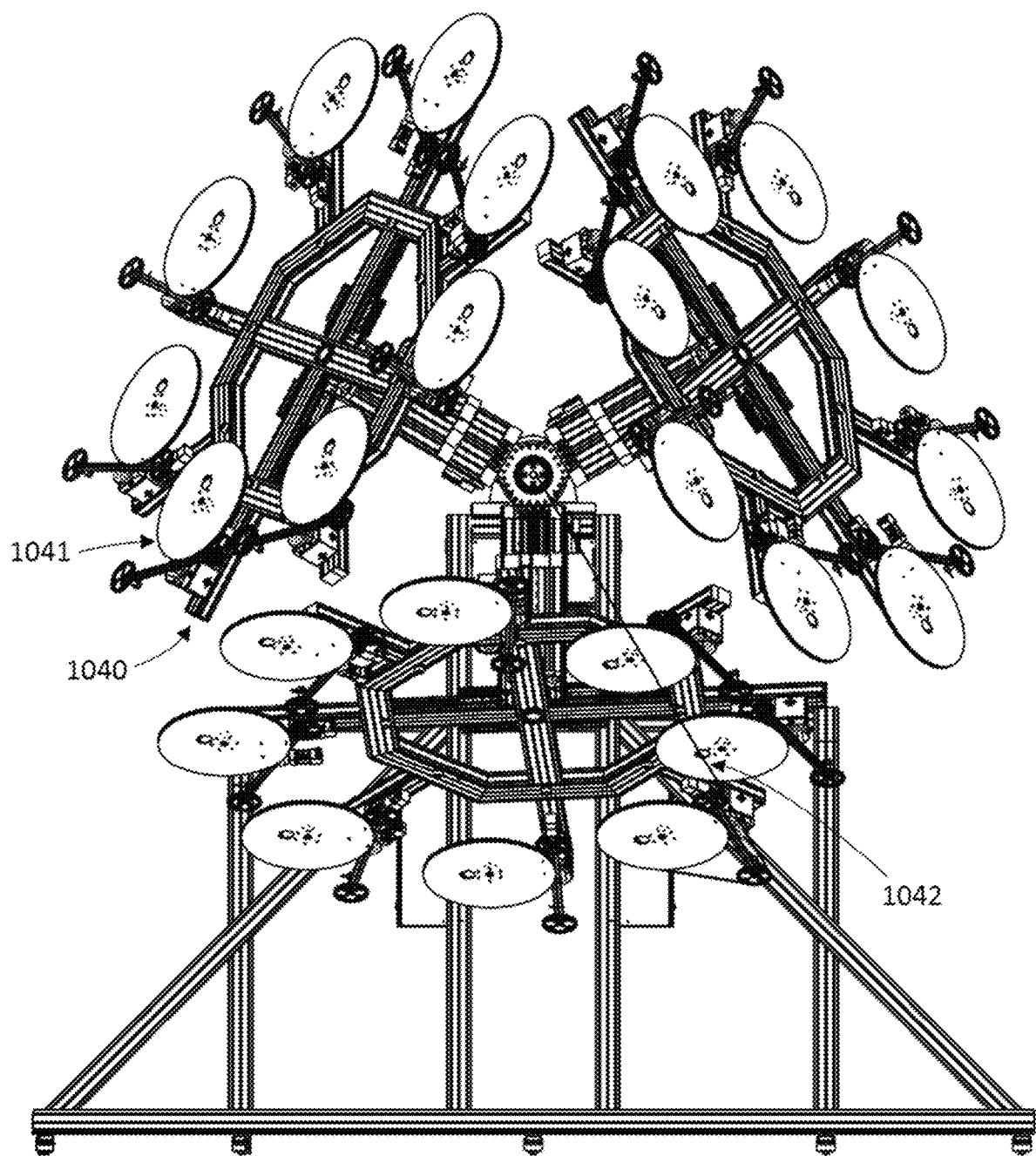
FIG. 15 shows the front view of a portion of an embodiment of the invention that can produce a full transposition wind of 24 media strands.
Figure 16A:
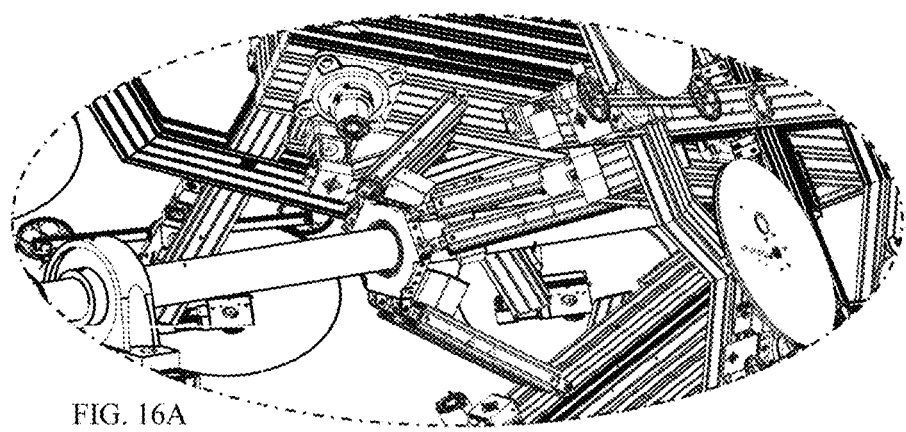
FIG. 16A is a partial detailed view of FIG. 16.
Figure 16:
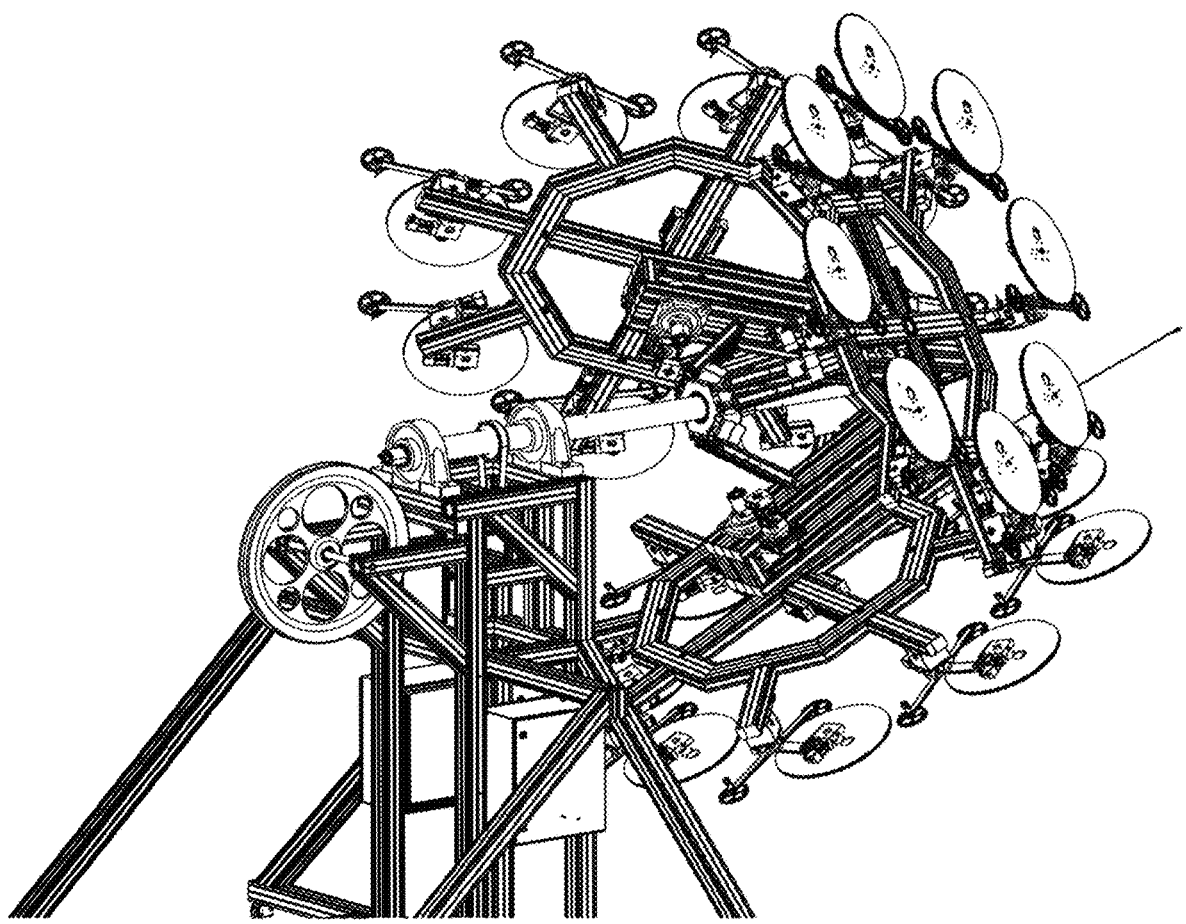
FIG. 16 shows rear isometric view and detailed section thereof.
Figure 17:
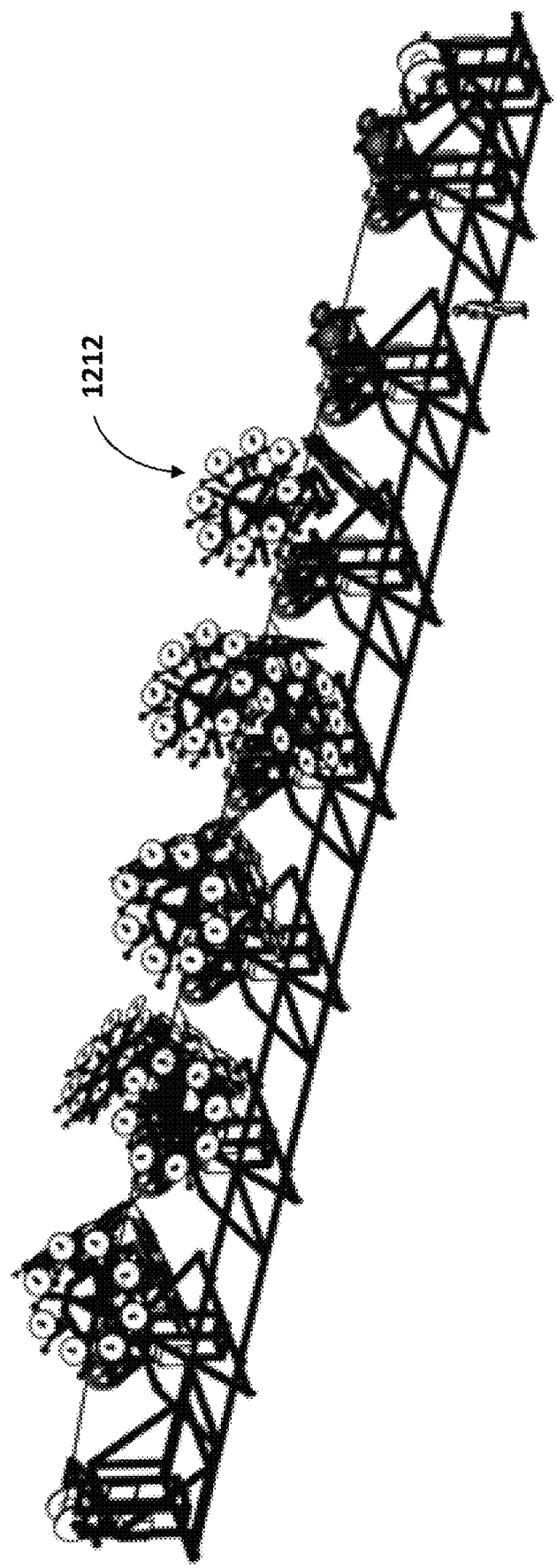
FIG. 17 shows side isometric view and front isometric view of an embodiment of the invention that shows five full transposition winding stations and two helical winding stations inline and in succession.
Figure 17A:
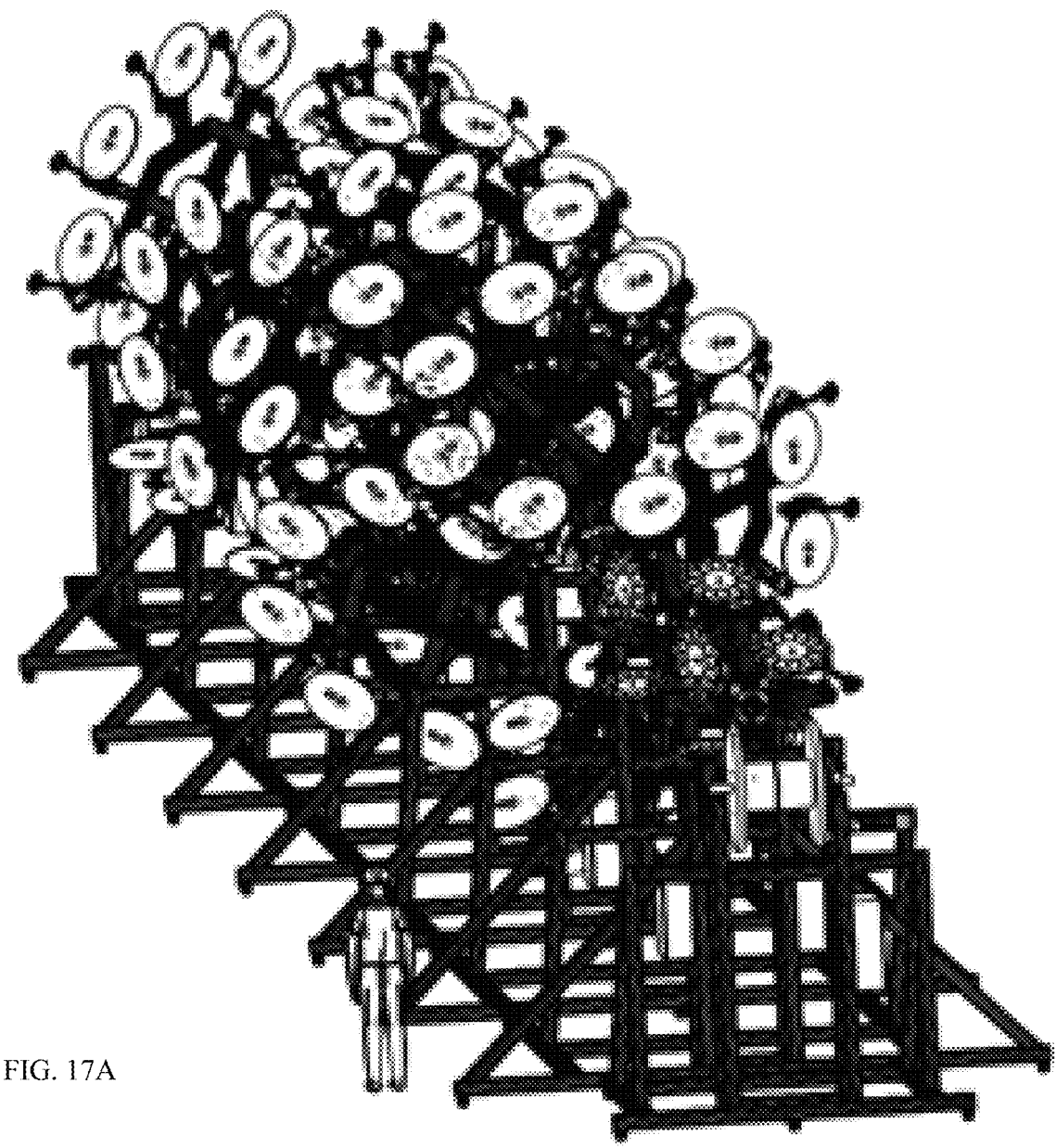
FIG. 17A is a front perspective view of FIG. 17.

Transposition on the cable level LMHS provides more choices for the cable designer. A single set of transpositions can be used to develop the HTS cable across a variable pitch angle, etc. The number of SCs making up the sub cable depends upon the former core size since LMHS can readily mount as many SC spools into a single LMHS winding station as a cable designer may require. Currently an LMHS winding station can include over 20 spools. FIG. 15 and FIGS. 16/16A present a single wind station embodiment from different views of LMHS composed of three transposition wheels 1040 collectively holding 24 media spools 1041. 1042 shows the routing path of media from one representative spool. With synchronized lifting and lowering of wind stations, media from all 24 spools refrains from entanglement and can engage in full transposition winding patterns. This wind station is then placed into a larger winding machine set of stations such as the embodiment shown from two views in FIGS. 17/17A with 1212 wind station of FIGS. 15/16.

Another embodiment of the LMHS invention develops SC subcables, much like the Roebel Assembled Coated Conductor (RACC) subcables, and places them into stacked cable setups, must like the Coated Conductor Rutherford Cable (CCRC) cable setup with RACC subcables. Each LMHS winding station provides a new subcable set which then are wrapped in an alternation fashion onto the former core.

Finally, the subcables described above can provide yet another option of fully transposing these fully transposed sub cables and then winding onto the former again with a variable twist pitch, etc. This production choice is limited with the former core again but also into how large of a station is required to fully transpose these subcables since now the amount of revolving subsystems is quite large.

Large design changes of using robotic arms to grab and release in a holding location each rotating winding station system can further expand the number of fully transposed sub cables. Furthermore, the robotic, or equivalent grab and release of each spool, can braid and transpose the linear material in any desired fashion. This embodiment is equivalent to any means of human arms grabbing and releasing a line to be braided or transposed next into the stack.

HTS cables scale to very high currents through the addition of more REBCO layers. Yet partial transposition as used in current cable fabrication techniques may preclude from use in high energy physics and fusion applications. Full transposition of HTS is required for purposes such as no net self-field flux is enclosed between the strands producing AC losses and hence one of the focal points of LMHS. No known system today fully transposes SCs whether manually and certainly not in an automated machine.

Providing transposition as well as variable twist pitch and angles, etc., which adversely affect the packing factor, enables the designer to choose the best option for their need. Helical SC winding today has another issue where each SC also thermally shields the prior layer. This requires more aggressive cooling as well as properly placed copper stabilizer for safe operation. Yet allowing a lower packing factor for transposition, pitch angles, etc. also allows room for beneficial Cu stabilizer and/or cooling.

Spool Rotation Around Cable

Cable winding is accomplished either by rotating the cable core on its central axis and holding the spool systems fixed or the embodiment of rotating the spool systems around the cable core. FIG. 11 shows the embodiment for most cases. Though more numerous to create most geometries, media spools are considerably lighter to control in motion than the cable core spool and the wound cable spool.

Braiding

Braiding is a type of transposition and in particular more complex than a full transposition. A full transposition can be accomplished by a simple clockwise or counterclockwise rotation of members around each position location. For braiding, members interchange positions among any rotation. This results in interwoven winds with media completely switching positions at set intervals along the wound output product.

A typical geometry of an SC cable with full transposition contains HTS layers of wound subcables that follows the pattern presented earlier where the subcable positions alternate in rotational sequence. For example, relative to contacting the core a four HTS tape subcable order (1,2,3,4) will alternate as (2,3,4,1) then (3,4,1,2), then (4,1,2,3) and then start over at (1,2,3,4). In a cable with the simplest level braiding, the next level of complexity beyond HTS full transposition, the HTS tape order has alternating internal sequences further lowering impedance loss. In braiding this four-wire case, subcables 1&2 and/or 3&4 swap positions at one of the four places in the presented recurring sequence. Like transposition, braiding is achieved through other embodiment mechanisms including Spool Rotation Around Cable and Rotary Lift Stage with Tensioner but with the addition of rotating and/or swapping the spools on the transposition wheel as described further in this section.

Figure 14:
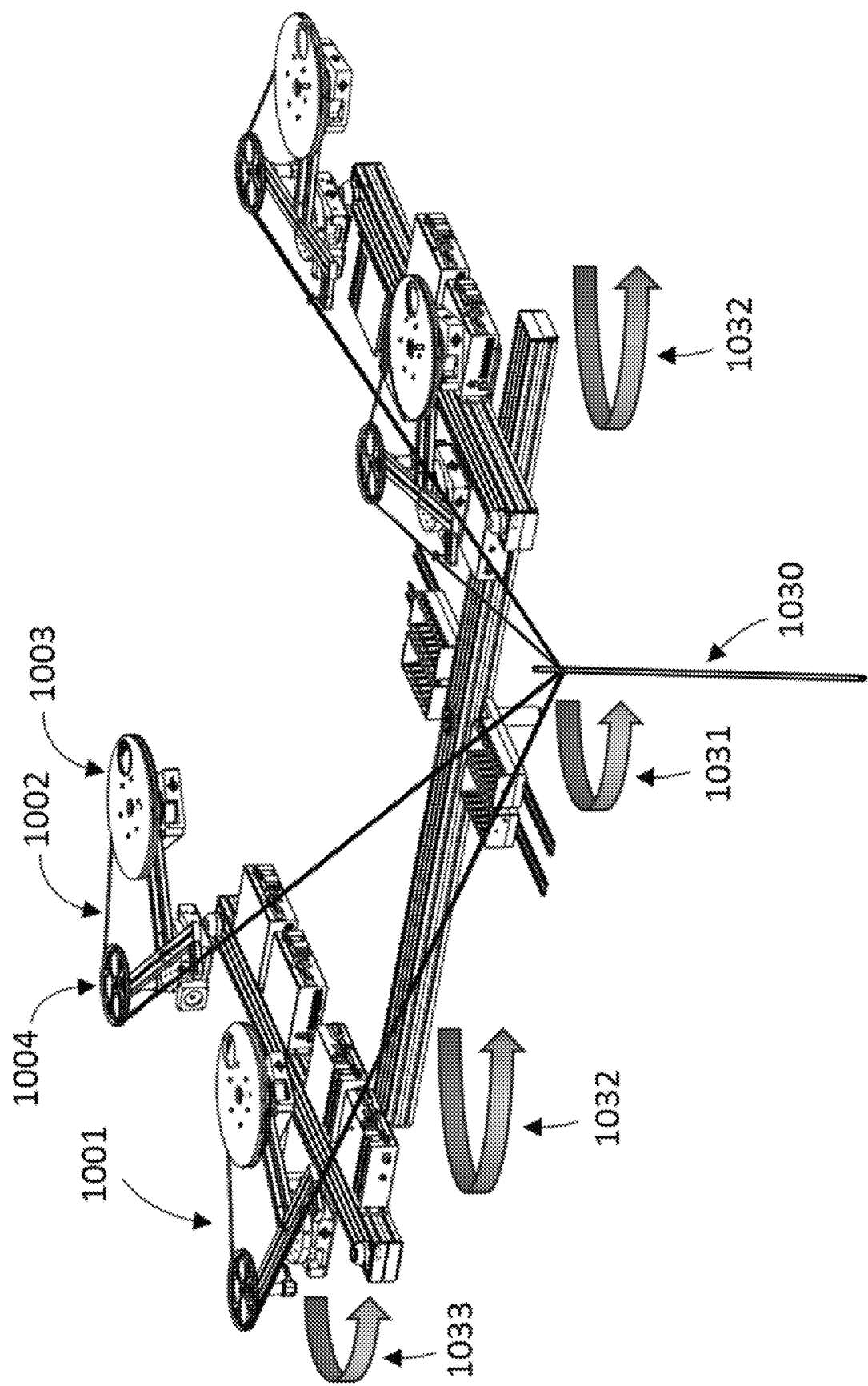
FIG. 14 shows an isometric view of a portion of an embodiment of the invention that can produce a full braid wind of four media strands.

FIG. 14 shows an embodiment that accomplishes braiding involving rotation of two pairs of two spools and is analogous to the full transposition of four spools shown in FIG. 13/13A. Each of the pairs of wind stations 1001 controlling spools 1003 can be rotated separately 1032 as the collection of both pairs rotates on the common braiding wheel 1031. Each media spool must be lifted and lowered with coordinated timing to avoid entanglements and to place the media per specification onto the former. Braiding continues as all spools rotate just as in full transposition then pairs swap positions at set position or positions in the braiding wheel rotation 1031. Observing the results on wound cable 1030, compared to the simpler full transposition, braiding lowers the packing factor but places more complexity into the routed media that can provide the advantage of decreased induced EMF resistance experienced by large current transients. LMHS uses the flat braid technique for winding on central core cables and the lattice or full braid technique for providing complete SC cables. Partial to full transposition is possible with either technique.

Rotary Lift Stage with Tensioner

A significant aspect of LMHS for cable winds with transposition is the provision of relative motion of the media in alternating directions away from some nominal wind plane. If all media spools were on the same plane, or even if they remained stationary on different planes, interference among media strands would occur upon transposition winding efforts. For success, relative motion must occur among media spools such that media spool planes pass through one another during times not aligned with those same media strands crossing one another or the other's wind station. Relative lift motions must be greater than media width and spool thickness however larger lift motions tend toward larger gaps in winding output. The use of powered lift stages provides greater control and motion profile flexibility offering greater success as measured by the synchronized media deposits onto the cable former.

In one embodiment for winding cables, this lift stage is stacked with a rotary stage to create a foundation of a wind station 1001 that can simultaneously move media orthogonal to the wind plane and keep it pointed at the cable former. Adding a tension sensor and a rotation stage for media spool payout and the resulting wind station assembly 1001 is a dense, highly functional embodiment of this invention forming the foundation of motion control that accomplishes cable transposition and braiding for delicate media. This same system can be used to make subcables and can be used to transpose or braid those subcables together.

Automated Multiple Phased Winding

Some LMHS winding machine embodiments have transposition, such as full transposition and braiding, stations with three transposition wheels each. This allows an automated single to three-phased output when running through a single transposition station where insulation stations are added in between each transposition wheel that are connected to the transposition wheel rotation around the core. This automatically creates three phase output when the phase groups remain separated. This same methodology is used for any winding station including helical, transposition, sub-cable, and braiding.

Beyond direct winding, if running a cable thru multiple transposition stations as described then allows the option of termination connecting one of each of the three transposition outputs per transposition station in a variety of manners depending on the number of output phases desired. Such an embodiment allows a wide variety of automated machine phase separation options.

Compact Advanced Superconducting Devices

Figure 20:
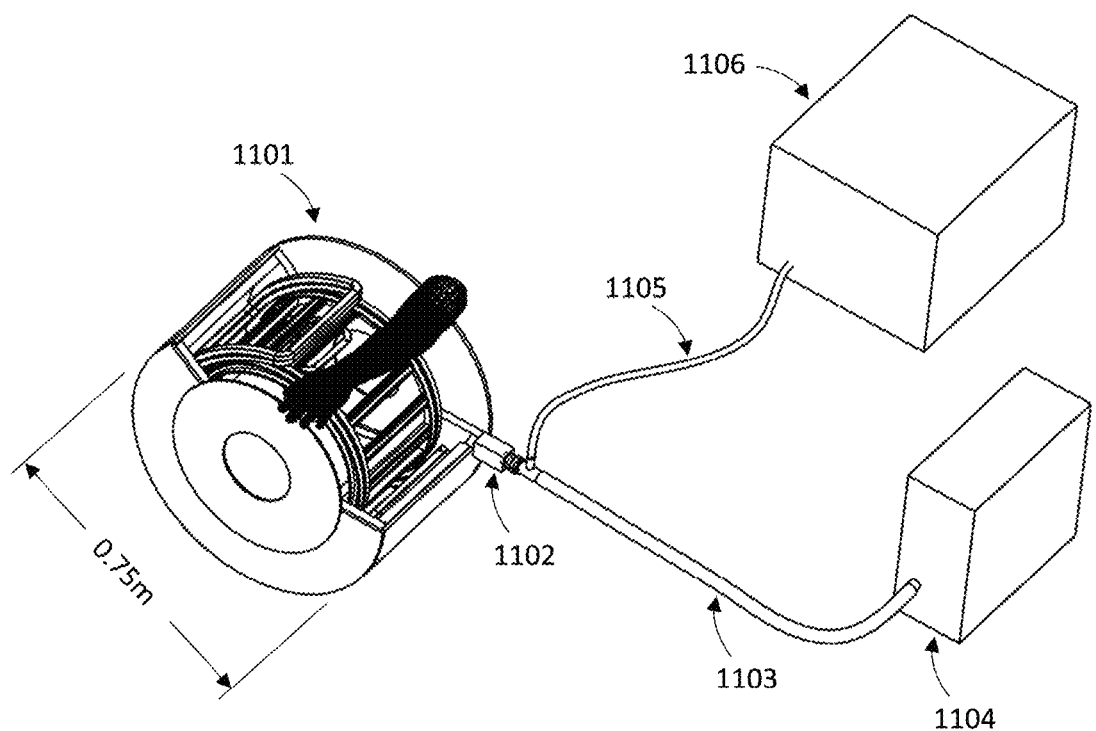
FIG. 20 shows isometric views of system and primary component of an embodiment of the invention that functions as a compact MRI.
Figure 20:
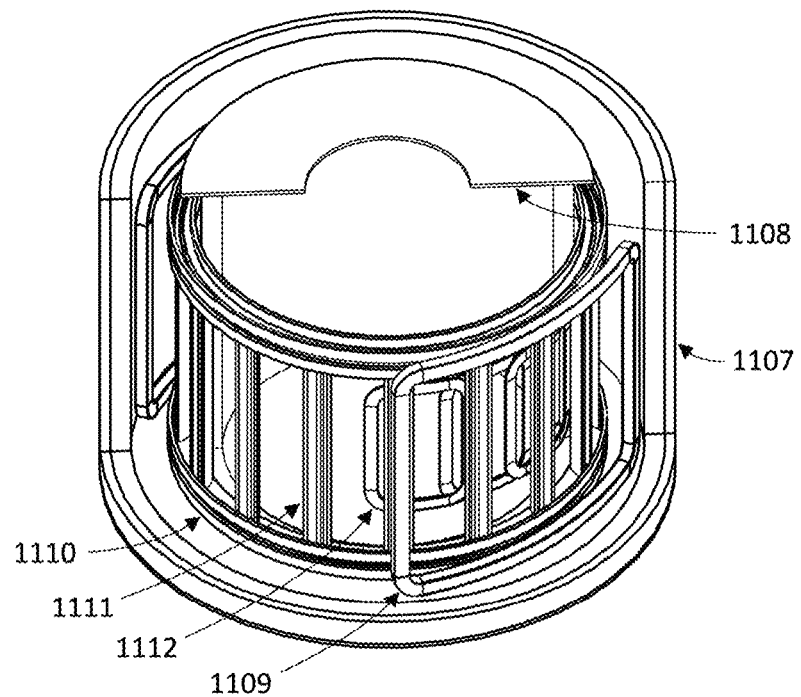
Figure 21:
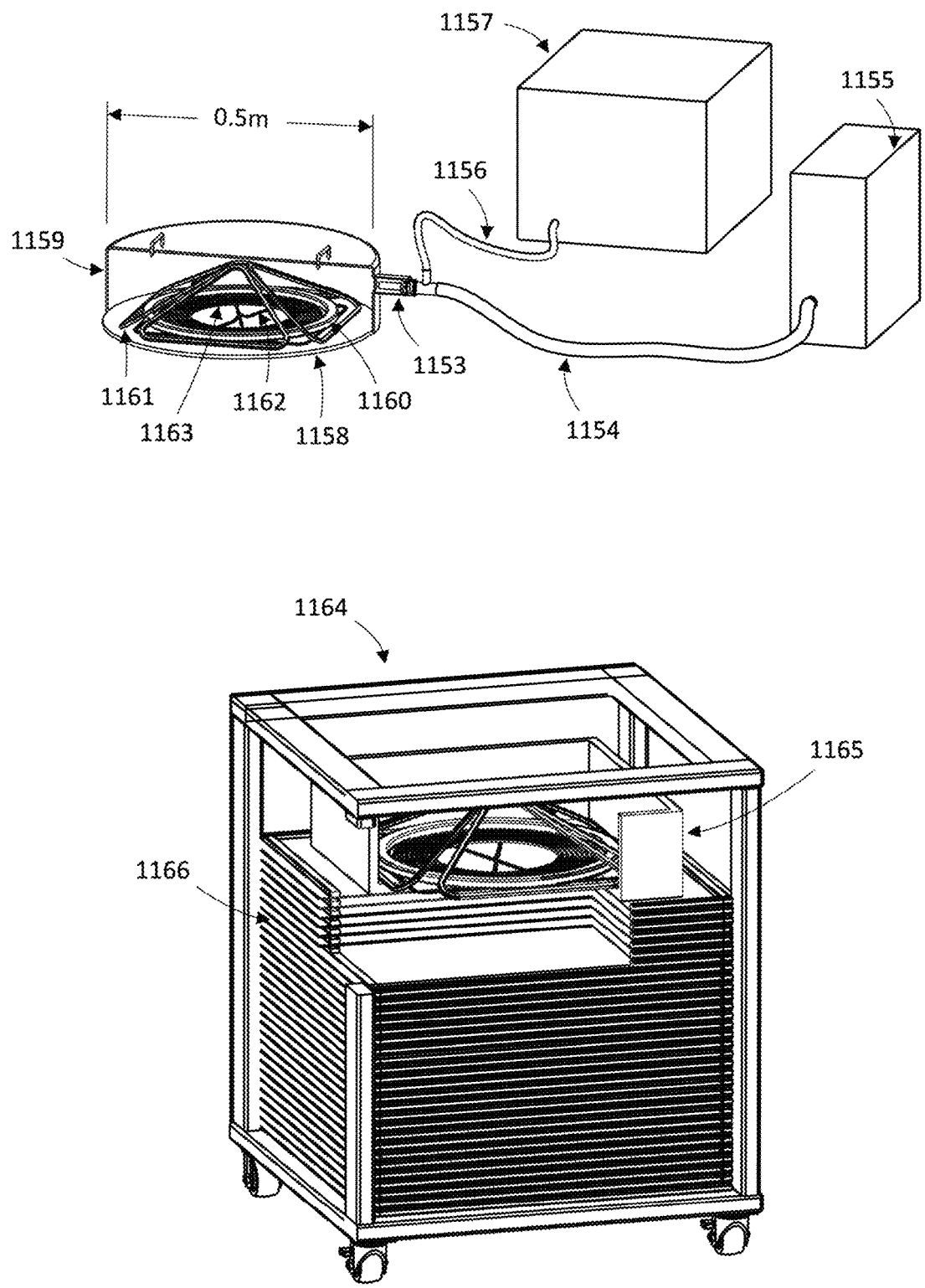
FIG. 21 shows isometric views of a system and the primary components installed in a test stand of an embodiment of the invention that functions as a compact SNMR.
Figure 22:
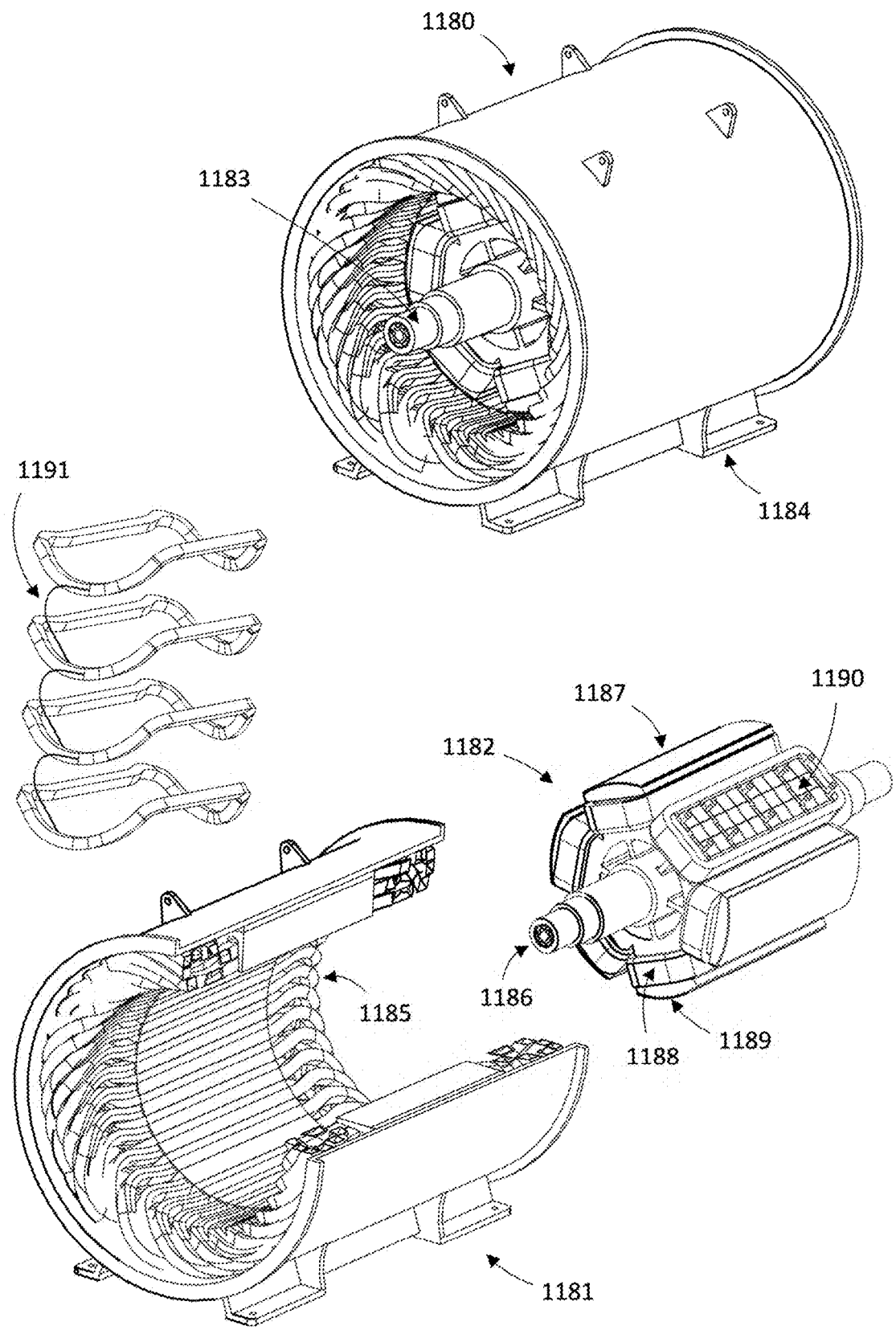
FIG. 22 shows isometric views of an assembled and exploded assembly of an embodiment of the invention that functions as a compact superconducting motor/generator.

FIG. 20 to FIG. 22 show personal, portable devices that are more compact in size and weight than prior art conductively cryogen cooled systems or classic liquid bath designs.

FIG. 20 shows an entire system personnel portable compact MRI used to examine extremities and neuroimaging where the SC magnets are 1109, 1110, and 1112. No 3 Tesla high resolution, or even close to 1 Tesla, NMR or MRI tool of any type on the market or any known in development exists that is person portable or compact.

Further the NMR and MRI embodiments shown in FIG. 20 include split NMR and MRI into connected parts such as in halves to allow a larger subject body scan yet with a compact and portable device. One embodiment uses curved and/or split halves or parts to accommodate a part of a torso for a portable diagnosis without requiring the size of today's full body MRI. These embodiments include all MRI types including the embodiments of personnel portable, manual wheeled system portable such as a cart or any castored as well as small vehicle portable which are not available today in any form beyond a large-scale MRI build into an 18 wheeled semi-truck. Compact MRI systems are the logical subscale devices for advanced full body MRI. Embodiments from the compact units including magnetic and acoustic containment are then brought into a full body MRI.

Figure 20A:
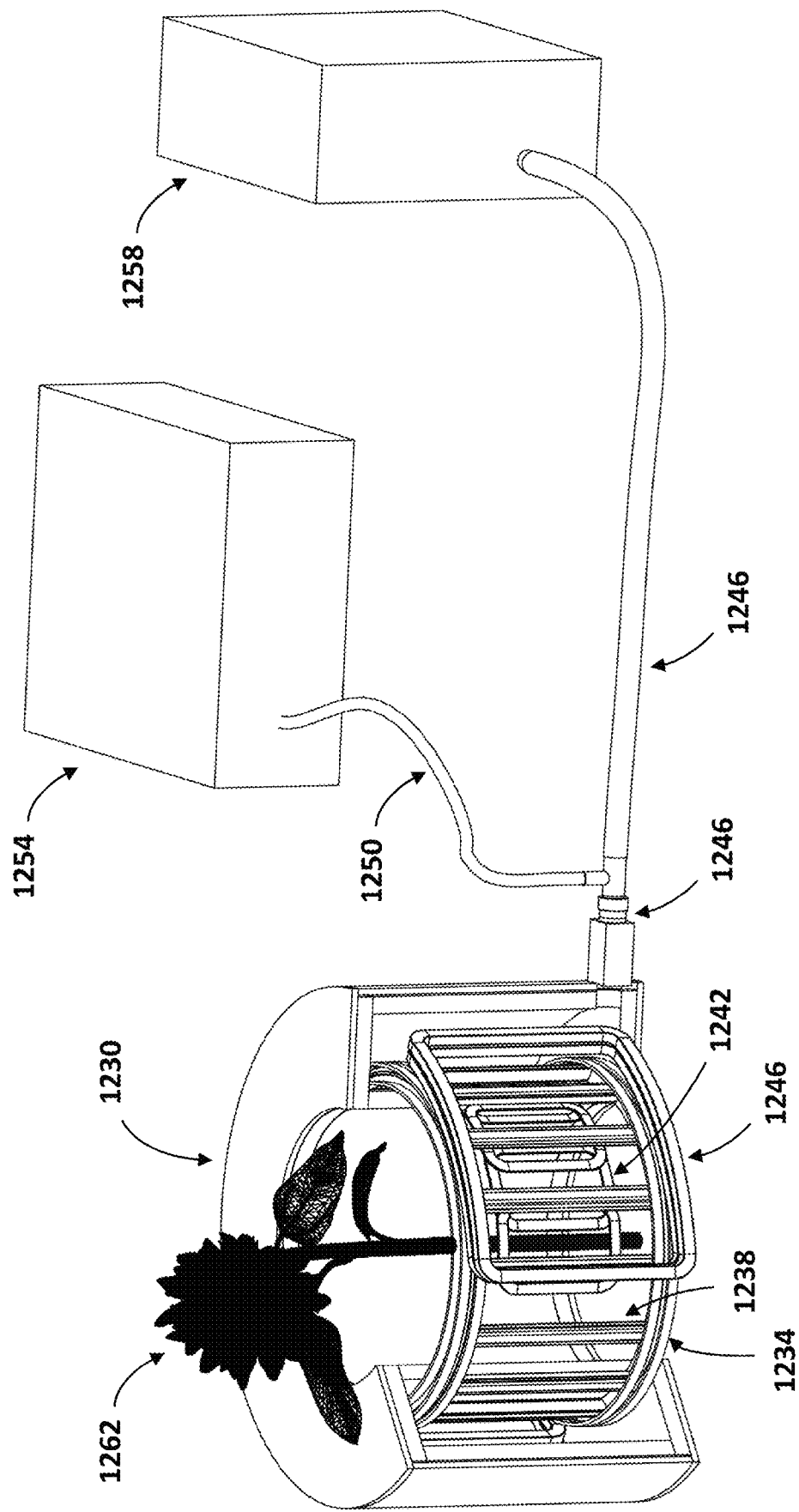
FIG. 20A shows isometric views of system and primary component of an embodiment of the invention that functions as a compact NMR

NMR embodiments include bioimaging sensor for sustainable agricultural production systems, protecting natural resources and the environment, biofuel producers, medical researchers, etc. FIG. 20A shows a personnel portable compact NMR used for biological plants facilitates understanding the physical, biological, and chemical interactions and functionality of 1262 plants including the plants that yield food as well as renewable needs such as plants used in the sustainable bioenergy, biofuel process such as cellulosic and lignocellulosic biomass to biofuels. Here the 1234, 1238, 1242, and 1246 magnets are contained in the 1230 housing with separate and connected 1254 and 1258 operating units connected by 1246 cryogen and 1250 power and data cables into 1246 cryogen bayonet connector.

A Surface NMR (SNMR) is analogous to receiving a one sided MRI scan such as an MRI scan of what is below ground. A SNMR embodiment includes compact SNMR units such as geoscience needs to look into the ground or a similar substrate. An entire system personal portable SNMR embodiment is shown in FIG. 21 where 1160 to 1163 show the SC magnets arranged in a specialized array for greater penetration depths. These 1160 to 1163 magnets are seen in the separate 1164 test setup with 1165 magnet set test articles and substrata for test depth in 1166 pull out trays.

A motor and/or generator type machine embodiment includes units such as any motor and/or generator use. A motor and/or generator embodiment which is personnel portable if compact enough is shown in FIG. 22 where certain cryostat elements are removed to show SC coils 1185. Motor and generator embodiments range across all types of rotary and linear AC, such as synchronous and induction machines, as well as DC machines for both a hybrid to complete SC armature and/or a hybrid to complete SC active and/or passive exciter field coils where the magnetic poles range from one or a combination of individual component, wound, TFM, solid pole, etc. Embodiments also include back iron or in particular a hybrid core and/or air core motor and/or generator where removal of back iron allows a lighter machine and lowered frequency losses given the SC magnetics allowing a compact machine. Motor and generator machine embodiments are across an extensive number of industries and applications which is too exhaustive to readily list. One embodiment is a wind or hydro turbine generator. Another embodiment is a hybrid or all electric air, land, sea, or space vehicle motor and generator including the embodiment of a partial to complete SC type motor or generator. The embodiment of hybrid to all electric aircraft of all types and sizes are expected to make great use of this invention by itself and in particular embodiments involving the Combined Superconducting Magnetics and Speed invention disclosure and potentially the Hybrid Superconducting Magnetics invention disclosure.

Figure 24:
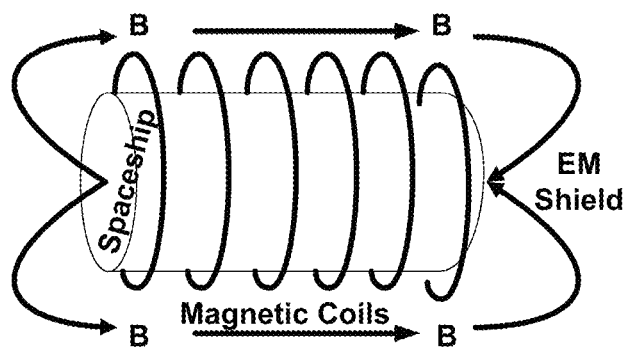
FIG. 24 shows the embodiment of an electromagnetic B shield around a spacecraft.

A further embodiment that is not a compact system in the strict sense of personnel portable but is compact regarding how all elements must be as light as possible is exemplified in a spaceship EM shield as shown in FIG. 24. In this case a set of large SC coils are arranged around a spaceship providing a B shield to protect the spaceship and occupants from harmful EM radiation and ions. Although the coils are very large they assume many of the properties of compact coils such as the need to increase specific power and power density to allow a launch into and then use in space as well as long term robustness without failure. Hence all appropriate embodiments apply to this larger system.

Component Based Superconducting Device

FIG. 20 to FIG. 22 show modular and component based SC personal, portable devices. FIG. 20 shows 1101 housing and 1104 and 1106 power supply, cryogenic, and control primary components connected by 1103 cryogen cable and 1105 power and data cables into 1102 cryogen bayonet connector. FIG. 20A shows 1230 housing and 1254 and 1258 power supply, cryogenic, and control primary components connected by 1246 cryogen cable and 1250 power and data cables into 1246 cryogen bayonet connector. FIG. 21 shows 1159 housing and 1155 and 1157 power supply, cryogenic, and control primary components connected by 1154 cryogen cable and 1156 power and data cables into 1153 cryogen bayonet connector. FIG. 22 shows 1180 housing, 1182 field coil placed on the rotor, and 1185 armature placed on the rotor primary components where the power supply and other external components as shown in FIG. 21 and FIG. 22 are removed. This case of a totally cold, cryogenic, motor or generator is possible through the 1186 non-thermal conducting hollow shaft with a rotating cryogenic bayonet with embedded slip ring based power and data cables. Allowing multiple separate components to make up the SC system provides the benefit of readily swappable elements such as the magnet set and cryostat, the cryogen system, the power supplies, and the data capture and computer elements. Common embodiments of a compact MRI, for example, include sizing for a particular vehicle insertion or down to personnel portable weight and size levels, supply chair elements, as well as field swappable and stockable systems. Such an embodiment can replace the magnet set in an existing medical MRI for extremities device that is not considered portable nor field operable and then this same component swappable magnet set can be used in a fully compact, portable MRI for extremities possessing the capabilities of being personnel portable and field operable.

Field Operable Superconducting Device

FIG. 20 to FIG. 22 show field operable SC personal, portable devices. Only a couple out of the many possible devices are detailed as embodiments here.

Medical MRI field operation includes any operation beyond the classical multiple decades use of an MRI only in a highly controlled environment. Embodiments throughout hospitals and medical centers include inpatient and outpatient room to room capability such as the Operating Room including common and hybrid real time intervention procedures include intraoperative MRI and angiography operating rooms, Emergency Room, Intensive Care Unit, patient rooms, and general mobile care. Embodiments outside of hospitals and medical centers include mobile medical providers (patients that require mobile transport such as ambulances, helicopters, etc. as well as Visiting Physicians Assoc., home care patients, sports medicine, etc.), onsite emergency to disaster relief such as US FEMA, urgent care facilities such as pharmacies to shopping plazas, rural areas (Farms, Ranches, US Indian reservations, third world countries, etc.), military (forward operating bases, mobile army surgical hospitals, medical flights, shipboard, etc.). MRI field operation embodiments can include diagnostics support away from the MRI sourced from an adjacent building or across the world. No such medical MRI field embodiments exist today in whole or in parts.

SNMR field embodiments include looking into the ground including general characterization of ground composition (including location, permeability, hydrocarbon typing, hydraulic conductivity of rocks, unsaturated and saturated zone porosity, mineralogy, pH level, and for liquids: salinity, types, and condition such as stagnant or moving), and other observations and measurements supporting construction (including subsurface characterization and safe construction site selection and planning for roads, structures, water drainage, irrigation, concrete aging, and other projects), oil & gas (including providing confidence of down well and pipeline structural integrity as well as environmental security, borehole site locating, & exploration), mining (including subsurface composition such as top surface shale, coal seams, and hydrocarbon detection as well as confidence of structural integrity and gas pockets or leak detection), environmental engineers and resource managers (including carbon sequestration of the soil & risk assessment on land reclamation, soil toxicity & remediation, hydrocarbon detection, hazardous material container leaks, etc., increased greenhouse gases and global temperature, and forests unable to process $CO_2$ gases & increased $N2O$ gases), military (including detecting subsurface threats including explosive devices as well as targets, permanent and fast construction needs, and construction for forward operating bases (FOB), airfields, roads, mechanized operations, buildings sites, etc.), disaster relief (including disaster site surface composition awareness including trapped air and toxic gas pockets and search and rescue operational support), utility (including utility line placement and pipeline structural integrity), archeology (including site determination and prior to a dig), and agrarian uses (including optimization use of land, water, fertilizer, energy and other resources, measuring moisture and nutrient content, hydrogen molecule types, nitrogen, carbon, etc., detecting physical and chemical nature of subsurface, depth detection levels required for most plant roots, soil erosion, and sediment transport, GMO crops, shallow roots that deplete topsoil, factory dairy farms, and unmanageable amounts of manure pollutes air and water).

Superconducting Device Data Control

A primary embodiment is to retain SC device output data such as NMR, MRI, or NMR scan data as shown in FIG. 20 for MRI and FIG. 21 for SNMR. This is then used in an embodiment of data retained in a database of all data across all scans for customer service use from general data retention to post processing needs such as analysis process of data tools for trends across scan types to compare to a single scan.

A primary embodiment of data retention is to establish a remote local to around the world global link between the device and user in delayed to real time.

In an MRI example the clinician is connected in real time or almost real time. This allows MRI operator remote assistance across multiple MRI emplacements at once business model. Examples include patient local urgent care commercial facilities to across world field sites including remote areas and military actions away from immediate 24/7 ready medical clinician diagnostics review and decision making support.

In one SNMR example agricultural producers and natural resource managers provide a customer base with vital soil data needs. Grid connect multiple SNMR units are connected in parallel to capture information across a larger area at one time for operator use and decision making.

Bore that Orients to Subject Position

A particular use is the MRI and general NMR embodiments benefitting from a bore that can assume a desired orientation such as an MRI orienting to a human or veterinary patient, plant, or any structure or location of interest. A current veterinary patient use without an orienting bore is to drug an animal such as a horse to lay on a table and have their leg extend horizontally into the bore. Instead in this embodiment the bore can be oriented to allow the horse to stand in place with their leg in a natural, vertical orientation. An example of a horizontal or vertical oriented MRI or general NMR bore orientation is provided in FIG. 20.

NMR and MRI Field of View

This FoV aspect benefits MRI and general NMR embodiments of any size.

Figure 25:
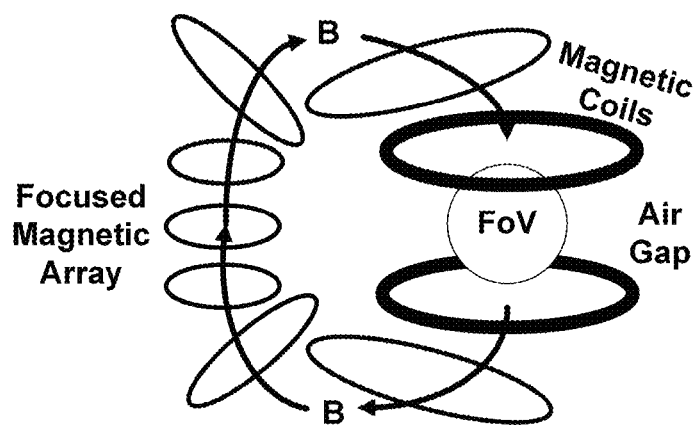
FIG. 25 shows the embodiment of a focused magnet array for focusing B around a general NMR or MRI field of view (FoV)

SC coils for this compact system require complex shapes such as null flux configurations in order to maintain magnetic confinement while still achieving a large enough high resolution FoV as shown in FIG. 20 and in FIG. 25 for a focused magnet array based FoV. This then leads to more complex cryostat, magnetic confinement, and packaging designs. LMHS allows the ability to wind coils into a 3D curved saddle with even a baseball coil end configuration to increase the source focused power transmission, echo pick up response with limited noise, and magnetic containment all required for a proper and compact device with an adequate FoV. FoV should achieve the desired tuning precision down to part of a mm to resolve 3D voxels. This coil configuration at over 1 T is expected to achieve a <0.1 ppm/hr temporal stability and a <0.5 ppm spatial uniformity in the FoV measured as volume RMS with an acceptable signal to noise ratio (SNR).

Shim coils use is lessened to potentially removed due to 3D curved main coils producing a highly homogeneous FoV, the small FoV versus coil size assisting with FoV homogeneity, and LMHS removing most main coil manufacturing errors while allowing advanced 3D coil geometries to structure a desired B.

High Penetration Depth Surface NMR & More Elements

Non-SC borehole NMR and SNMR devices are limited in penetration depth. For example, a newly designed slim borehole NMR per USGS provides a max. 20.3 centimeter (cm) radial sensitive volume and down to a 2 millimeter (mm) low resolution gap. Present SNMR sounding devices use up to 200 m diameter EM coils for detecting ground water greater than 20 m deep but deliver greatly limited resolution and sensitivity and only detect the anisotropic isolated homonuclear spin pair of hydrogen isotopes. Present SNMR horseshoe and bar magnet types with higher resolutions, including the classic NMR-Mouse, provide 1 cm limited penetration depths. Larger non-personnel portable units limit penetration depths to 7.5 cm and a possible 15 cm is under investigation by the US Dept. of Agriculture (USDA). None of these values are high enough for the appropriate magnetic flux density (B) field to reach well into the desired soil horizon. All of these units only solve for the anisotropic hydrogen isotope.

An SNMR embodiment to achieve hydrogen detection up to and beyond a 20 cm penetration depth with an Objective Goal of 50 cm and eventually the Target Goal of 2 m penetration depth which is the USDA defined soil horizon depth is shown in FIG. 21. The resolution can be a course value and down to a fraction of a mm.

An SNMR embodiment to achieve carbon detection, which also provides nitrogen content, up to and beyond an Objective Goal of 20 cm and eventually the Target Goal of a 2 m penetration depth is shown as FIG. 21 with a slight modification. The resolution can be a course value and down to a fraction of a mm.

In particular a single sided NMR such as the SNMR embodiment of any size benefits from observation with high penetration depth and measuring more constituent elements.

Focused Magnetic Array

Similar to certain Halbach Array orientations with a spatially rotating pattern of magnetization, the magnet sources are oriented to provide opposing poles to the adjacent magnet(s) to magnetically contain the B to the desired path and limit to remove stray fields away from this path. A common embodiment is a set of magnets with possible Fe addition arranged in a curved orientation to increase the maximum B across both curved end poles across a common air gap such as a motor, generator, MRI, NMR, etc. while minimizing the stray flux.

The conventional and/or SC EM can also take the form of a distributed wind of multiple coils or the turns of a single coil that help focus the B in a desired path while limiting to negating the stray flux. One embodiment is a wound curved fan such as a part, non-closed toroidal orientation. The curved coil in this case will have embodiments of continuous else varying cross sections. The final EM part of the array can be separate magnets spliced together or a single magnet wound from a continuous linear media(s).

Some embodiments will even mostly complete an entire magnetic flux path almost completely turning upon itself much like a commonly known magnetic keeper of Fe material. An example of this embodiment will be a focused magnetic array to orient an NMR and/or MRI B path to both sides of the air gap FoV as shown in FIG. 25. An SNMR embodiment will also use this array to focus the B into the desired path and limit stray flux.

Some embodiments will involve magnets and/or permeable material within close proximity but B path separated due to direct current(s) and/or transient values such as alternating current(s) and/or pulsed current(s). In these embodiments transient conductive shielding effects can be minimized to negated via techniques discussed in the, "Geometric and Operationally Tunable Coils," claim.

In one embodiment of materials all EM, particularly SC, coils are air core types else limited permeable material such as Fe inclusion to set a normal B path at key locations. Fe core magnets focus B with orthogonal vectors leaving the Fe which allows a higher local sensor resolution via this higher B but it also turns the B vector back to the source earlier than an air core which limits penetration depth beyond the permeable material or B source into another permeable material and/or opposite pole B source. In EM wound embodiments the separate windings can be wound in the same or opposite direction for separate or continuous, no splice, wound media depending on the desired B path orientation and response.

In EM wound embodiments the separate windings can be wound in the same or opposite direction for separate or continuous, no splice, wound media depending on the desired B path orientation and response.

Geometric and Operationally Tunable Coils

In one embodiment for the operational aspect of tunable antenna and RF coils, even though only a few gauss is required at 50 cm for the DC field and tip angle, a very large field is required at the source and high RF probe sensitivity to monitor the spin echoes. In order to optimize the embodiment for this range while attenuating noise, the main and RF coils will both have the ability to change the B magnitude for the penetration depth of interest. The RF coil operational frequency and bandwidth are also controllable to tune for an appropriate Larmor frequency depth. Multiple RF coils will also be employed at once to allow frequency tuning for material type of interest and penetration depth.

In one embodiment for the operational aspect of tunable gradient coils, the gradient coils are set for angled direction pulsed field gradients and response echoes are tuned and filtered for differences between magnetic susceptibility such as in the SNMR case of rock grains, pore or free surface fluids, etc. Performing conventional frequency/phase encoding imaging require pulsed field gradients that will be far from linear and orthogonal due to the geometry of the coils, and further distorted by magnetic susceptibility variations in the soil.

The requirement for orthogonal gradient coil magnets with respect to the other coil magnets severely limits depth of an SNMR. In one embodiment this is solved by groups of high power gradient coils oriented at certain angles such as 15 to 75 degrees with respect to the ground and pointed towards the center main coil axis to allow a deeper penetration depth as a combined solution with the, "Focused Magnetic Array," claim listed elsewhere. In one embodiment by focusing four evenly paired gradient coil groups (in the x & y axes) at a single measurement point at the chosen depth (in the z axis into the ground) the gradient coil magnets will work to achieve a maximum orthogonal B to the main coil B at the depth of interest. To better assist this system, the gradient coils could be set to allow a variable angle with respect to the ground and hence via physical positioning tune the orthogonal component of the gradient B to the main coil B for the depth of interest.

In an SNMR embodiment as shown in FIG. 21 the single sided main magnet already produces a gradient, which can be used to select a slice as a sensitive volume but this invention is pushing a deep penetration depth. Therefore, the addition of Gradient Coils, as similarly used in an MRI, assist with achieving a higher resolution, the necessary response at high penetration depths, and support the tomography option.

In one embodiment of operational tuning the data processing with verified simulation comparison will be used to resolve the measurement including removal of data that is identified as not being part of an orthogonal magnetics reading. Although the outcome is not the ideal orthogonal gradient B direction with respect to the main coil B, due to high power SCs this system should still allow enough of a pulse to capture good data at desired penetration depth. Geometrically the gradient coils assume an approximated equilateral triangle or equivalent geometry to focus the center magnetics and allow simulation comparison with more ease. A concern with this method as well as with the, "Focused Magnetic Array," claim is how the gradient coils induce an emf in all coils below which provides a gradient B shielding and added current density into the other coils. Due to the transient time of the gradient field, the coil relative geometries, the ability to cancel induced mutual effects via twisting or transposition techniques of the individual coil linear media in the media itself or linear media to linear media or of the entire coil at once, or by shielding all other coils from the gradient coils, this is currently not considered a concern. If this become a concern then another embodiment is to reduce the gradient B overlapping the other coils via changing the gradient coil geometry and/or moving the gradient coils further away from the main coil center axis.

To increase response resolution, one embodiment has the coils work in groups to achieve a transmit bandwidth signal and probe response around the specific Larmor frequency sensitive volume of interest. Larger area RF coils achieve both an even pulse response and higher echo sensitivity for longer penetration depths. The RF probes are dual set phased array surface coils combined to produce a circularly polarized field with an optimal response in the region directly below the coils where the magnetic flux lines from each 90-degree coil set are roughly perpendicular.

One embodiment of the RF transmit coil starts as a simple round diameter with larger diameters providing higher penetration depth. Further RF transmit coil embodiments include symmetric configurations include dual, quadrature, etc. and will be properly connected electrically providing noise cancellation and power boosting from source to echo response modes. Since symmetric RF coil configurations are highly geometrically dependent between the region of interest and coils themselves, a 2× larger than shown RF array is another embodiment consideration. A distributed to multi-turn transmission line EM resonator (TEM to MTLR) is also an embodiment due to the increased efficiency at high frequency due to lowered radiation loss. To increase TEM sensitivity in a short axial length, shunt capacitors are an embodiment with decoupled TEM coils which increase SNR and improve homogeneity.

In particular a single sided NMR such as the SNMR embodiment of any size benefits from geometric and operationally tunable coils.

Electromagnetic (EM) Containment

In the embodiment of an NMR or MRI operating concern is the static to high frequency magnetics involved. Since all equipment to even the entire room housing an MRI must be magnetically shielded, any use of an MRI requires all metal instruments accounted for and secured down to the level of counting each needle, guide wires, neuromuscular monitoring devices, etc. Cell phones, electronic tablets, pagers calculators, computers, watches, etc. are necessarily turned off to eliminate RF noise and interference around an MRI. Due to the enclosed nature of our compact system embodiments most to all of the EM radiation is not only shielded but for the first time for a medical MRI embodiment mostly contained.

Even with bore active shielding loops the largest EM loss occurs at the bore openings for an NMR or MRI or at the axis for a rotary motor or generator which is worse for transient EM. Conversely a conducting end embodiment acts as a magnetic mirror and up to the skin depth effectively doubles the electric length which significantly improves homogeneity.

As in for a Medical MRI embodiment example, at both bores an embodiment of removable passive and/or active EM shields in FIG. 20 with 1111 End Plate and 1108 End Annulus as shown provide mechanical closure mechanisms provide magnetic mirror response for SC device ends by extending the 1101 and 1107 magnetic containment for 1109, 1110, 1112, etc. coil sets. The End Plate approximately doubles the RF response and is used for far end bore closure when observing sections such as end of limbs such as hands and feet in an MRI embodiment. The End Annulus wraps loosely or tight around the subject and is for all thru limb locations and provides greater RF response and associated EM shielding at the included end. In another embodiment permeable, such as Fe, shields back up all EM end shields to contain BO. Also, in an embodiment a combined EM and Fe shield in an End Annulus shuttered closure mechanism to close down to the patient's limb in the bore access along with additional external Fe and EM shields, such as a shielded shell or blanket, can be added to a medical MRI to limit fringe fields for signal to noise ratio and the 5 gauss human health safety region.

A further embodiment includes a cryostat comprised of a conductive wall acting as an EM shield on all surfaces excluding the bore facing surfaces such as NMR and MRI embodiments. The dewar EM shield will enclose the coils excluding the bore openings and act as a Faraday box protecting external SC device areas from EM transients while also providing a minor waveguide for the RF source and echo response EM power direction needs. In one embodiment aluminum is a strong yet lighter mass material to trade between Faraday box needs while not introducing a high percent of source power loss from RF coil transient induced currents. All aluminum or equivalent conductive material on the cryogen side of the cryostat vacuum will achieve a much higher skin depth for EM shielding at LN2 temperatures than at room temperature which greatly helps contain EM transients. Separating the cryostat into EM shielded zones to further lower the source power loss will be another embodiment starting with the RF coils. In another embodiment a thin Fe shield is placed outside the main coil and possibly as the cryostat outside wall to retain static fields (BO) while staying within portability weight limits.

In certain embodiments such as an SNMR the cryostat dewar as shown in FIG. 21 as 1159 will comprise a conductive top and non-conductive base that faces the ground. The top will enclose the HTS coils all the way to the ground and act, either directly or with a conductive insert, as an above ground Faraday box both shielding external EM noise from above while providing a minor waveguide for RF source and echo responses.

Magnetic sources and surrounding material will be arranged to establish a wave guide means of directing radiation noise into a magnetic trap away from an NMR or MRI Field of View (FoV) or equivalent magnetic noise lessening region or conversely guide magnetics to a desired location of interest. Such guidance is separated into magnetic frequency regions of interest.

In particular the MRI and general NMR embodiments of any size benefit from EM containment.

Acoustic Containment

Due to the enclosed nature of a compact SC system most to all of the acoustic noise is not only shielded but mostly contained. As embodiment examples the compact MRI has closed magnetic bores and is far smaller than a full body MRI. Further the end plate and annulus bore closure mechanisms, such the embodiment shown in FIG. 20 with 1108, will be incorporated to wrap around subject further contain the acoustic noise.

Electromagnetic (EM) Material Containment Cooling

In one embodiment the cooling path will allow the option of removing the EM induced heat such as EM transient or any sourced heat into the cryogenic cooling area such as potentially liquid nitrogen based. These shields will include cooling for all heat induced, especially transient EM, into the cryogenic system. For a compact NMR or MRI embodiment will include the annulus bore closure mechanisms, such the embodiment shown in FIG. 20 with 1108, which will involve cooling spikes for all EM shielding needs. Furthermore, any cooling of an EM conductor further increases the EM shielding efficiency of that EM conductor which assists with EM shielding.

In particular the MRI and general NMR embodiments of any size benefit from EM containment cooling.

Cool Down Method and Plenum Design

At the start of the cryogen cool down process, the liquid nitrogen (LN2) plenum is used to push gaseous nitrogen to evacuate air in the warm cryostat prior to LN2. This is performed via an automated, passive external diversion system which allows a single LN2 source to remove all air prior to cool down which removes icing concerns. This method works with any cryo cooling method such as conductive or bath. This method is particularly important for compact devices embodiments and in particular when operating in remote areas where access to a full facility is not possible.

Compact NMR Coils

In an MRI embodiment shim coils remove small wound coil magnetic moment inhomogeneities. These coil manufacturing errors arise from machine errors such as locating coil troughs, wire distribution during winding, contraction of the system when cooled to cryogen temperatures, magnetic force induced wire shifting, surrounding structure magnet impurities, and mechanical stress during transport. For this claim shim coils use is lessened to potentially removed due to 3D curved main coils producing a highly homogeneous Field of View (FoV), the small FoV versus coil size assisting with FoV homogeneity, and LMHS removing most main coil manufacturing errors while allowing advanced 3D coil geometries to structure a desired B as shown in FIG. 20.

Magprop & Maglev

This embodiment allows a large B in the air gap which in turn allows a higher power system including a higher speed and torque propulsion system as well as a higher energy levitation system for the combined use of maglev and magprop. One embodiment is an SC based linear motor for vehicle launch purposes such as aeronautical and aerospace. Another embodiment is an advanced SC such as HTS based superconducting maglev and/or magprop including commercial train speeds to high speed vehicles beyond commercial train limits including Mach 1 or greater test sleds.

Hybrid Superconducting Magnetics

Embodiments of these hybrid magnetics include conventional magnetics to a hybrid motor, generator, NMR, and MRI. In the motor and generator embodiments, SC to complete SC armature, exciter field coil, and AC induction machine passive conductor. NMR including SNMR, MRI, FCL, etc. embodiments include any magnet in the device. Such embodiments of various magnetics options, in particular combining SC wound and TFM, allow not only a proper magnetic solution for a given task but in particular allow for a very compact machine.

A key embodiment for any SC device is a wound SC such as a magnetic coil wound around a single or group of TFM magnets and used to both activate and then modify the field of a TFM. As a further embodiment these combined SC type poles can be created as separate units to include into the machine for ease of assembly as well as activation of the TFM outside of the SC device or in place in part or whole in the final SC device. This embodiment also allows line replaceable unit (LRU) solution.

In a motor and/or generator embodiment any magnetic type including SC combination units are held down via epoxy and/or mechanical bolts and/or dovetails and/or banding/retaining rings which increases stray losses through a larger air gap and then a different banding option is often employed such as for high speed machines.

Historically SC bulk and wire materials are used separately across applications. The combined benefits of both are not utilized in a single unit to date.

In one embodiment a system for combining SC wire and trapped field bulk material is presented. This combination provides the ability to capture the greatest benefits of both SC formats at a common cryogenic state. Benefits include magnetic field forming to bulk material activation.

This invention relates to methods of generating high magnetic fields from SC material for the purposes of TFM activation, high B augmentation control, and high B fields in a desired output form.

1. Superconducting (SC) wire coil and SC trapped field magnet (TFM) bulk materials are used in combination to supplement one another's SC magnetic field.
   a. The TFM can be positioned at the magnetic lower or higher points of an SC coil for supplementing either a DC or AC field generated.
   b. TFMs places in the typical void between the SC coil sides and using both SC types in operation allows for a much higher B capability than using either a TFM or SC coil separately.
2. SC wire coil is used to augment the TFM magnetic field
   a. Readily change the magnetic flux density, B, on the SC wire with a varying static DC field change or even an AC to transient depending on the output B desired.
   b. Augmented field machines provide a wonderful machine control technique. Augmenting a uniquely high B is currently unheard of in practice.
3. Use SC wire coil to provide a high TFM material ACTIVATION energy.
   a. TFMs require high activation energies to acquire a high B. Such activation is extremely difficult to achieve. Difficulties arise from the ability to get a high B to the TFM due to reasons such as inductance path to magnetic stray and conductive shields when trying to activate external to the SC cryostat. By placing the SC wire inside of the same cryostat with the TFM bulk then one can make use of not only the high B capability of the SC wire coil but also the close proximity of the SC wire generated B to the TFM activated captured B.
   b. Utilizing an SC wire, unlike conventional a conventional conductor such as copper, the SC wire can handle an extreme current for a short period of time when devoid of pinning centers and typically generates orders of magnitudes less thermal energy than a pure conductor. Minimizing heat generation is extremely beneficial for any SC coil.
   c. The wire is automatically located inside of the cryostat whether around the entire SC bulk pack or next to individual TFMs. In the individual TFM case the coil may be located physically around the TFM or on top of the TFM center. In this case multiple SC coils may be connected in series and/or in parallel to achieve activation.
   d. Once the TFMs are activated, or when using an SC DC magnet without TFMs, the SC DC magnet can set for a steady state mode, such as a motor or generator exciter field or NMR or MRI field magnet, will theoretically never lose the DC steady state charge with the only SC loss occurring from any mostly negligible splice resistance.
4. Use SC wire coil to provide a high TFM material DEACTIVATION energy.

The same coil case of this invention may be used to also deactivate the TFM bulk materials. In this case the SC coil is purposely placed into a quench situation through means such as but not limited to forcing the SC coil(s) to quench through the external power supply or as sudden opening of a potential persistent switch for reasons such as inducing a localized heating zone.

An SC wire is able to be formed in many shapes from pure solenoids to saddle coils, yet this form always has magnetic field distributions such as high B points at the coil turns due the multiple coil legs interacting strongly in that region. A TFM is a small entity that provides a magnetically flux dense field up to the TFM saturation levels in the center areas of the TFM itself where the B distribution approximates an ice cream cone shape. This combination allows one to use the B distributions inherent to both material forms to best create a desired output field from a uniform B with a possible smoothed entering and exit pole region entering a machine air gap to lower the non-fundamental harmonic content. Such affects assist machine design to a dipole or quadrupole particle accelerator magnet where a very high but uniform B is crucial. As for a machine case the placement of TFMs into the typical void between the SC coil sides and using both the SC Coil and TFMs in parallel while in operation allows for a higher output B than either the independent SC Coil or TFM. This allows a much higher power dense machine than either an SC Coil or TFM alone.

Activation and deactivation of a TFM is of extreme importance yet to date not a solved problem for a large machine. Activation techniques are complex and work on controlled B and cryogenic temperatures which may even involved controlled cryogenic pressures. To use the fact that both SC wires and SC TFM bulks must exist within an SC critical state that includes cryogenics, then one is able to readily make use of placing both SCs into the same cryostat. Using this SC coil for activation has the extreme benefit of not forcing a B pulse through a conductive cryostat wall and other supporting material as well as the SC wire generates orders of magnitudes less heat than using a typical conductor for activation. To add, by placing the TFM activation and deactivation as close to the TFM as possible, then less overall energy is required for either TFM activation or deactivation.

Figure 26:
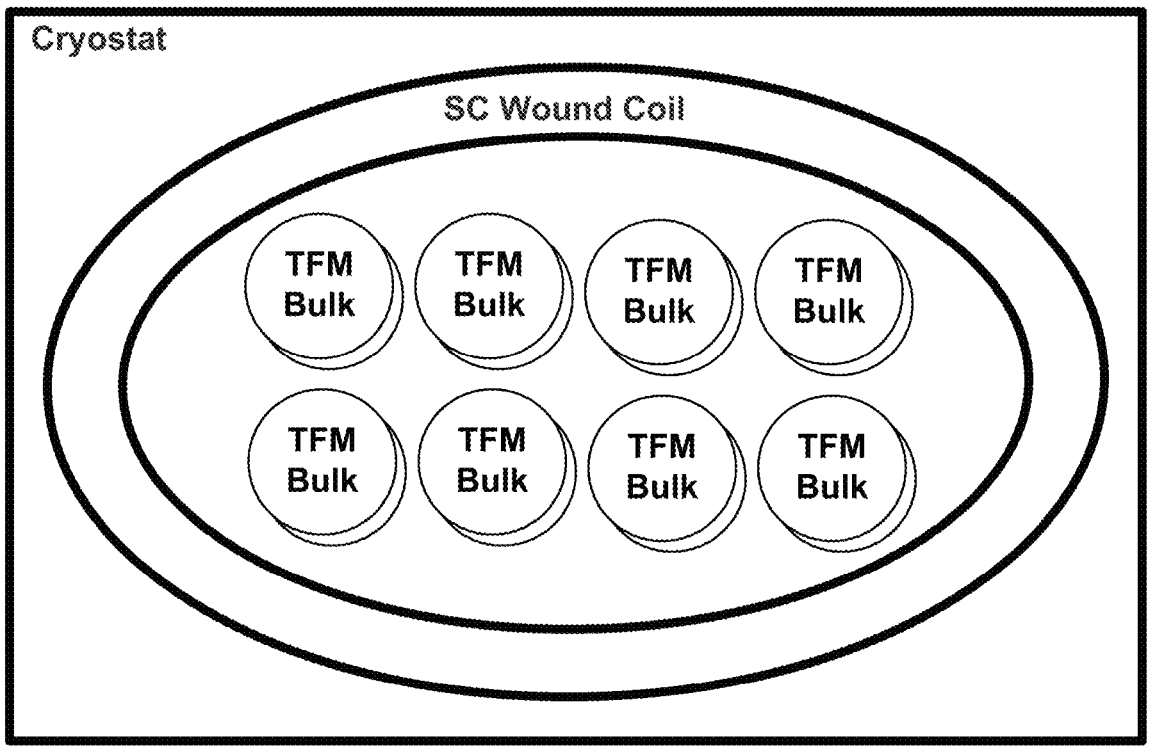
FIG. 26 shows the embodiment of an SC wound magnet around a grouping of SC bulk trapped field magnets (TFM)
Figure 27:
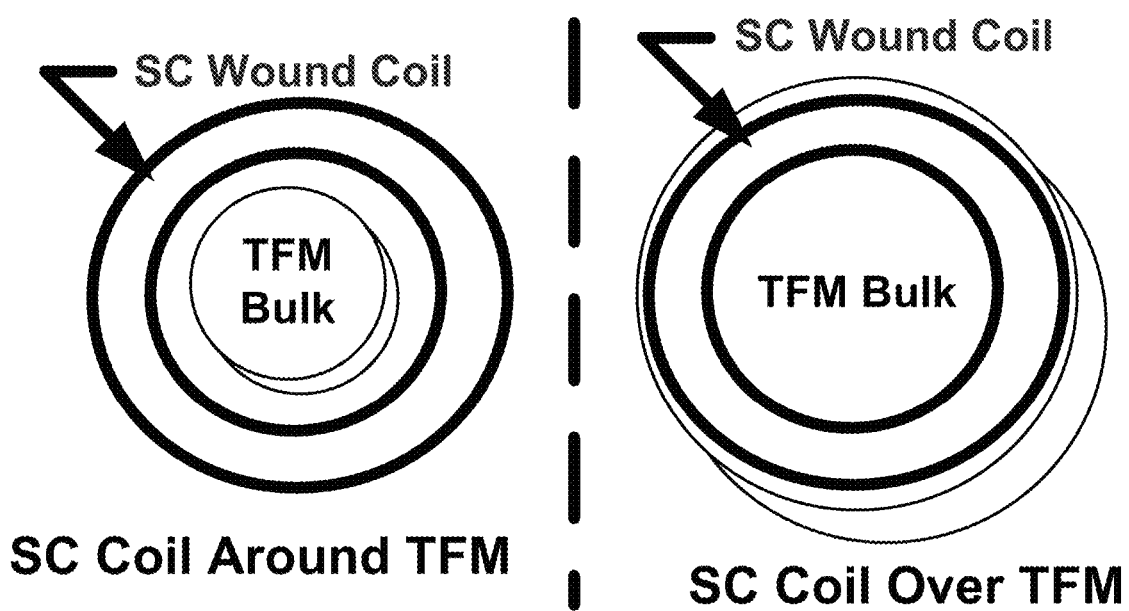
FIG. 27 shows the embodiment of an SC wound magnet around and on top of a single SC bulk trapped field magnets (TFM).

An example of a TFM bundle with a single SC Wound Coil around the stack is provided in FIG. 26 and FIG. 22 where the removable field pole 1187, for general purposes and TFM activation, has coil 1188 wrapping around the TFM stack 1190 and magnetic field focusing cover 1189. An example of a single TFM with a dedicated and single SC Wound Coil per TFM whether around the outside of the TFM or centered on the TFM physical center is provided in FIG. 27. In this second example the dedicated TFM coils are connected in either a parallel and/or series connection to an outside power supply. In either SC coil and TFM case the SC coil and TFM materials are likely in the same cryostat but not necessarily since there are advantages to also separate the SC bulk and SC wire coils for reasons such as making use of magnetic dampers. In either SC coil and TFM case a SC persistent switch may or may not be used.

This invention applies to devices of any size. This invention applies to both low and high temperature SC wire and bulk materials. This invention applies to all sorts of machines including but not limited to rotary and linear motors and generators.

Combined Superconducting Magnetics and Speed

Such embodiments not only support the magnetic solution for a given task but in particular allow for a very compact machine.

In particular motor and generator machine embodiments of any size and use benefit from increasing the speed of the magnetics in the device which benefit from the magnetic prime mover power system approach as discussed elsewhere. A particular embodiment is hybrid to all electric aircraft motors and generators and generally represented in FIG. 22 for a generator for this use and in particular a high-speed generator embodiment operating around 16,000 to 30,000 rpm or higher and motor embodiment operating around 3000 to 10,000 rpm or higher. The magnetic air gap is typically 1 Tesla (T) and above and in particular 2 T and above.

In any mechanical high mechanical speed electromagnetic machine, particularly a motor and/or generator type machine, increased rotational speed also means increased AC losses and decreased efficiency. A fully cryogen cold SC motor and/or generator machine would be ideal for general to especially aircraft use, but the HTS rectangular profile leads to a high frequency transient based losses, such as AC and pulsed power reactance, problem in HTS armature coils. Before LMHS there was no known means of lowering the magnetic effects of HTS. In the HTS case, the large tape width allows more induced currents for any magnetic flux orthogonal to the width direction which is a large problem for non-DC operation such as the armature coils of a motor and/or generator. In a conventional Cu based machine, Litz or Roebel stranding is often used to reduce the induced magnetic loss effects, but this is not possible with fragile and wide flat to thin thickness ratio profile HTS. Therefore, HTS AC losses are removed by LMHS fully transposing and/or braiding the HTS negate the AC loss effect before, as in a subcable, and/or during the magnet and cable magnet direct winding. To further reduce transient losses, the final subcable will desire as thin of an HTS width as possible, within operational performance, and the final magnet winding should orient the HTS subcable, whether in the armature or field coils, so that the magnetic flux is in-line with the thinnest part of the HTS. The thin HTS and increased packing factor also allow the higher number of amp-turns in a higher power dense magnet. Such HTS magnet arrangements apply to all types of magnets experiencing high electrical frequencies which will produce high transience reactive losses without some form of HTS twisting.

Superconducting Magnetic Prime Mover Power System Approach

The power system approach to magnetic coils, employed by the power transmission and distribution industry to achieve maximum power transfer, focuses on maximizing the J even at the expense of magnetic coil B in the SC. It is true that B is proportional to current (I) and number of turns (N) and hence dominant on the isolated generator scale but is not always dominant from a larger, system perspective as in this case. Maximizing the emf or generated voltage (V) as in FIG. 22 is achieved by maximizing the number of turns (N) per Faraday's Law and accordingly a greater primary to secondary magnetic coupling since inductance increases by the square of the N. For an SC or non-SC cryogen cooled to approximate this effect I developed has no resistance (R) dissipative energy component, which is the largest loss of a conventional machine, and negligible stray losses. Therefore, this low loss I developed increases the total power generated and is only limited by B and SC critical values which are traded between series and parallel winding sets per phase. Since a common renewable system machine speed such as a wind turbine is relatively slow, the inductance time lag will still allow a maximum air gap power transfer. Since R and associated thermal loading is not a concern in an SC, increasing N is again limited only by the B, J, and T critical SC operational values. Therefore, this motor, generator, etc. power focus provides a more efficient direct power transfer from the machine primary to secondary through an increased inductance with no conductive thermal losses. This helps this embodiment overcome the common machine issues of not operating efficiently at light loads or small power sizes. Thermally this embodiment does not have the heat removal problems of a small machine as well. Operationally, whether running in continuous or intermittent operation, the machine is based on generated V which develops instantaneously compared to the high inductive time lag of I.

In particular motor and generator machine embodiments of any size and use benefit from the magnetic prime mover power system approach.

Removal of Gearbox for Superconducting Power Train

Gearboxes are the largest failure and preventative maintenance concern in many industries including renewable wind generators. A common desired example is an HTS operating at HTS down to LTS temperatures. Embodiments for a compact machine with limited space makes great use of removing the gearbox due to the SC device such as FIG. 22 with very high torques via both higher current (I) and B.

In particular motor and generator machine embodiments of any size and use benefit from the removal of a gearbox.

Removal of Converter for Superconducting Power Train

In one utility scale embodiment many common renewable sized generators in the megawatt (MW) scale produce voltages on the lower levels of 600V to 4280V whereas the medium voltage level of around 13.8 kV is required for the 13.6 kV utility scale distribution line prior to the 138 kV to 500 kV or greater utility transmission line V step up. Generator and motor manufacturers see this greater V output and input system efficiency benefit and work on 13.8 kV conventional generators which often end up being very large diameter machines where a 2 MW, 13.8 kV generator may be 3.5 meters (m) diameter between the air gaps, over 2 m magnetic axial length, and accordingly massive. In a properly designed SC machine, simply maximizing N and hence higher V up to the critical I and B, directly allows this desired medium V & I output without the prohibitive weight, volume, and associated material cost penalties. This is due to not only the high V output magnitude but also the direct V analog output compared to solid state converter V chopping and steps.

Converters are excellent tools but incur losses. Commonly used machine converters are a combined rectifier and inverter with central stability capacitor, which often rely on Insulated-Gate Bipolar Transistor (IGBT) or Insulated Gate-Commutated Thyristor (IGCT) technologies that are limited to only 1.2 kV to 2.5 kV ranges often in a multistep H-Bridge configuration where the steps are applied in both the positive and negative voltage directions which only increases the losses. Pulse Width Modulation (PWM) technology, an excellent system, is still limited in power to the element V maximums, R losses across all converter elements, and maximum carrier frequency limitations of duty cycle which trades harmonics and hence efficiency for higher power transfer capability. The converter is not only a direct power losing element itself, but the PWM scheme also reflects power waves in the form of voltage spikes back on the motor and/or generator itself which creates transient losses in the conductors and worse still iron (Fe) hysteresis losses. Finally, any filtering and directly connected power transmission elements on either side of the converter will have R losses also due to the converter voltage spikes from the PWM operation. Therefore, removing the high voltage and power converter from a well-tuned, stable filter removes losses across the entire system as per another embodiment.

As carrier switching frequencies come to operate in the 50 KHz and greater ranges for a high-power converter then losses are minimized, but those high-power conversion days are still further into the future. A constant generator shaft rotational speed mechanism such as a fluid speed controller or equivalent removes the need for a converter, but these items lower efficiency levels and are best suited for the lower MW range geared systems which removes many advanced SC machine such as FIG. 22 benefits. The final intent of one embodiment described here is therefore to allow maximum energy capture at a high V output across intermittent shaft rotations without a converter or other efficiency lowering device. This is then provided to a large V isolation capacitor bank with a single direction power flow configuration which then directly feeds the next level of V step up into or step down out of the transmission lines.

Overall Description

Although the description of some embodiments of the present invention above is mainly directed at a superconductor wire, tape and cable, it should be recognized that the invention could be applicable to any delicate linear media. As used herein, the term "delicate linear media" will include advanced superconducting wire and tape, very fine conventional wire, filamentary linear materials, fiber optic wire, thin strands of carbon based fiber, smart fabrics, and extremely dense fine fiber matrices. Further, the present invention can be applied not only to coil and cable winding but also to any other delicate media handling process including but not limited to media insulating, bending, braiding, forming, splicing, heat or chemical treatment such as reacting, encapsulation, inspecting, and any manual or automated process that requires handling the media safely. As used herein, the terms "wire," "tape," "cable," and "media" are used interchangeably. Some embodiments of the present invention can be applied to allow an automatic winding (or other similar) process. Also, the term "spool" is used herein to refer to any object onto which the delicate liner media is wound, regardless of the object's shape. Industry language commonly refers to a wind-from spool as "spool" and wind-to spool as "former" or "bobbin," and those terms may also be used interchangeably herein. Whenever the terms "automatic," "automated," or similar terms are used herein, those terms will be understood to include manual initiation of the automatic or automated process or step.

It should also be recognized that embodiments of the present invention can be implemented via computer hardware or software, or a combination of both. The methods can be implemented in computer programs using standard programming techniques-including a computer-readable storage medium configured with a computer program, where the storage medium so configured causes a computer to operate in a specific and predefined manner according to the methods and figures described in this Specification. Each program may be implemented in a high level procedural or object-oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

The invention has broad applicability and can provide many benefits as described and shown in the examples above. The embodiments will vary greatly depending upon the specific application, and not every embodiment will provide all of the benefits and meet all of the objectives that are achievable by the invention. In the previous discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale.

While various embodiments of the present invention have been described in detail, it is apparent that modifications and alterations of those embodiments will occur to those skilled in the art. It is to be expressly understood that such modifications and alterations are within the scope and spirit of the present invention, as set forth in the following claims. Further, it is to be understood that the invention(s) described herein is not limited in its application to the details of construction and the arrangement of components set forth in the preceding description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

What is claimed is:

1. A winding machine for use with linear media, comprising:
    a linear media wind-from spool, which is used to store the linear media and from which the linear media is removed;
    a cable core, magnet, or cable magnet associated with the wind-from spool;
    at least one motor that turns the cable core, magnet, or cable magnet through a revolving tube and onto a wind-to spool; and
    a transposition wheel associated with revolving tube, the transposition wheel configured to wrap a media strand onto the cable core, magnet, or cable magnet.

2. The winding machine of claim 1, wherein the transposition wheel is configured to revolve around the cable core, magnet, or cable magnet, which causes the linear media to alternate the linear media's relative position on the cable core, magnet, or cable magnet.

3. The winding machine of claim 1, wherein during operation the linear media does not pass through any reverse bends.

4. The winding machine of claim 1, wherein the linear media handled is super conducting wire, tape, or cable.

5. The winding machine of claim 1, wherein linear media from the wind-to spool is used in a superconducting device.

6. The winding machine of claim 5, wherein the linear media is comprised of at least one of wire, tape, a trap field magnet, and a permanent magnet, wherein the shape of the magnetic field is controlled, including trap field magnet activation.

7. The winding machine of claim 5, wherein the superconducting device is at least one of a Magnetic Resonance Imaging (MM) device and a Nuclear Magnetic Resonance (NMR) device.

8. The winding machine of claim 7, wherein the NMR is a Surface Nuclear Magnetic Resonance (SNMR) that can scan to a depth from about 0.5 meters to about 2.0 meters.

9. The winding machine of claim 7, wherein the at least one MRI and NMR employs a series of magnetic loops or magnetic materials to provide increased resolution.

10. The winding machine of claim 7, wherein the at least one MRI and NMR contains excess magnetic field, wherein the magnetic field about 1 meter or less from the at least one MM and NMR is negligible.

11. The winding machine of claim 7, wherein the at least one MRI and NMR is an MRI having a bore that can assume a desired orientation.

12. The winding machine of claim 1, further comprising a winding station that receives linear media from the wind-from spool and supplies and guides linear media to the cable core, magnet, or cable magnet, wherein the linear media travels from the wind-from spool, around a sensor wheel, across a guide wheel, and onto the cable core, magnet, or cable magnet.

13. The winding machine of claim 12, wherein the winding station comprises a selectively alterable winding plane that is positioned at an angle relative to the cable core, magnet, or cable magnet, wherein changing the angle of the winding plane relative to the cable core, magnet, or cable magnet creates a transposition pattern on the cable core, magnet, or cable magnet as the transposition wheel revolves and rotates the wind station as the cable core, magnet, or cable magnet moves linearly along a direction parallel to the cable core, magnet, or cable magnet.

14. The winding machine of claim 1, further comprising a system controller receives sensed axial tension and control the at least one motor to maintain a desired axial tension in the linear media.

15. The winding machine of claim 14, wherein the system controller is configured to adjust the speed of the wind-from and wind-to spool rotations to keep the axial tension within a desired range; and
    wherein the control system employs active control loops to provide a means for varying twist pitch and angle.

16. The winding machine of claim 14, wherein the system controller is configured to selectively alter a lateral position of the wind-from spool.

17. The winding machine of claim 14, wherein the system controller incorporates an angle on/off wind that allows a continuous or changing angle from the wind-from spool.

18. The winding machine of claim 1, wherein the linear media added to the wind-on spool is braided, partially transposed, or fully transposed.

19. A method for winding a linear media from a linear media source onto a spool comprising the steps of:

(a) configuring a winding machine with:
- the linear media source, the linear media source comprising a wind-from spool, wherein the wind-from spool is used to store the linear media and from which the linear media is removed;
- a first motor for rotating the wind-from spool;
- a wind-to spool, the wind-to spool being the spool onto which at least a portion of the linear media removed from the linear media source is to be wound;
- a second motor for rotating the wind-to spool;
- a wire tensioning system, the tensioning system comprising a tensiometer and a single tension sensor wheel;
- a cable core, magnet, or cable magnet associated with the wind-from spool;
- a third motor that turns the cable core, magnet, or cable magnet through a revolving tube and onto the wind-to spool;
- a transposition wheel associated with revolving tube, the transposition wheel configured to wrap a media strand onto the cable core, magnet, or cable magnet; and
- a system controller, the system controller being configured to receive a sensed axial tension and to control the first and second motors;

(b) rotating the wind-from spool using the first motor;
(c) rotating the wind-to spool using the second motor;
(d) sensing the axial tension on the linear media during operation of the winding machine using the wire tensioning system;
(e) sending a sensed axial tension on the linear media to the system controller; and
(f) controlling the first and second motors to maintain the sensed axial tension to maintain a desired axial tension on the linear media.

20. The method of claim 19, wherein the winding machine further includes a winding station that receives linear media from the wind-from spool and supplies and guides linear media to the cable core, magnet, or cable magnet, wherein the linear media travels from the wind-from spool, around a sensor wheel, across a guide wheel, and onto the cable core, magnet, or cable magnet.

21. The method of claim 20, wherein the winding station comprises a selectively alterable winding plane that is positioned at an angle relative to the cable core, magnet, or cable magnet, wherein changing the angle of the winding plane relative to the cable core, magnet, or cable magnet creates a transposition pattern on the cable core, magnet, or cable magnet as the transposition wheel revolves and rotates the wind station as the cable core, magnet, or cable magnet moves linearly along a direction parallel to the cable core, magnet, or cable magnet.

22. The method of claim 19, wherein maintaining a desired axial tension comprises maintaining a desired axial tension within a variance of 0.1 pounds or less; and
- wherein the desired axial tension is between about 0.1 pounds and 5 pounds.

23. The method of claim 19, wherein the linear media does not pass through any reverse bends.

24. The method of claim 19, wherein the winding machine further comprises a follower wheel located between the tension sensor wheel and the wind-to spool, the follower wheel being positioned so that the linear media from the linear media source passes over the follower wheel before winding onto the wind-to spool, and wherein the method further comprises controlling a lateral position of the linear media as it winds onto the wind-to spool by moving the follower wheel; and
- wherein controlling the lateral position of the linear media as it winds onto the wind-to spool maintains a wind-off point and a wind-on point of the two spools, as well as the tension sensor wheel, in substantially the same plane.

25. The method of claim 24, wherein the winding machine further comprises:
- a sensor capable of determining the location of the wire unwinding from the wind-from spool;
- a lateral positioning motor for adjusting the lateral position of the wind-from spool; and
- wherein the method further comprises the step of controlling the lateral position of the wind-from spool so that the wind-off point and the follower wheel are maintained in approximately the same plane.

26. A winding machine for use with linear, comprising:
- a transposition wheel that supports a wind-from spool that stores linear media and from which the linear media is removed;
- a cable cable core, magnet, or cable magnet associated with the wind-from spool;
- a wind-to spool that receives the cable core, magnet, or cable magnet, wherein the cable cable core, magnet, or cable magnet moves relative a revolving tube that supports the transposition wheel; and
- wherein the transposition wheel is configured to wrap the linear media, as a media strand, onto the cable core, magnet, or cable magnet.

* * * * *